(12) United States Patent
Tam

(10) Patent No.: US 9,165,683 B2
(45) Date of Patent: Oct. 20, 2015

(54) MULTI-WORD LINE ERRATIC PROGRAMMING DETECTION

(71) Applicant: SanDisk Technologies Inc., Plano, TX (US)

(72) Inventor: Eugene Jinglun Tam, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 201 days.

(21) Appl. No.: 14/033,727

(22) Filed: Sep. 23, 2013

(65) Prior Publication Data

US 2015/0085575 A1 Mar. 26, 2015

(51) Int. Cl.
| | |
|---|---|
| *G11C 29/42* | (2006.01) |
| *G11C 29/50* | (2006.01) |
| *G11C 29/02* | (2006.01) |
| *G11C 8/08* | (2006.01) |
| *G11C 16/00* | (2006.01) |
| *G11C 29/12* | (2006.01) |

(52) U.S. Cl.
CPC .............. *G11C 29/42* (2013.01); *G11C 29/025* (2013.01); *G11C 29/50004* (2013.01); *G11C 8/08* (2013.01); *G11C 16/00* (2013.01); *G11C 2029/1202* (2013.01)

(58) Field of Classification Search
CPC ...... G11C 29/025; G11C 29/42; G11C 29/50; G11C 29/50004; G11C 2029/1202; G11C 16/00; G11C 8/08
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,335,198 A | 8/1994 | Van Buskirk et al. | |
| 5,570,315 A | 10/1996 | Tanaka et al. | |
| 5,602,789 A | 2/1997 | Endoh et al. | |
| 5,661,053 A | 8/1997 | Yuan | |
| 5,673,222 A | 9/1997 | Fukumoto et al. | |
| 5,768,192 A | 6/1998 | Eitan | |

(Continued)

FOREIGN PATENT DOCUMENTS

| | | |
|---|---|---|
| CN | 101377960 A | 3/2009 |
| EP | 2 261 806 A1 | 12/2010 |
| WO | WO 2007/016167 | 2/2007 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Harry W Byrne
*Assistant Examiner* — Lance Reidlinger
(74) *Attorney, Agent, or Firm* — Davis Wright Tremaine LLP

(57) ABSTRACT

Techniques are presented to detect word line failures (such as word line to word line shorts, control gate to substrate shorts, broken word lines, and so on) in non-volatile memory arrays. A first simultaneous read of multiple word lines is performed, followed by a second simultaneous read of the same word lines, where the read conditions of the two reads are shifted by a margin. For example, one of the read could use a standard read voltage on the word lines, while the other read could shift these levels slightly higher. The results of the two reads can then be compared on a bit line by bit line basis, XOR-ing the results to determine is the set of word lines may include any defective members.

19 Claims, 45 Drawing Sheets

(56) References Cited

U.S. PATENT DOCUMENTS

| | | | |
|---|---|---|---|
| 5,822,256 | A | 10/1998 | Bauer et al. |
| 5,903,495 | A | 5/1999 | Takeuchi et al. |
| 6,011,725 | A | 1/2000 | Eitan |
| 6,046,935 | A | 4/2000 | Takeuchi et al. |
| 6,185,709 | B1 | 2/2001 | Dreibelbis et al. |
| 6,219,286 | B1 | 4/2001 | Fuchigami et al. |
| 6,222,762 | B1 | 4/2001 | Guterman et al. |
| 6,285,597 | B2 | 9/2001 | Kawahara et al. |
| 6,370,075 | B1 | 4/2002 | Haeberli et al. |
| 6,556,465 | B2 | 4/2003 | Haeberli et al. |
| 6,560,143 | B2 | 5/2003 | Conley et al. |
| 6,760,262 | B2 | 7/2004 | Haeberli et al. |
| 6,922,096 | B2 | 7/2005 | Cernea |
| 7,012,835 | B2 | 3/2006 | Gonzalez et al. |
| 7,030,683 | B2 | 4/2006 | Pan et al. |
| 7,135,910 | B2 | 11/2006 | Cernea |
| 7,158,421 | B2 | 1/2007 | Li et al. |
| 7,206,230 | B2 | 4/2007 | Li et al. |
| 7,243,275 | B2 | 7/2007 | Gongwer et al. |
| 7,304,893 | B1 | 12/2007 | Hemink et al. |
| 7,345,928 | B2 | 3/2008 | Li |
| 7,368,979 | B2 | 5/2008 | Govindu et al. |
| 7,440,319 | B2 | 10/2008 | Li et al. |
| 7,554,311 | B2 | 6/2009 | Pan |
| 7,616,484 | B2 | 11/2009 | Auclair et al. |
| 7,616,499 | B2 | 11/2009 | Wan et al. |
| 7,683,700 | B2 | 3/2010 | Huynh et al. |
| 7,716,538 | B2 | 5/2010 | Gonzalez et al. |
| 7,795,952 | B2 | 9/2010 | Lui et al. |
| 7,864,588 | B2 | 1/2011 | Betser et al. |
| 7,969,235 | B2 | 6/2011 | Pan |
| 7,973,592 | B2 | 7/2011 | Pan |
| 8,027,195 | B2 | 9/2011 | Li et al. |
| 8,040,744 | B2 | 10/2011 | Gorobets et al. |
| 8,054,680 | B2 | 11/2011 | Matsuzaki et al. |
| 8,102,705 | B2 | 1/2012 | Liu et al. |
| 8,726,104 | B2 | 5/2014 | Sharon |
| 8,750,042 | B2 | 6/2014 | Sharon et al. |
| 2002/0007386 | A1 | 1/2002 | Martin et al. |
| 2002/0024861 | A1 | 2/2002 | Chevallier et al. |
| 2003/0117851 | A1 | 6/2003 | Lee et al. |
| 2003/0147278 | A1 | 8/2003 | Tanaka et al. |
| 2003/0217323 | A1 | 11/2003 | Guterman et al. |
| 2004/0022092 | A1 | 2/2004 | Dvir et al. |
| 2005/0024939 | A1 | 2/2005 | Chen et al. |
| 2005/0219896 | A1 | 10/2005 | Chen et al. |
| 2006/0090112 | A1 | 4/2006 | Cochran et al. |
| 2006/0221714 | A1 | 10/2006 | Li et al. |
| 2006/0227602 | A1 | 10/2006 | Honma et al. |
| 2006/0239111 | A1 | 10/2006 | Shingo |
| 2007/0030732 | A1 | 2/2007 | Micheloni et al. |
| 2007/0171719 | A1 | 7/2007 | Hemink et al. |
| 2007/0230261 | A1 | 10/2007 | Haufe et al. |
| 2007/0280000 | A1 | 12/2007 | Fujiu et al. |
| 2007/0296391 | A1 | 12/2007 | Bertin et al. |
| 2008/0062765 | A1 | 3/2008 | Tu et al. |
| 2008/0307342 | A1 | 12/2008 | Furches et al. |
| 2009/0058506 | A1 | 3/2009 | Nandi et al. |
| 2009/0058507 | A1 | 3/2009 | Nandi et al. |
| 2009/0063918 | A1 | 3/2009 | Chen et al. |
| 2009/0100290 | A1 | 4/2009 | Nakanishi et al. |
| 2009/0153230 | A1 | 6/2009 | Pan et al. |
| 2009/0153232 | A1 | 6/2009 | Fort et al. |
| 2009/0225607 | A1 | 9/2009 | Chen et al. |
| 2009/0295434 | A1 | 12/2009 | Umeda et al. |
| 2009/0315616 | A1 | 12/2009 | Nguyen et al. |
| 2009/0316483 | A1 | 12/2009 | Kim et al. |
| 2010/0054019 | A1 | 3/2010 | Toda |
| 2010/0070209 | A1 | 3/2010 | Sai |
| 2010/0082881 | A1 | 4/2010 | Klein |
| 2010/0091568 | A1 | 4/2010 | Li et al. |
| 2010/0091573 | A1 | 4/2010 | Li et al. |
| 2010/0309719 | A1 | 12/2010 | Li et al. |
| 2011/0066793 | A1 | 3/2011 | Burd |
| 2011/0096601 | A1 | 4/2011 | Gavens et al. |
| 2011/0145633 | A1 | 6/2011 | Dickens et al. |
| 2011/0148509 | A1 | 6/2011 | Pan |
| 2011/0182121 | A1 | 7/2011 | Dutta et al. |
| 2011/0286279 | A1 | 11/2011 | Lei et al. |
| 2011/0286280 | A1 | 11/2011 | Kellam et al. |
| 2012/0008384 | A1 | 1/2012 | Li et al. |
| 2012/0008405 | A1 | 1/2012 | Shah et al. |
| 2012/0008410 | A1 | 1/2012 | Huynh et al. |
| 2012/0220088 | A1 | 8/2012 | Alsmeier |
| 2012/0281479 | A1 | 11/2012 | Kochar et al. |
| 2012/0311407 | A1 | 12/2012 | Lee et al. |
| 2013/0028021 | A1 | 1/2013 | Sharon et al. |
| 2013/0031429 | A1 | 1/2013 | Sharon et al. |
| 2013/0031430 | A1 | 1/2013 | Sharon |
| 2013/0031431 | A1 | 1/2013 | Sharon et al. |
| 2013/0107628 | A1 | 5/2013 | Dong et al. |
| 2013/0114342 | A1 | 5/2013 | Sakai et al. |
| 2013/0229868 | A1 | 9/2013 | Koh et al. |
| 2014/0003157 | A1 | 1/2014 | Mui et al. |
| 2014/0169095 | A1 | 6/2014 | Avila et al. |

OTHER PUBLICATIONS

Pan, "Charge Pump Circuit Design," McGraw-Hill, 2006, 26 pages.

Pylarinos et al., "Charge Pumps: An Overview," Department of Electrical and Computer Engineering University of Toronto, www.eecg.toronto,edu/~kphang/ece1371/chargepumps.pdf., 7 pages.

U.S. Appl. No. 13/332,780 entitled "Simultaneous Sensing of Multiple Wordlines and Detection of NAND Failures," filed Dec. 21, 2011, 121 pages.

U.S. Appl. No. 13/101,765 entitled "Detection of Broken Word-Lines in Memory Arrays," filed May 5, 2011, 63 pages.

U.S. Appl. No. 13/193,083 entitled "Non-Volatile Memory and Method with Accelerated Post-Write Read Using Combined Verification of Multiple Pages," filed Jul. 28, 2011, 100 pages.

U.S. Appl. No. 13/280,217 entitled "Post-Write Read in Non-Volatile Memories Using Comparison of Data as Written in Binary and Multi-State Formats," filed Oct. 24, 2011, 110 pages.

U.S. Appl. No. 13/193,148 entitled "Data Recovery for Detection Word Lines During Programming of Non-Volatile Memory Arrays," filed Jul. 28, 2011, 48 pages.

U.S. Appl. No. 11/303,387 entitled "Charge Pump Regulation Control for Improved Power Efficiency," filed Dec. 16, 2011, 25 pages.

First Office Action issued for Chinese Patent Application No. 2011800340192 mailed on Dec. 2, 2014, 7 pages.

First Office Action issued for Chinese Patent Application No. 2011800388647 mailed on Feb. 3, 2015, 12 pages.

Programming into two states represented by a 1-bit code

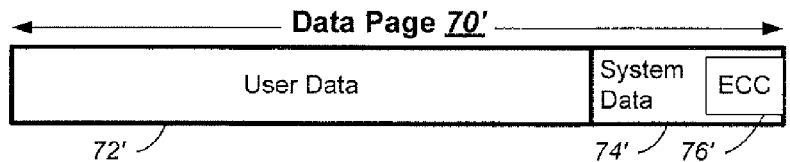
FIG. 9
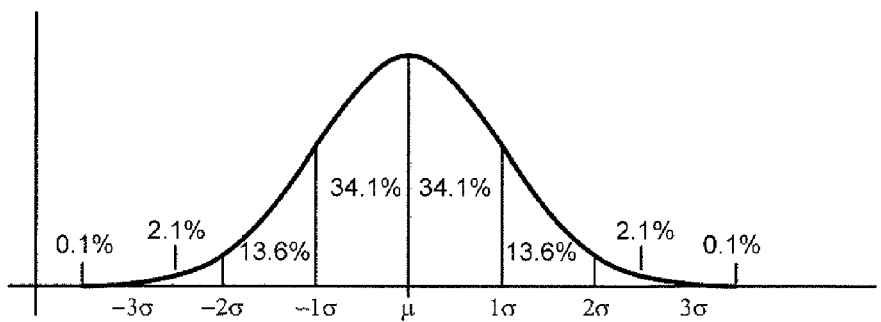
FIG. 10A
| Sigma Value | Cumulative value | Cumulative % | Example Error Rate at EOL |
|---|---|---|---|
| 1σ | 1.59E-01 | 15.86500000% | ... |
| 1.645σ | 5.00E-02 | 5.00000000% | 1 bits |
| 1.960σ | 2.50E-02 | 2.50000000% | ... |
| 2σ | 2.28E-02 | 2.27500000% | 2 bits |
| 2.576σ | 5.00E-03 | 0.50000000% | ... |
| 3σ | 1.35E-03 | 0.13500000% | 4 bits |
| 3.2906σ | 5.00E-04 | 0.05000000% | ... |
| 4σ | 3.17E-05 | 0.00316700% | 8 bits |
| 5σ | 2.87E-07 | 0.00028670% | 30 bits |
| 6σ | 9.86E-10 | 0.00000010% | 42 bits |
| 7σ | 1.28E-12 | 0.00000000% | ... |
FIG. 10B

| | ERROR SOURCE | DESCRIPTION |
|---|---|---|
| (A) | $E_{PW}(N_{CYC})$ | Bit errors that are present soon after the page is written. They increase with $N_{CYC}$, the number of program-erase cycling, which is a measure of the endurance of a block. |
| (B) | $E_{DR}(T, N_{CYC})$ | Bit errors due to data retention at EOL ("end of life") T = Temperature |
| (C) | $E_{RD}(N_R, N_{CYC})$ | Bit errors due to read disturb which increase with the number of reads $N_R$ and endurance |

*FIG. 11*

| | | |
|---|---|---|
| (A) | $E_{TOT}(N_{CYC}, N_R)$ | $= E_{PW}(N_{CYC}) + E_{DR}(T, N_{CYC}) + E_{RD}(N_R, N_{CYC})$ |
| (B) | (fresh after 1 year) $E_{TOT}(1, 1M)$ | $E_{PW}(N_{CYC}) + E_{DR}(85°C, 1) + E_{RD}(1M, 1)$ $= 3 + 2 + 0 = 5$ bits |
| (C) | (memory at EOL) $E_{TOT}(10K, 1M)$ | $E_{PW}(10K) \sim 10$, $E_{DR}(85°C, 10K) \sim 10$, and $E_{RD}(1M, 10K) \sim 1$ $= 10+10+1 = 21$ bits |

Examples of Total Errors at the beginning and end of life

*FIG. 12*

| | |
|---|---|
| $ECC_{DESIGN}$ | Must be designed to correct for worst case $E_{TOT}$(after EOL cycling, Data Retention specification) |

*FIG. 13*

Example of successful D1 to D3 Folding

Example of Read Error after 2nd D1 to D3 Folding

File System Configuration File

| PARAMETER | DESCRIPTION |
| --- | --- |
| E_pw_check | a variable set in File System Configuration File to specify at what # of ECC bits level, a D3 block is consider high risk and restart of D1 to D3 folding to a new D3 block is required |
| ECC_threshold_SLC | a variable is needed in File System Configuration File for maintaining SLC threshold to compare against in order to make a decision to continue with EPWR or not |
| EPWR_enable_flag | controlled in File System Configuration File. 0 = not set (Default); 1 = set when EPWR is enabled |
| Hot_count_enable_flag | 0 = not enabled; 1 = enabled |
| Hot_count_threshold_EPWR | a variable set in File System Configuration File to specify at what hot count level, EPWR is needed. If hot count of all D3 blocks is < hot count threshold, even EPWR enable flag is on, EPWR process is not triggered |
| EPWR_verify_page_budget | a variable set in File System Configuration File to specify how many pages can be read during 1 phase of EPWR |
| EPWR_retries | a variable in File System Configuration File to limit number of retry attempts |
| D3_Block_max_retries | a variable in File System Configuration File to limit the total number of retry attempts on a D3 block over lifetime |

*FIG. 21*

**Logical-Page-by-Logical-Page Programming
(2-bit LM Gray Code)**

Lower Page Read (LM Gray Code)

Upper Page Read (LM Gray Code)

Accelerated PWR

Selecting a sample of the data programmed in the first group of memory cells, the sample being selected from a subset of data said multiple subsets of data programmed into the first group and the sample is a subset of data estimated to have a highest error rate among said multiple subsets of data programmed into the first group — 910'

3 Data Pages stored on WL

MULTI-WORD LINE ERRATIC PROGRAMMING DETECTION

BACKGROUND OF THE INVENTION

This application relates to the operation of re-programmable non-volatile memory systems such as semiconductor flash memory, and, more specifically, to handling and efficient managing of errors in memory operations.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Errors in Written Data

In the types of memory systems described herein, as well as in others, including magnetic disc storage systems, the integrity of the data being stored is maintained by use of an error correction technique. Most commonly, an error correction code (ECC) is calculated for each sector or other unit of data that is being stored at one time, and that ECC is stored along with the data. The ECC is most commonly stored together with a unit group of user data from which the ECC has been calculated. The unit group of user data may be a sector or a multi-sector page. When this data is read from the memory, the ECC is used to determine the integrity of the user data being read. Erroneous bits of data within the unit group of data can often be corrected by use of the ECC.

The trend is to reduce the size of the memory systems in order to be able to put more memory cells in the system and to make the system as small as possible to fit in smaller host devices. Memory capacity is increased by a combination of higher integration of circuits and configuring each memory cell to store more bits of data. Both techniques require the memory to operate with increasing tighter margin of error. This in turn places more demand on the ECC to correct errors.

The ECC can be designed to correct a predetermined number of error bits. The more bits it has to correct, the more complex and computationally intensive will the ECC be. For quality assurance, conventional ECC is designed based on the expected worst-case cell error rate at the end of life of the memory device. Thus, they have to correct a maximum number of error bits up to the far tail end of a statistical population of error rate.

Major word line gross failures, such as word line to word line shorts, control gate short circuits, and broken word lines, have become significant in contributing to error rates as memory technology scales down. Identifying these failures is consequently of importance for memory to deliver low error rates. To increase memory integrity, detection of such failures can be done after each programming and more frequently at other times. When such detection is frequent, these can degrade system performance. Consequently, memory system performance would benefit from efficient, high performance detection.

SUMMARY OF THE INVENTION

A method is presented for determining whether a memory circuit, including an array of a plurality of memory cells formed along word lines and bit lines, has defective word lines. The method includes performing a program operation to write to one of two or more data states to each of a plurality of memory cells formed along a first plurality of selected word lines and a first set of one or more selected bits lines. First and second composite sensing operations are subsequently performed. Each of the first and second composite sensing operations includes: concurrently applying to each of the first plurality of selected word lines a corresponding sensing voltage to distinguish between a first pair of the data states, wherein the values of the sensing voltages for the second composite sensing operation are shifted by a margin voltage relative to the corresponding sensing voltages for the first composite sensing operation; and concurrently performing, for each of the one or more selected bit lines, a first combined sensing operation of the corresponding plurality of memory cells along the plurality of selected word lines while said sensing voltages are applied thereto, where the result of the first combined sensing operation for each of the selected bit lines is dependent upon the state of the plurality of memory cells therealong on the first plurality of selected word lines. The method also includes performing a comparison of the results of the first composite sensing operation to the result of the second composite sensing operation on a bit line by bit line basis for each of the first set of selected bit lines and, based upon the comparison, determining whether the first plurality of bit lines includes any defective word lines.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 9 illustrates schematically a data page containing an ECC field.

FIG. 10A shows a normal distribution of error rate, with the percentage of the population in various ranges of standard deviations a.

FIG. 10B illustrate the distribution of FIG. 10A in a table format.

FIG. 11 is a table listing the main sources of errors for a flash memory.

FIG. 12 is a table showing estimated total errors for an example memory device at the beginning and end of its life.

FIG. 13 is a table illustrating that a conventional ECC must be designed to correct the worst-ease total error $E_{TOT}$.

FIG. 21 is a table illustrating example parameters associated with the enhanced post-write-read error management. The table is preferably maintained in the file system configuration file stored in memory.

DETAILED DESCRIPTION

Memory System

Figure 1:
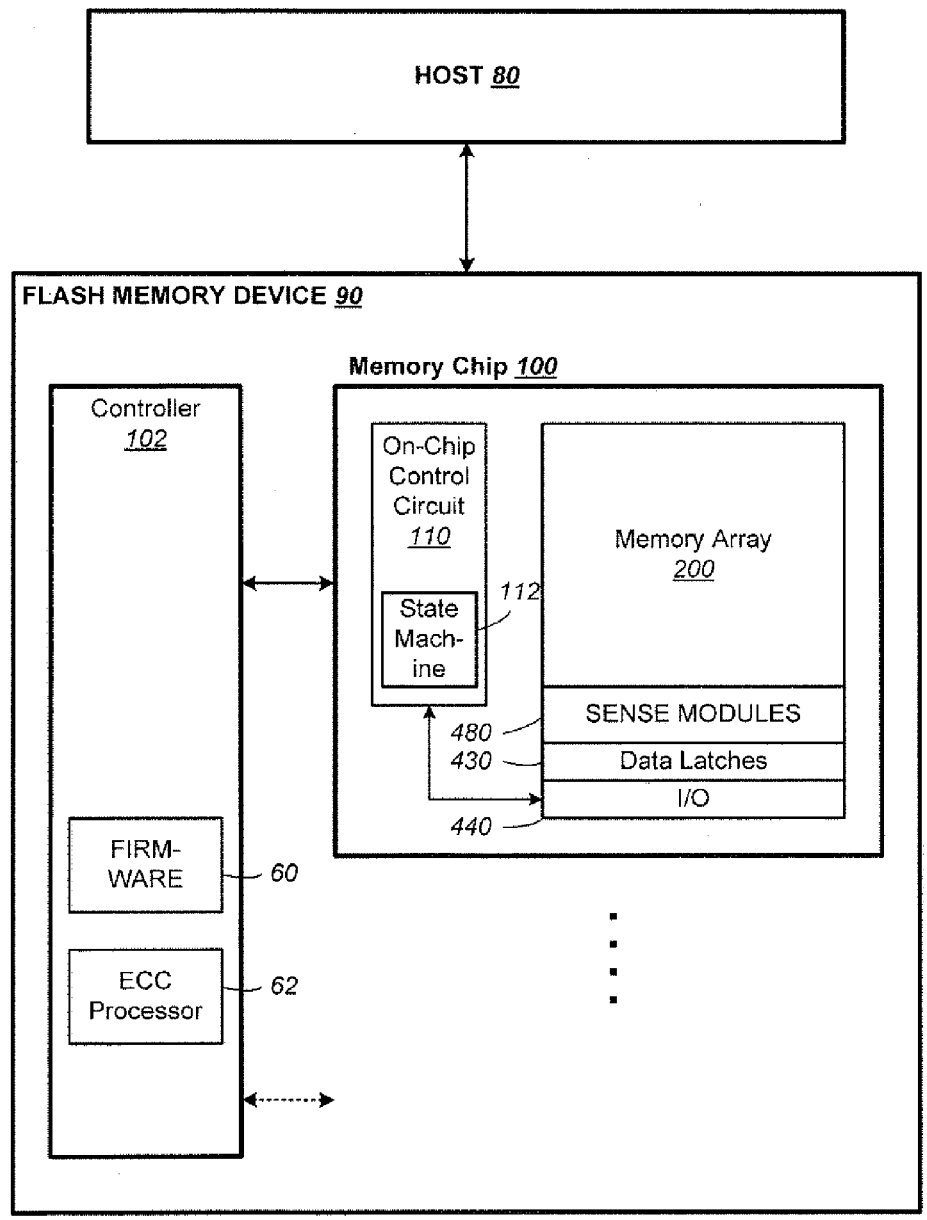
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a controller 102. The memory chip 100 includes a memory array 200 of memory cells with each cell capable of being configured as a multi-level cell ("MLC") for storing multiple bits of data. The memory chip also includes peripheral circuits such as sense modules 480, data latches 430 and I/O circuits 440. An on-chip control circuitry 110 controls low-level memory operations of each chip. The control circuitry 110 is an on-chip controller that cooperates with the peripheral circuits to perform memory operations on the memory array 200. The control circuitry 110 typically includes a state machine 112 to provide chip level control of memory operations.

In many implementations, the host 80 communicates and interacts with the memory chip 100 via the controller 102. The controller 102 co-operates with the memory chip and controls and manages higher level memory operations. For example, in a host write, the host 10 sends data to be written to the memory array 100 in logical sectors allocated from a file system of the host's operating system. A memory block management system implemented in the controller stages the sectors and maps and stores them to the physical structure of the memory array.

A preferred block management system is disclosed in United States Patent Application Publication No. 2010/0172180 A1, published on Jul. 8, 2010, the entire disclosure of which is incorporated herein by reference.

A firmware 60 provides codes to implement the functions of the controller 102. An error correction code ("ECC") processor 62 processes ECC during operations of the memory device. In another embodiment, the controller 102 is implemented within the host.

Physical Memory Structure

Figure 2:
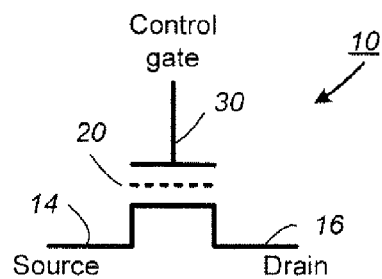
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element. Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of, memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Conversely, a threshold voltage is defined as the voltage on the control gate that will just turn on the cell with the given charge. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line or a known capacitor.

As can be seen from the description above, the more states a memory cell is made to store, the more finely divided is its threshold window. For example, a memory device may have memory cells having a threshold window that ranges from -1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

The memory array 200 is typically organized as a two-dimensional array of memory cells arranged in rows and columns and addressable by word lines and bit lines. The array can be formed according to an NOR type or an NAND type architecture.

Figure 3:
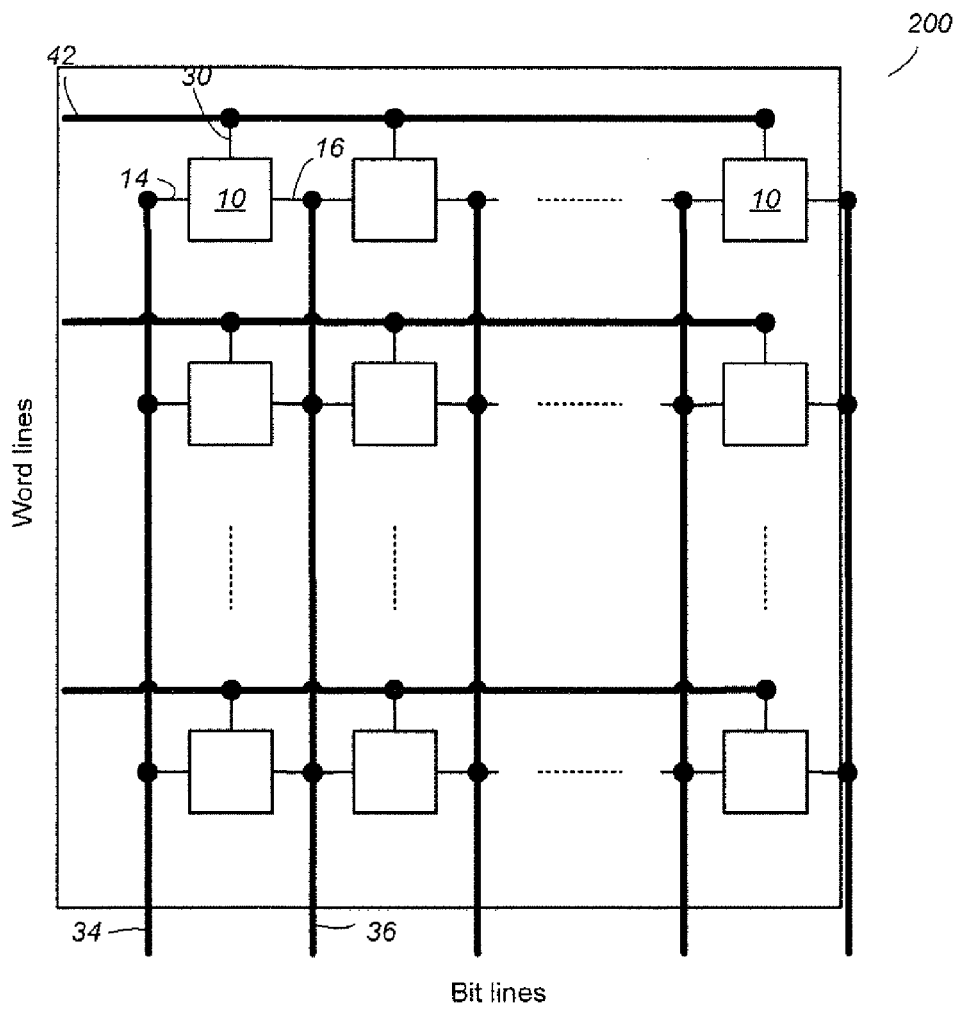
FIG. 3 illustrates an example of an NOR array of memory cells.

FIG. 3 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 4:
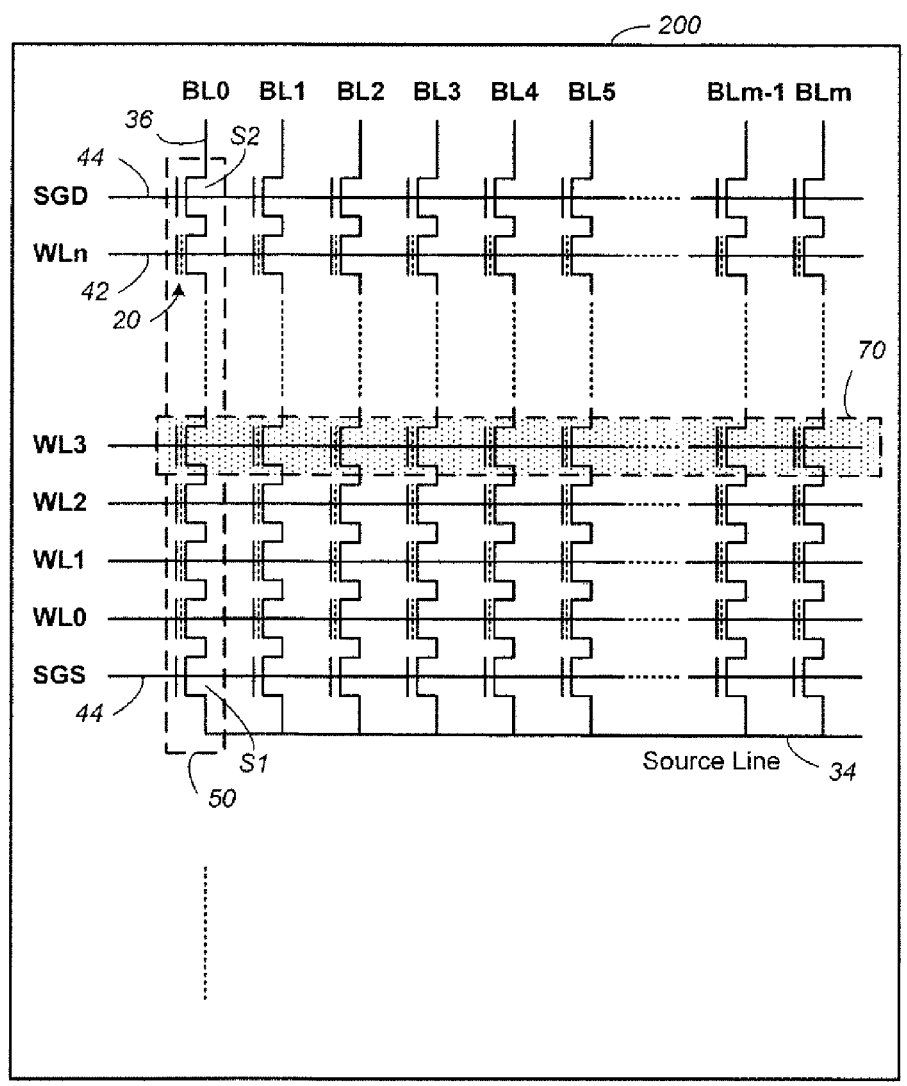
FIG. 4 illustrates a page of memory cells, organized for example in the NAND configuration, being sensed or programmed in parallel.

FIG. 4 illustrates a page of memory cells, organized for example in the NAND configuration, being sensed or programmed in parallel. FIG. 4 essentially shows a bank of NAND strings 50 in the memory array 200. A NAND string 50 comprises of a series of memory transistors (e.g., 4, 8, 16 or higher) daisy-chained by their sources and drains. A pair of select transistors S1, S2 controls the memory transistors chain's connection to the external via the NAND string's source terminal and drain terminal respectively. In a memory array, when the source select transistor S1 is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

When an addressed memory transistor 10 within an NAND string is read or is verified during programming, its control gate is supplied with an appropriate voltage via a common word line. At the same time, the rest of the non-addressed memory transistors in the NAND string 50 are fully turned on by application of sufficient voltage on their control gates. In this way, a conductive path is effective created from the source of the individual memory transistor to the source terminal of the NAND string and likewise for the drain of the individual memory transistor to the drain terminal of the cell. Memory devices with such NAND string structures are described in U.S. Pat. Nos. 5,570,315, 5,903,495, 6,046,935.

A "page" such as the page 70, is a group of memory cells enabled to be sensed or programmed in parallel. This is accomplished by a corresponding page of sense amplifiers. For example, the page 70 is along a row and is sensed by a sensing voltage applied to the control gates of the cells of the page connected in common to the word line WL3. Along each column, each cell such as cell 10 is accessible by a sense amplifier via a bit line 36. The page referred to above is a physical page memory cells or sense amplifiers. Depending on context, in the case where each cell is storing.

Sensing Circuits and Techniques

Figure 5A:
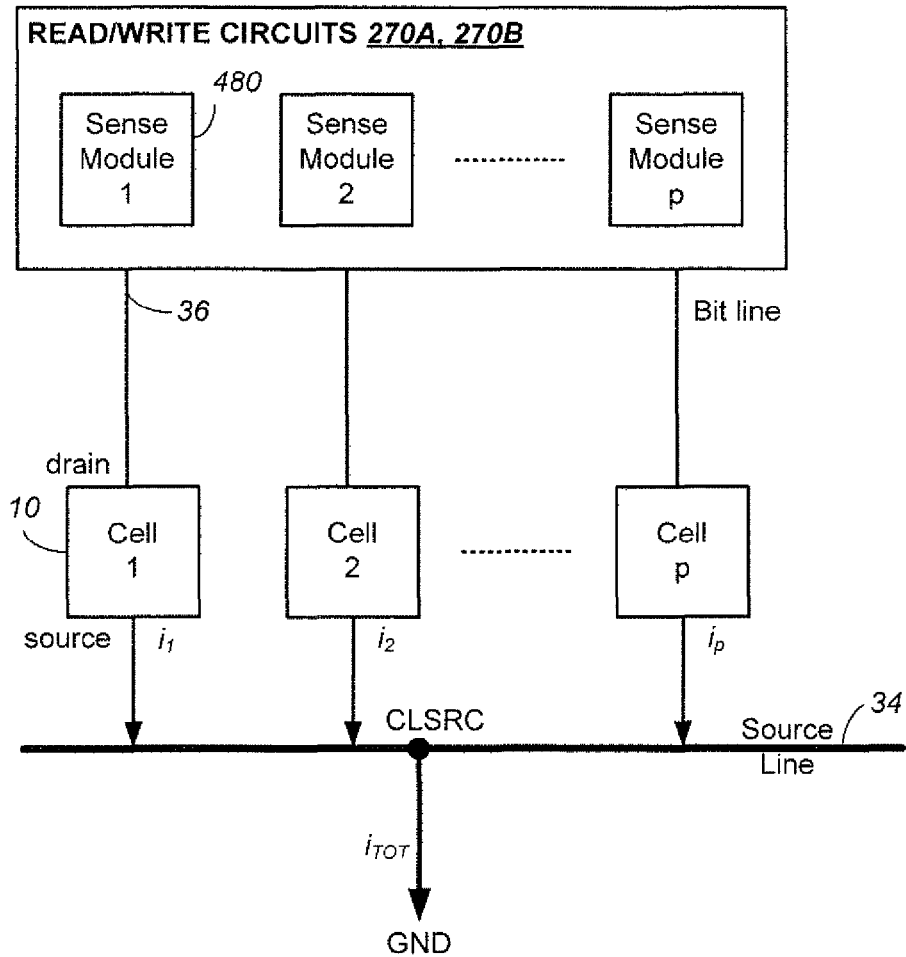
FIG. 5A illustrates in more detail the sense modules shown in FIG. 1 to contain a bank of p sense modules across an array of memory cells.

FIG. 5A illustrates in more detail the sense modules shown in FIG. 1 to contain a bank of p sense modules across an array of memory cells. The entire bank of p sense modules 480 operating in parallel allows a group (or physical page) of p cells 10 along a row to be read or programmed in parallel. Essentially, sense module I will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells.

In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A physical page of sensing circuits is coupled to either the even bit lines or to the odd bit lines at any one time.

In currently produced chips, the physical page may be 64 k or larger. In the preferred embodiment, the group is a run of the entire row of cells. This is the so-called "all bit-line" architecture in which the page is constituted from a row of contiguous memory cells coupled respectively to contiguous bit lines.

Figure 5B:
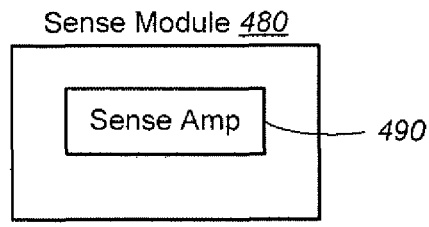
FIG. 5B illustrates a sense module including a sense amplifier.

FIG. 5B illustrates a sense module including a sense amplifier. The sense amplifier 490 detects the conduction current of a cell is above or below a reference level. The sensed results are latches in a corresponding set of latches 430 (see FIG. 1).

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 6:
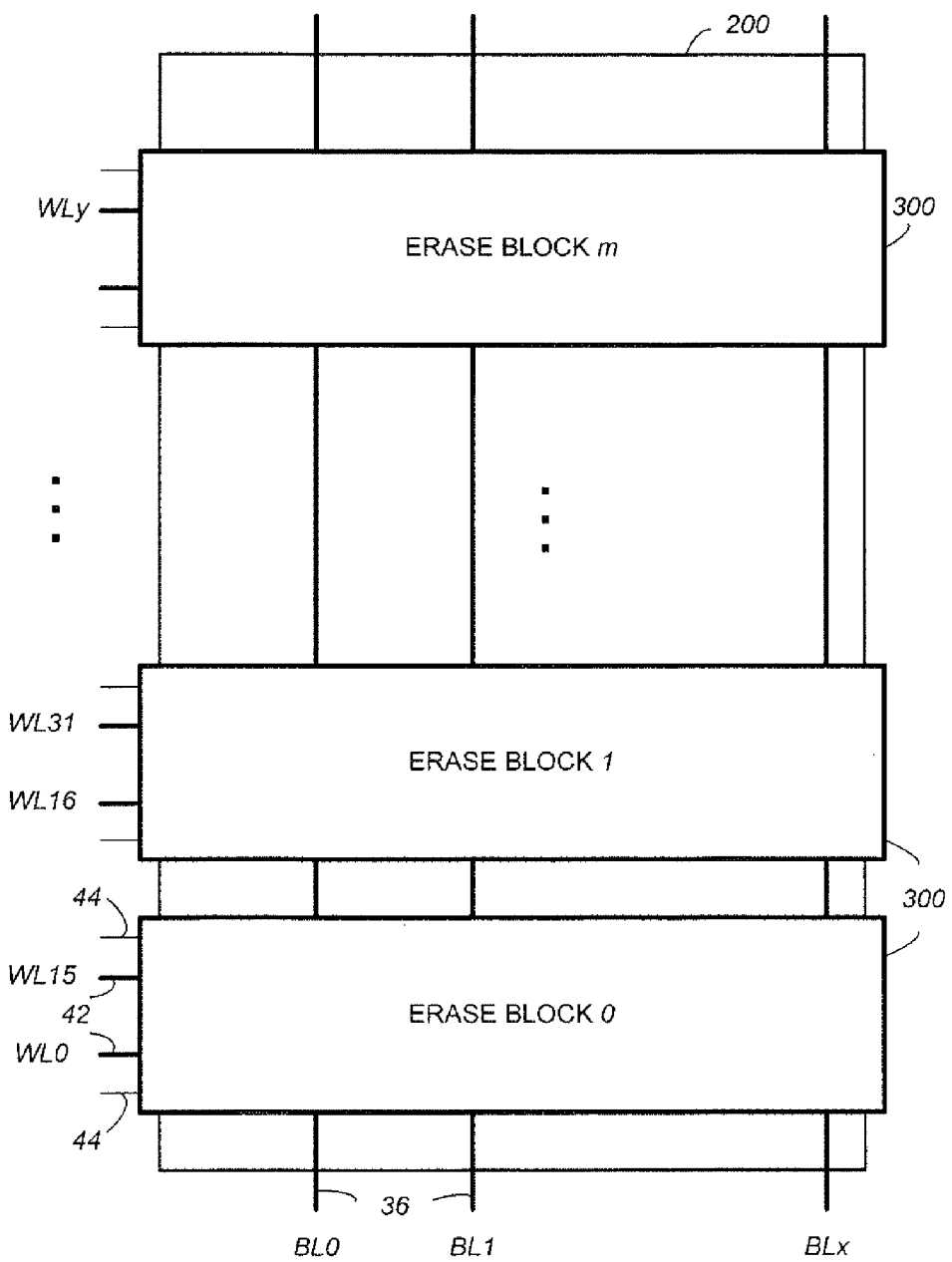
FIG. 6 illustrates schematically an example of a memory array organized in erasable blocks.

FIG. 6 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 6, individual memory cells in the memory array 200 are accessible by word lines 42 such as WL0-WLy and bit lines 36 such as BL0-BLx. The memory is organized into erase blocks, such as erase blocks 0, 1, . . . m. Referring also to FIGS. 5A and 5B, if the NAND string 50 contains 16 memory cells, then the first bank of NAND strings in the array will be accessible by select lines 44 and word lines 42 such as WL0 to WL15. The erase block 0 is organized to have all the memory cells of the first bank of NAND strings erased together. In another memory architecture, more than one bank of NAND strings may be erased together.

Examples of Binary (SLC) and Multi-State (MLC) Memory Partitioning

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits.

Figure 7:
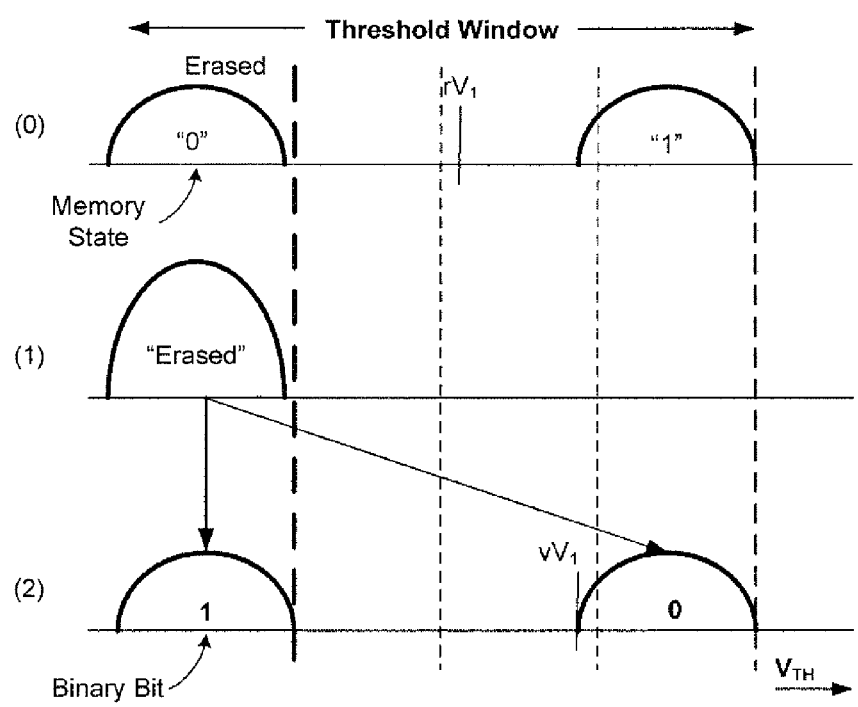
FIG. 7 illustrates a binary memory having a population of cells with each cell being in one of two possible states.

FIG. 7 illustrates a binary memory having a population of cells with each cell being in one of two possible states. Each memory cell has its threshold window partitioned by a single demarcation level into two distinct zones. As shown in FIG. 7(0), during read, a read demarcation level $rV_1$, between a lower zone and an upper zone, is used to determine to which zone the threshold level of the cell lies. The cell is in an "erased" state if its threshold is located in the lower zone and is in a "programmed" state if its threshold is located in the upper zone. FIG. 7(1) illustrates the memory initially has all its cells in the "erased" state. FIG. 7(2) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level $vV_1$. A memory with such memory cell partitioning is referred to as "binary" memory or Single-level Cell ("SLC") memory. It will be seen that a binary or SLC memory operates with a wide margin of error as the entire threshold window is only occupied by two zones.

Figure 8:
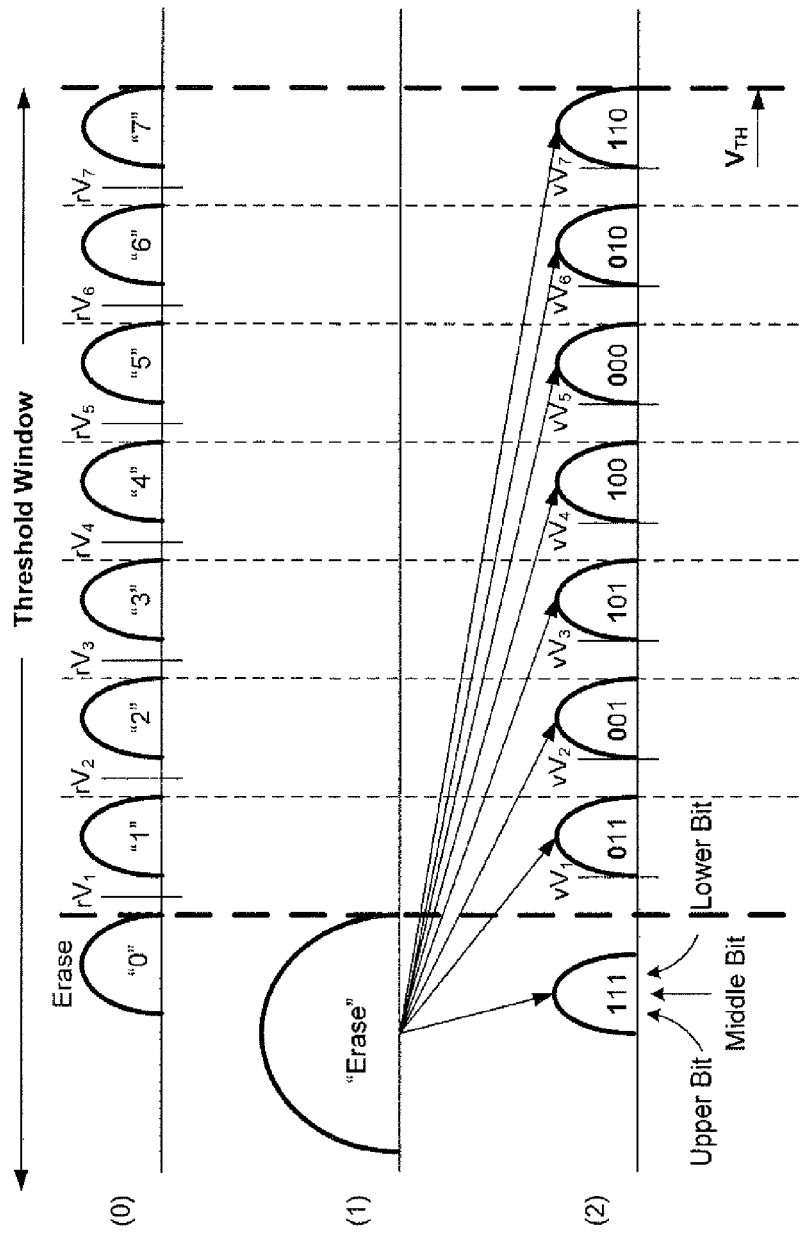
FIG. 8 illustrates a multi-state memory having a population of cells with each cell being in one of eight possible states.

FIG. 8 illustrates a multi-state memory having a population of cells with each cell being in one of eight possible states. Each memory cell has its threshold window partitioned by at least seven demarcation levels into eight distinct zones. As shown in FIG. 8(0), during read, read demarcation levels $rV_1$ to $rV_7$ are used to determine to which zone the threshold level of the cell lies. The cell is in an "erased" state if its threshold is located in the lowest zone and is in one of multiple "programmed" states if its threshold is located in the upper zones. FIG. 8(1) illustrates the memory initially has all its cells in the "erased" state. FIG. 8(2) illustrates some of cells being programmed to the "programmed" state. A 3-bit code having lower, middle and upper bits can be used to represent each of the eight memory states. For example, the "0", "1", "2", "3", "4", "5", "6" and "7" states are respectively represented by "111", "011", "001", "101'", "100", "000", "010" and '110". Typically programming is performed by application of one or more programming voltage pulses. After each pulse, the cell is sensed to verify if the threshold has moved beyond a reference which is one of verify demarcation levels $vV_1$ to $vV_7$. A memory with such memory cell partitioning is referred to as "multi-state" memory or Multi-level Cell ("MLC") memory.

Similarly, a memory storing 4-bit code will have lower, first middle, second middle and upper bits, representing each of the sixteen states. The threshold window will be demarcated by at least 15 demarcation levels into sixteen distinct zones.

As the memory's finite threshold window is partitioned into more regions, the resolution for programming and reading will necessarily become finer. Thus, a multi-state or MLC memory necessarily operates with a narrower margin of error compared to that of a memory with less partitioned zones. In other words, the error rate increases with the number of bits stored in each cell. In general, error rate increases with the number of partitioned zones in the threshold window.

Correction by Error Correction Code ("ECC")

Flash memory is prone to errors. To ensure error-free data, an error correction code ("ECC") is implemented to correct errors.

FIG. 9 illustrates schematically a data page containing an ECC field. As described in connection with FIG. 4 and FIG. 6A, a physical page of memory cells is programmed and read in parallel by virtue of a corresponding page of sense modules operating in parallel. When each memory cell stores multiple bits of data, there will be multiple data pages associated with each physical page. The data page 70' comprises a user portion 72' and a system portion 74'. The user portion 72' is for storage of user data. The system portion 74' is generally used by the memory system for storage of system data. Included in the system data is an ECC. The ECC is computed for the data page. Typically, the ECC is computed by the ECC processor 62 in the controller 102 (see FIG. 1.)

As data is received from a host, a page of data is staged in the controller 102 and its ECC 76' is computed by the ECC processor 62. The data page incorporating the ECC is then written to the memory array 200. Typically, when the data page is read, the data page is latched in the data latches 430 and shifted out of the I/O circuits 440 to the controller 102. At the controller 102, the data page's existing ECC is compared to a second version of the ECC computed on the read data. The ECC typically includes an error detection code ("EDC") for rapid detection of any error in the data page. If the EDC indicates the existence of any error in the read data page, the ECC is invoked to correct erroneous bits in the read data page.

As described above, an ECC is typically designed to correct for any errors expected during the useful life of the memory. The errors come from a number of sources.

The ECC can be designed to correct any number of error bits. The more bits it has to correct, the more complex and computationally intensive will the ECC be. For quality assurance, conventional ECC is designed based on the expected worst case cell error rate ("CER") at the end of life ("EOL") of the memory device. Thus, they have to correct a maximum number of error bits up to the far tail end of a statistical error population.

FIG. 10A shows a normal distribution of error rate with the percentage of the population in various ranges of standard deviations σ. For example, only 2.1% of the population lies within the range from 2σ to 3σ. Only 0.1% of the population lies within the range from 3σ to 4σ.

FIG. 10B illustrate the distribution of FIG. 10A in a table format. It can be seen that only E-09 or one in one billion of the population lies beyond 6σ. The last column in the table shows the estimated error rates for an example memory device in the worst case. For example, 5% of the population will have 1 error bit, 0.135% of the population will have 4 error bits and 1 in 1 billion of the population will have 42 error bits.

Consider a sample of 125 memory cards. Each card has a capacity of 16 GB with data pages of 2 KB each. This amounts to a population of one billion pages of 2 KB each. To ensure not a single page of the sample of 125 memory cards will have an error at the end of life of the card, an ECC capable of correcting up to 42 bits will be needed.

Errors During the Life Time of Memory

As described above, an ECC is typically designed to correct for any errors expected during the useful life expectancy of the memory. The errors come from a number of sources.

FIG. 11 is a table listing the main sources of errors for a flash memory. FIG. 11(A) shows a first source of error from post write $E_{PW}(N_{CYC})$ which is bit errors that are present after the page is written. In flash memory, "programming" refers to the process of increasing the threshold of a cell from an erased state. The term will be used interchangeable with "writing". The error rate increases with $N_{CYC}$ the number of program-erase cycling. After data has been written to a cell, in spite of passing the verify operation, the data could still be erroneous for two causes.

The first cause of post write error is due to over-programming not detected by the verify operation. Over-programming that can happen when a number of the memory cells are to be programmed at the same time. This is because the characteristics of each memory cell are different due to minor variations in the structure and operation of the semi-conductor devices which comprise the memory cells; therefore, variations in the programming speed of different cells will typically occur. This results in memory cells that become programmed faster than others and the possibility that some memory cells will be programmed to a different state than intended. Faster programming of multiple memory cells can result in over-shooting desired threshold voltage level ranges, producing errors in the data being stored.

Typically, when data is being programmed, the program-verify process for the device will check if the programmed threshold voltage of the memory cell is above than a reference level demarcating the current state from the adjacent less programmed state. However, the program-verify does not know how much above the reference level is the programmed threshold voltage. Thus, devices typically do not guarantee an upper limit on the threshold voltage. Some devices do check to see if a soft programming process (described below) raised the threshold voltage too high; however, these devices do not check to see if a regular programming process raised the threshold voltage too high. Thus, over programming which raises the threshold voltage beyond the range for the desired state can occur without being noticed. Over programming can cause the memory cell to overshoot to the next programmed state and thus storing incorrect data. This error will be detected during subsequent read operations, in which the programmed threshold of a cell is typically checked relative to both a lower and an upper limit demarcating a threshold range for a given memory state. More information about over programming can be found in U.S. Pat. Nos. 5,321,699; 5,386,422; 5,469,444; 5,602,789; 6,134,140; 6,914,823; and 6,917,542.

The second cause of post write error is in the apparent shifts in the stored charge levels due to field coupling between storage elements. The degree of this coupling is necessarily increasing as the sizes of memory cell arrays are being decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with the first. In particular, when sensed the memory cell will appear to have a higher threshold level (or more programmed) than when it is less perturbed. This is also known as the Yupin effect, and is described in U.S. Pat. No. 5,867,429, which patent is incorporated herein in their entirety by this reference. This patent describes either physically isolating the two groups of storage elements from each other, or taking into account the effect of the charge on the second group of storage elements when reading that of the first group.

FIG. 11(B) shows a second source of error $E_{DR}(T, N_{CYC})$ which is bit errors due to data retention at EOL. The error rate increases with temperature T and $N_{CYC}$ the number of program-erase cycling. The data error is due to the history of the device. It typically is related to a data retention problem, which depends on the memory device exposure to the environment, e.g., temperature. Over time, the actual stored charge levels may leak away slowly, causing the programmed thresholds to decrease.

As the number of states stored in each memory cell increases, the tolerance of any shifts in the programmed charge level on the storage elements decreases. Since the ranges of charge designated for each storage stat necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual disturbs to the charge stored in one cell can be created when programming and reading that cell, and when reading, programming and erasing other cells that have some degree of electrical coupling with the that cell, such as those in the same column or row, and those sharing a line or node.

FIG. 11(C) shows a third source of error $E_{RD}(N_R, N_{CYC})$ which are bit errors due to read disturb. The error rate increases with the number of reads and $N_{CYC}$ the number of program-erase cycling.

An important consideration for flash memory is that it has an endurance problem as it ages with use. When a cell is repeatedly programmed and erased, charges are shuttled in and out of the floating gate 20 (see FIG. 2) by tunneling across a dielectric. Each time some charges may become trapped in the dielectric and will modify the threshold of the cell. The number of program-erase cycles a cell has experienced is measured by a cycle count $N_{CYC}$ (also known as "hot count"). Though repeated cycling, the value of $N_{CYC}$ increases for a given erase block, causing the threshold window for the cells in the block to narrow progressively. Thus, the effect program-erase cycling will significantly impact all the sources of error listed in FIG. 11.

FIG. 12 is a table showing estimated total errors for an example memory device at the beginning and end of its life. FIG. 12(A) shows the total errors from the three sources listed in FIG. 11(A) to FIG. 11(C) to be $E_{TOT}(N_{CYC}, N_R) = E_{PW}(N_{CYC}) + E_{DR}(T, N_{CYC}) + E_{RD}(N_R, N_{CYC})$.

FIG. 12(B) shows an estimated $E_{TOT}$ when the memory is relatively fresh (low $N_{CYC}$) but has been baked at 85° C. for 5 years and has been read $10^6$ times. The estimates for the various component errors are: $E_{PW}(1)\sim 3$, $E_{DR}(85°\,C., 1)\sim 2$, and $E_{RD}(1M, 1)\sim 0$. These yield a total estimated error $E_{TOT}(1, 1M) = 3+2+0 = 5$ bits.

FIG. 12(C) shows an estimated $E_{TOT}$ when the memory is near the end of life of the device ("EOL"). It is characterized by a high program-erase cycling ($N_{CYC}=10K$) with other parameters similar to that of FIG. 12(B). The estimates for the various component errors are: $E_{PW}(10K)\sim 10$, $E_{DR}(85°\,C., 10K)\sim 10$, and $E_{RD}(1M, 10K)\sim 1$. These yield a total estimated error $E_{TOT}(10K, 1M) = 10+10+1 = 21$ bits.

Of the three sources of error described in FIG. 11 and FIG. 12, generally the error due to read disturb $E_{RD}$ is not as significant as error due to write $E_{PW}$ and error due to data retention $E_{DR}$. Data retention errors can be alleviated by periodically refreshing the threshold levels of the cells in a "read scrub" operation.

To correct for the various errors that may arise in the memory, especially the error arising after write, an EEC (described earlier in connection FIG. 9) is employed. However, using ECC to correct errors will consume processing time and, the more bits it has to correct, the more computational time is required. The memory performance will be degraded by employing a strong ECC able to correct a large number of error bit. Additional dedicated hardware may be implemented to perform the ECC in a reasonable amount of time. Such dedicated hardware can take up a considerable amount of space on the controller ASIC chip.

FIG. 13 is a table illustrating that a conventional ECC must be designed to correct the worst-case total error $E_{TOT}$. That will be a device at the end of life with high program-erase cycle count and data retention specification. For the example given in FIG. 12(C), the ECC must be capable of correcting at least 21 error bits.

Adaptively Rewrite Data from a Higher Density Memory Portion to a Lower Error Rate Memory Portion to Control Error Rate According to a general aspect of the invention, a flash memory having an array of memory cells is configured with a first portion and a second portion. The second portion stores data at higher density but operates with a smaller margin of errors compared to the first portion. Data is written to the second portion for efficient storage. Afterwards, the data is read back to check for excessive error bits. If the error bits exceeded a predetermined amount, the data is rewritten to the less error-prone first portion. This places a limit on the maximum number of error bits arising from writing data to the memory. In a statistical distribution of error rates, the limit represents a limit on the number standard derivations of the distribution so that the far tail-end of the distribution (with higher error rates) can be ignored. This allows a smaller and more efficient error correction code ("ECC") to be designed for correcting a smaller number of errors bits, thereby improving the performance and reducing the cost of the memory.

Figure 14A:
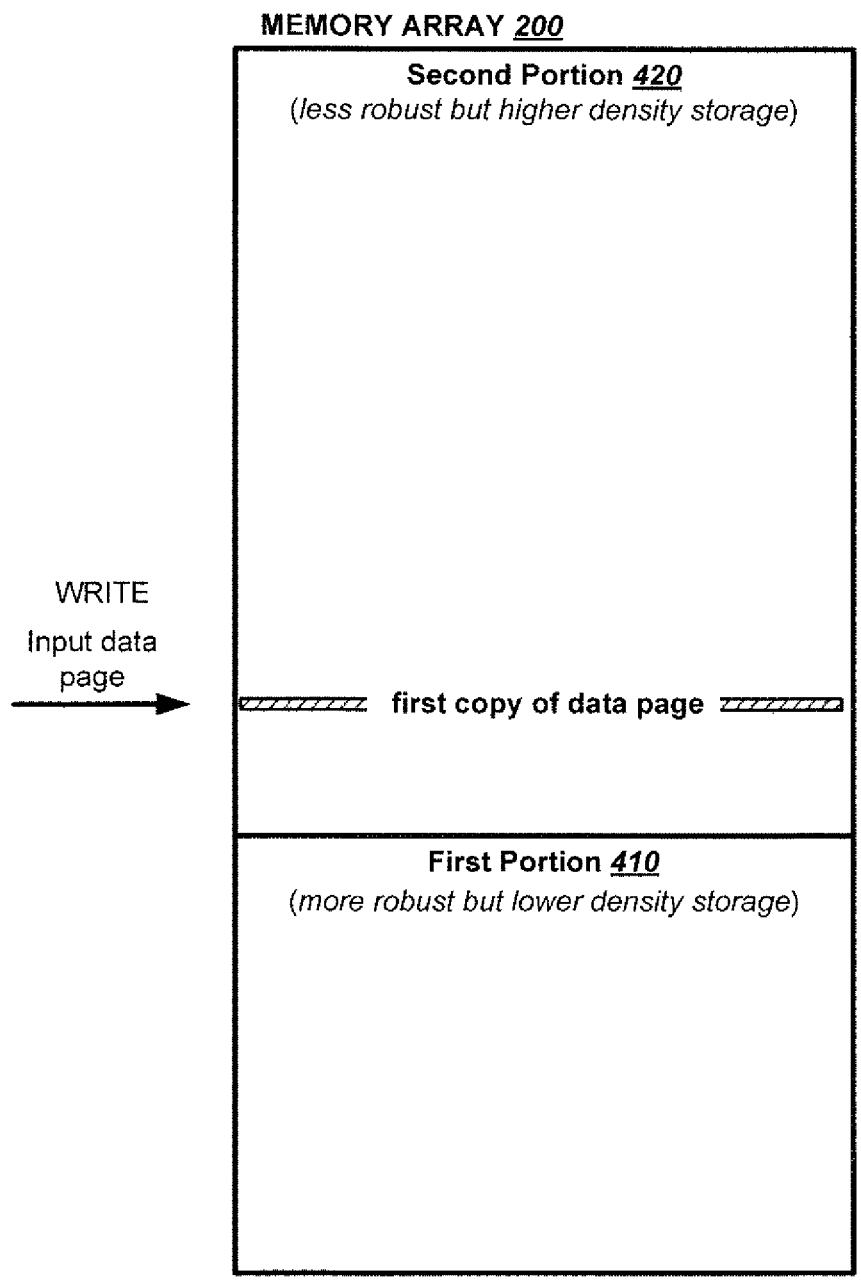
FIG. 14A illustrates a memory array being partitioned into two portions according to a preferred embodiment of the invention.

FIG. 14A illustrates a memory array being partitioned into two portions according to a preferred embodiment of the invention. The array of memory cells 200 is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. For example, a memory cell in the first portion is configured to store 1 bit of data as compared to 3 bits of data in the second portion. In view of the discussion earlier, the first portion will operate with a much wider margin of error compared to that of the second portion. Thus, memory operations in the first portion will have less error than that in the second portion.

U.S. Pat. No. 6,456,528, entitled "Selective Operation of a Multi-state Non-volatile Memory System in a Binary Mode", discloses a flash non-volatile memory having memory cells normally operating in more than two states but with selected memory cells operating in only two-states in order to provide an increased margin during two-state operation. This allows faster programming and a longer operational life of the memory cells being operated in two states when it is more desirable to have these advantages than the increased density of data storage that multi-state operation provides. The entire disclosure of U.S. Pat. No. 6,456,528 is incorporated herein by reference.

When a page of incoming data is to be written to the memory array 200, it is preferably stored in the high density second portion for the sake of efficiency and high capacity. Thus a first copy of the data page is written to the second portion.

Later, the first copy of the data page is read back in a "post write read" to determine if there are any errors. This is accomplished either by comparison with the original copy which may be cached or by checking the EDC portion of the ECC.

Determination is made whether the number of error bits in the read copy exceeded a predetermined amount. If the number of error bits does not exceed the predetermined amount, the first copy is regarded stored in the second portion is deemed valid. Subsequent read of the data page will be from the first copy in second portion and any errors will be corrected by ECC at the controller.

As explained earlier in connection with FIG. 11, the verify process during programming only checks for under-programming and not over-programming. Thus, error may still exist after the data page has been program-verified. It will take a read operation relative to all the demarcation levels (see FIG. 7 and FIG. 8) to detect any error in the data page. Furthermore, the Yupin effect of subsequent programming of neighboring cells could perturb the data page in question and shift the apparent sensed results. Thus, the read back should at least be after the programming of all neighboring cells that could have significant Yupin effect on the current data page. In another embodiment, the read back is after all the cells in the block containing the data page in question are done programming.

"Post write read" is also disclosed in U.S. Pat. Nos. 6,914,823, 6,917,542 and 7,009,889, their entire disclosures are incorporated herein by reference.

Figure 14B:
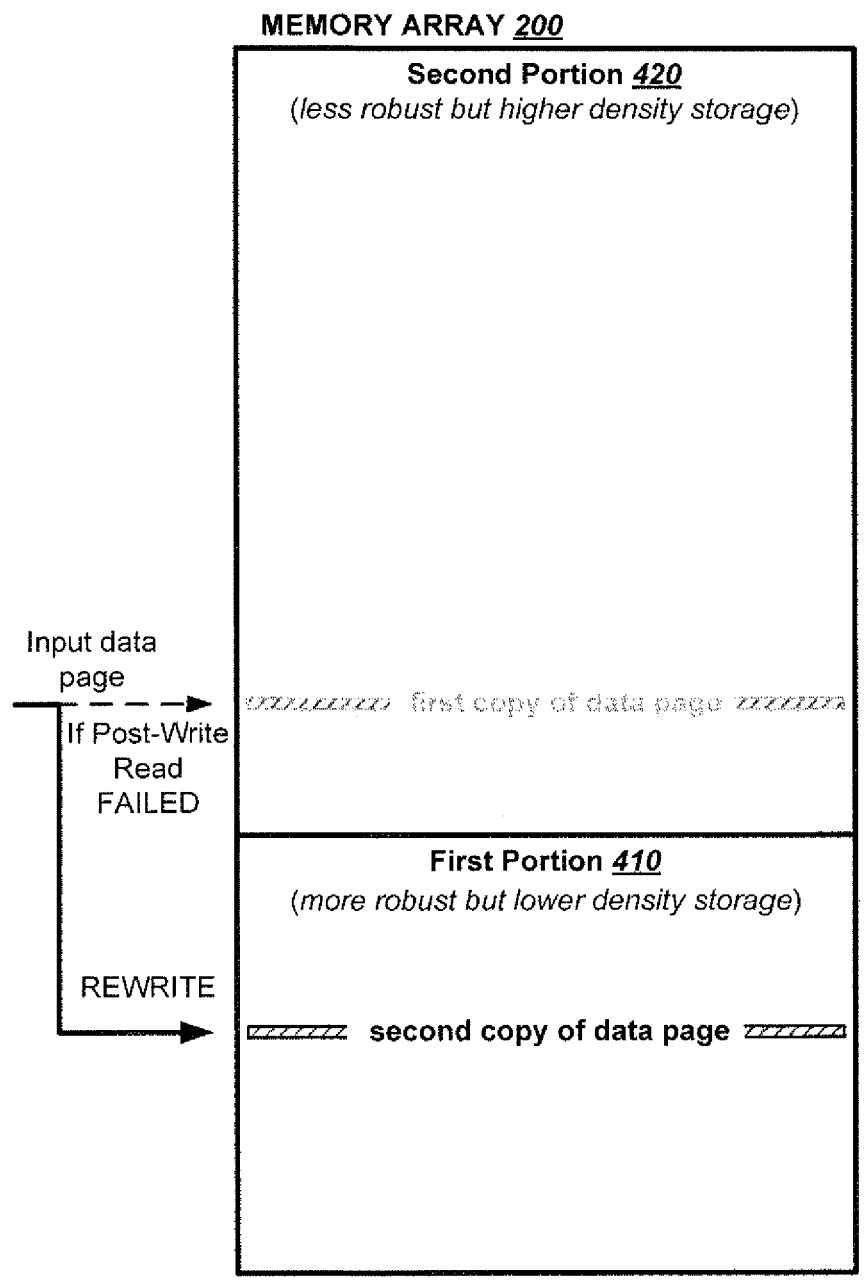
FIG. 14B illustrates a rewrite of a second copy of the data page into the first portion of the memory array of FIG. 14A.

FIG. 14B illustrates a rewrite of a second copy of the data page into the first portion of the memory array of FIG. 14A. After the post-write read detects the number of error bits in the data page has exceeded the predetermined amount, a second copy of the data page is rewritten to the first portion. The second copy is of the original data which may be cached or in another embodiment, by retrieving the first copy and correcting the error bits with the ECC.

After the second copy has been written to the first portion, it will replace the first copy in the second portion as the valid copy. The first copy will become obsolete and a directory in a block management system embodied in the firmware of the controller (see FIG. 1) will be updated to direct subsequent access to the second copy.

In one preferred embodiment, the first portion has each memory cell storing one bit of data and the second portion has each memory cell storing more than one bit of data.

Figure 15:
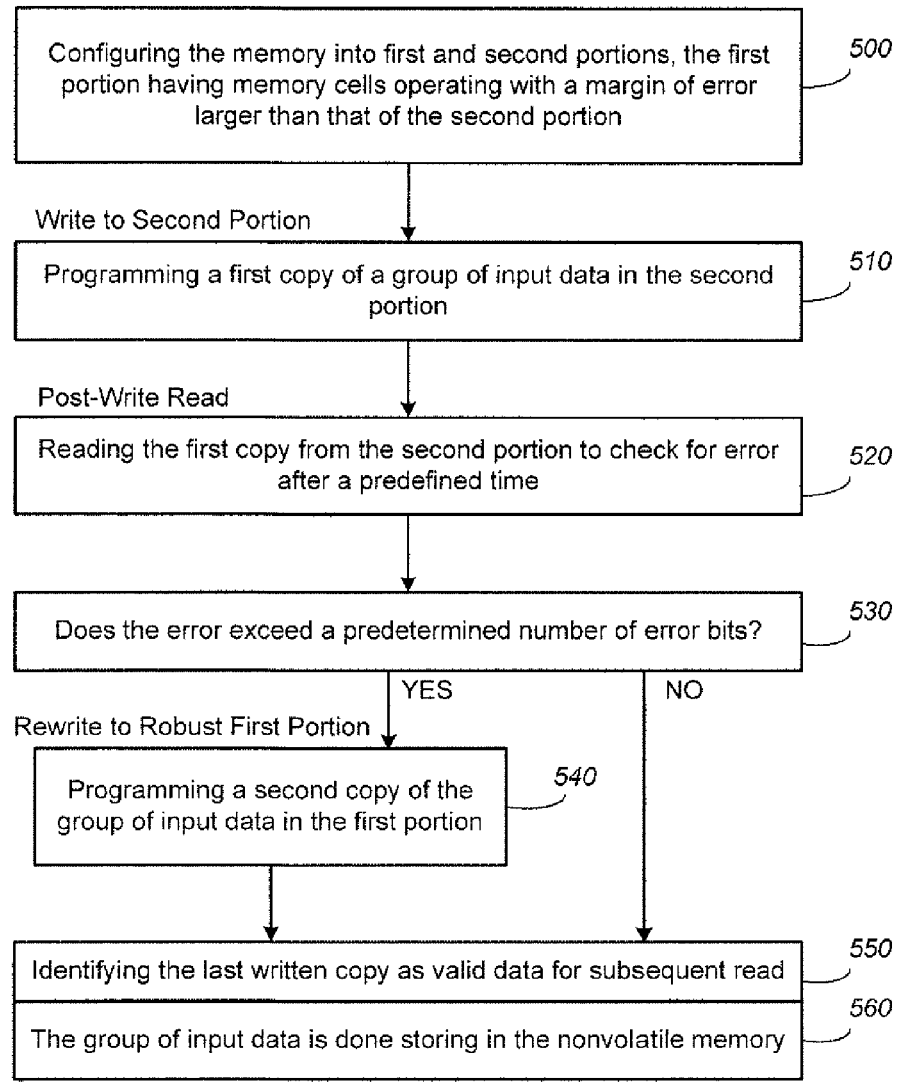
FIG. 15 is a flow diagram illustrating the process of post-write read and adaptive rewrite according to the embodiment described in FIG. 14A and FIG. 14B.

FIG. 15 is a flow diagram illustrating the process of post-write read and adaptive rewrite according to the embodiment described in FIG. 14A and FIG. 14B.

STEP 500: Configuring the memory into first and second portions, the first portion having memory cells operating with a margin of error larger than that of the second portion.

STEP 510: Programming a first copy of a group of input data in the second portion.

STEP 520: Reading the first copy from the second portion to check for error after a predefined time.

STEP 530: Does the error exceed a predetermined number of error bits? If so, proceed to STEP 540. Otherwise proceed to STEP 550.

STEP 540: Programming a second copy of the group of input data in the first portion.

STEP 550: Identifying the last written copy as valid data for subsequent read.

STEP 560: The group of input data is done storing in the nonvolatile memory.

In an alternative embodiment, the first portion serves as a cache for incoming data, so a cache copy of the input data is programmed into the cache. Then a first copy of data is programmed into the second portion.

If the post-write read has not detected an excessive amount of error in the first copy, the first copy will be deemed valid and subsequent read will be directed to access the first copy.

On the other hand, if the post-write read has detected an excessive amount of error in the first copy, the cached copy in the first portion will replace the first copy in the second portion as valid data. The first copy will become obsolete and a directory in a block management system embodied in the firmware of the controller (see FIG. 1) will be update to direct subsequent access to the cached copy.

U.S. Pat. No. 5,930,167, entitled "Multi-state Non-volatile Flash Memory Capable of Being its Own Two State Write Cache", discloses a flash memory array having two portions. A first portion is configured to store one bit per cell and a second portion is configured to store more than one bit per cell. The first portion acts as a low-density write cache. Incoming data is initially cached in the first portion. At a later time, in the background, the cached data is transferred to the second portion with higher storage density. The entire disclosure of U.S. Pat. No. 5,930,167 is incorporated herein by reference.

In the preferred embodiment, the first portion is further provided with a first section and a second section. The incoming data is cached in the first section of the first portion and a first copy of the data is written to the second portion. Afterwards, the first copy in the second portion is read back to check for excessive error bits. If the error bits exceeded a predetermined amount, a second copy of the incoming data is written to the second section of the first portion.

Figure 16A:
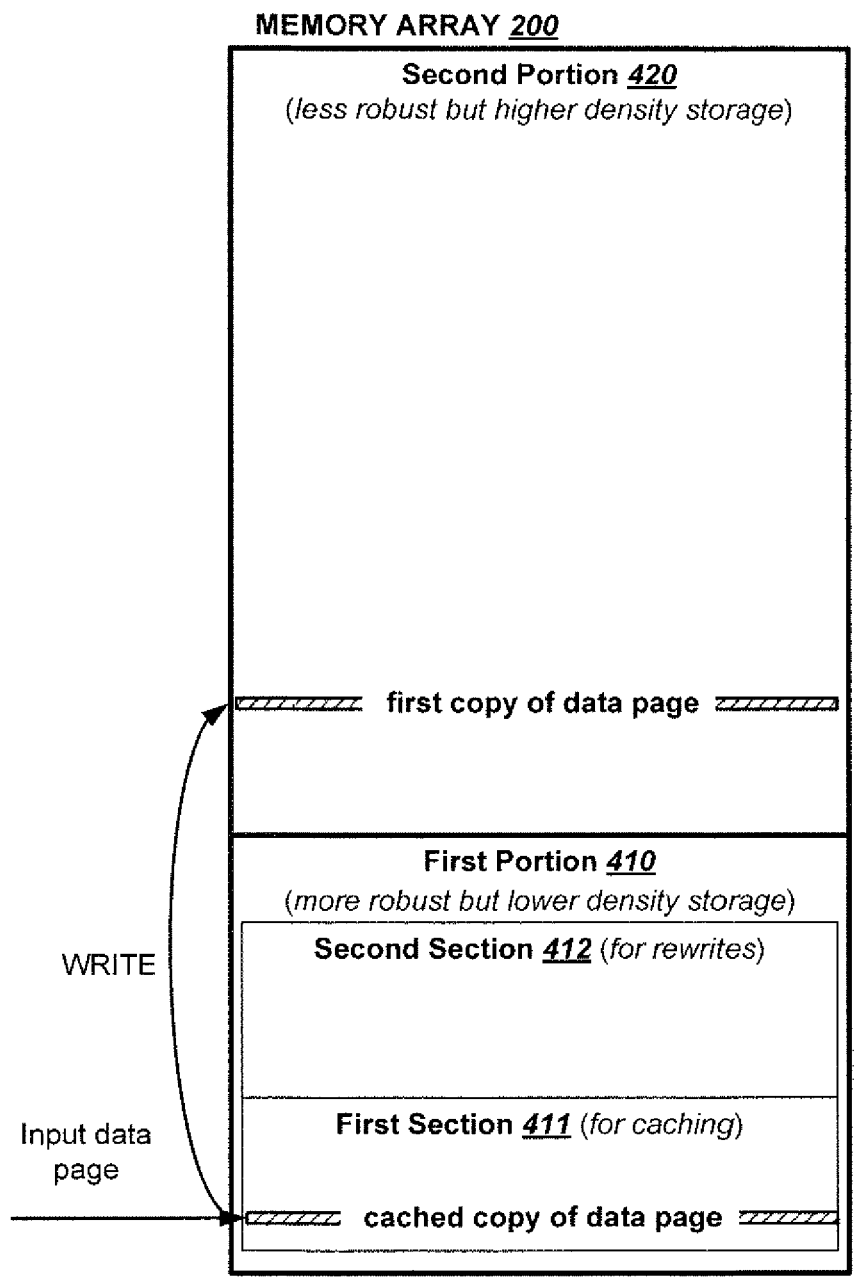
FIG. 16A illustrates a memory array being partitioned into two portions and the first portion further provided with a cache section and rewrite section, according to a preferred embodiment of the invention.

FIG. 16A illustrates a memory array being partitioned into two portions and the first portion further provided with a cache section and rewrite section, according to a preferred embodiment of the invention. As in FIG. 14A, the array of memory cells 200 is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. The first portion therefore operates with a wider margin of error than that of the second portion.

The first portion 410 is further provided with a first section 411 for caching incoming data and a second section 412 for storing rewrites from the second portion.

When a page of incoming data is to be written to the memory array 200, a cached copy is cached in the first section 411 of the first portion 410. A first copy is preferably stored in the high density second portion for the sake of efficiency and high capacity. Thus a first copy of the data page is written to the second portion.

According to another preferred embodiment, the memory array is provided with a set of data latches on an integrated circuit chip, the checking of the error bits in the first copy is accomplished by loading the first copy and the cached copy into the set of data latches and making a comparison at the set of data latches.

By not making the comparison at the controller, the data does not have to be toggled out to the controller, much time can be saved. FIG. 1 shows the data latches 430, which is on-chip, for the data comparison to take place.

Figure 16B:
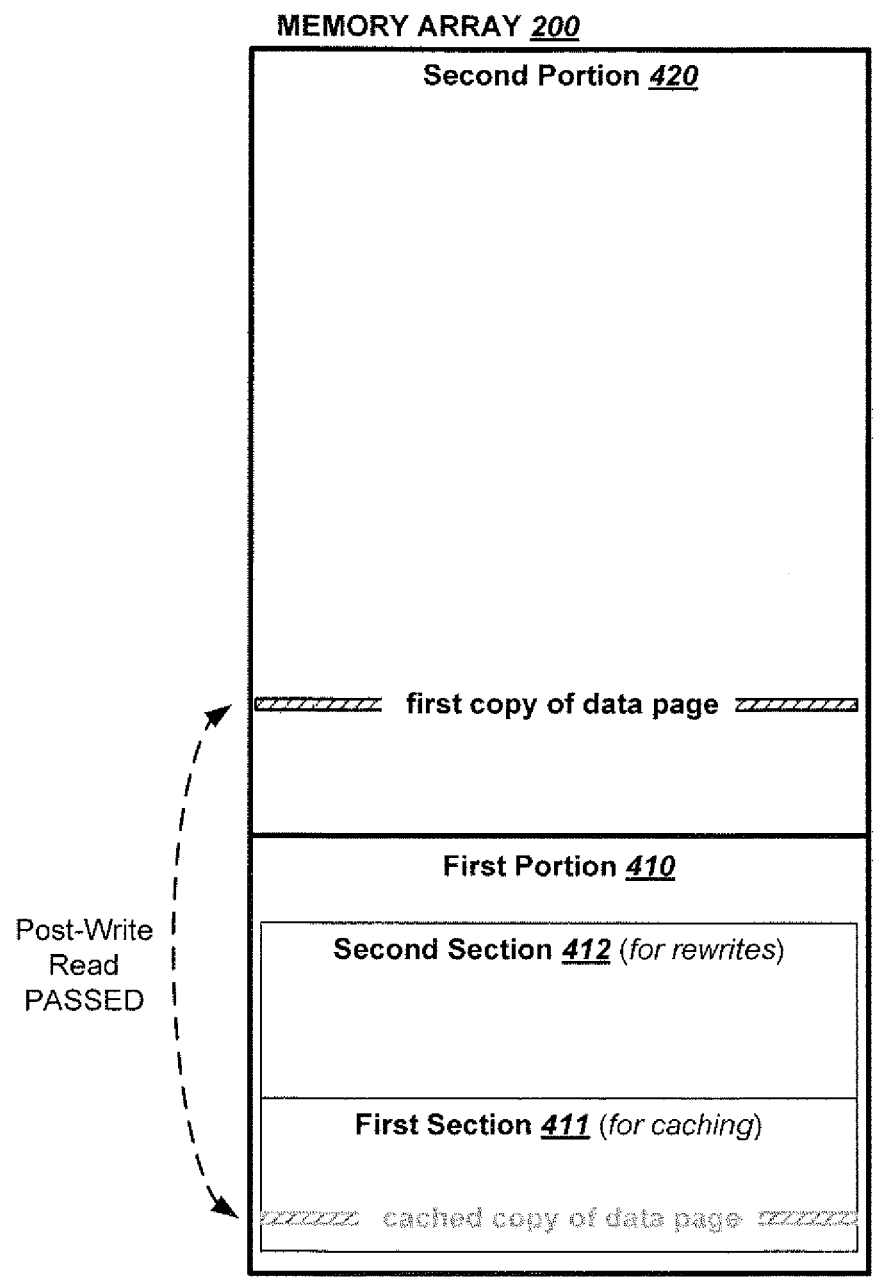
FIG. 16B illustrates a page compare technique according a preferred embodiment of the post-write read.

FIG. 16B illustrates a page compare technique according a preferred embodiment of the post-write read. The first copy of the data page in the second portion is read back in a "post write read" to determine if there are any errors. This is accomplished by comparison with the cached copy.

If the number of error bits does not exceed the predetermined amount, the first copy stored in the second portion is deemed to be valid. The cached copy will become obsolete and a directory in a block management system embodied in the firmware of the controller (see FIG. 1) will be updated to direct subsequent access to the first copy. Subsequent read of the data page will be from the first copy in the second portion and any errors will be corrected by ECC at the controller.

Figure 16C:
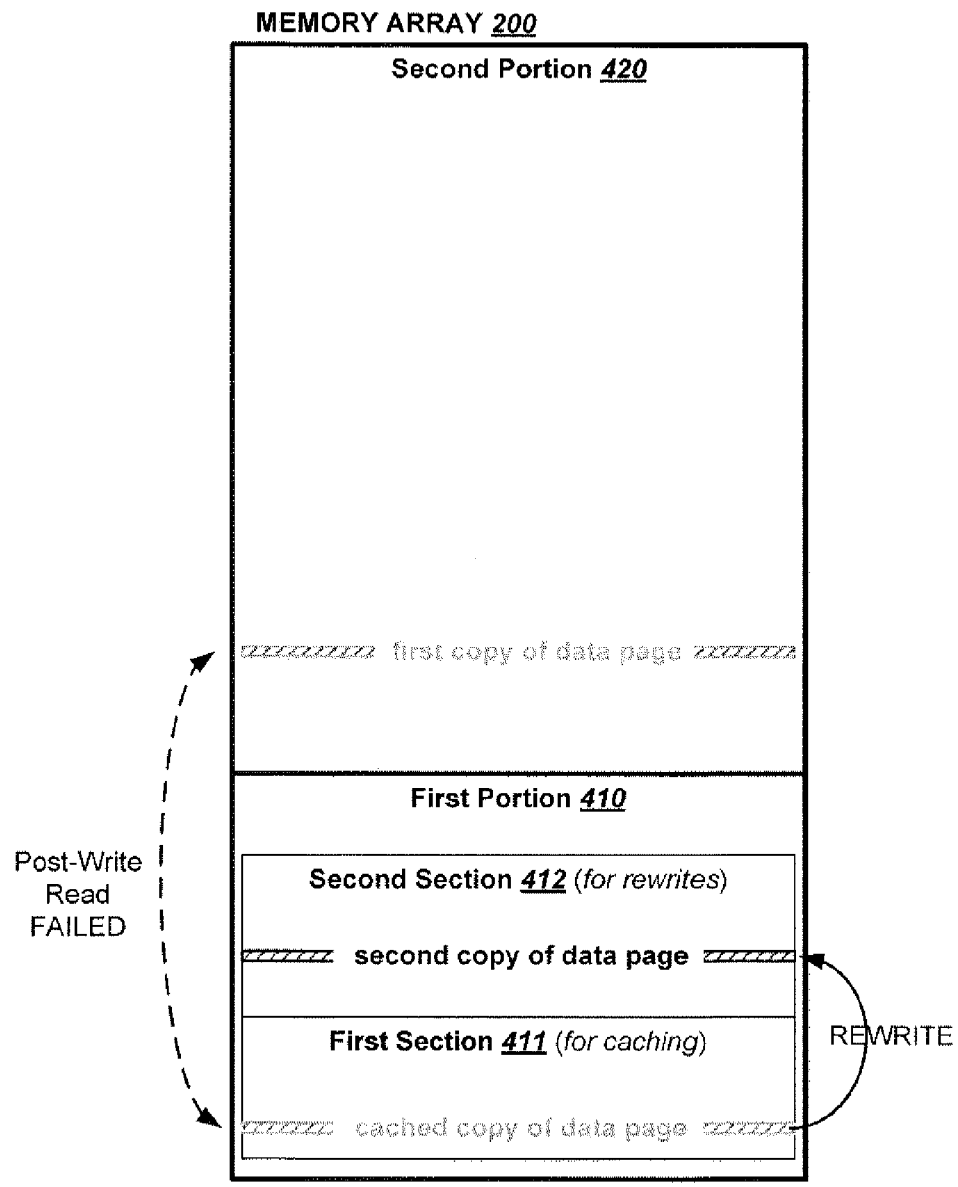
FIG. 16C illustrates a rewrite to the first portion after a post-write read has determined an excessive amount of error in the data page in the second portion.

FIG. 16C illustrates a rewrite to the first portion after a post-write read has determined an excessive amount of error in the data page in the second portion. After the post-write read detects the number of error bits in the data page of the first copy has exceeded the predetermined amount, a second copy of the data page is rewritten to the second section 412 of the first portion 410. The second copy is taken from the cached copy.

After the second copy has been written to the second section 412 of the first portion, it will replace the first copy in the second portion. The first copy and the cached copy will become obsolete and a directory in a block management system embodied in the firmware of the controller (see FIG. 1) will be updated to direct subsequent access to the second copy.

Figure 17:
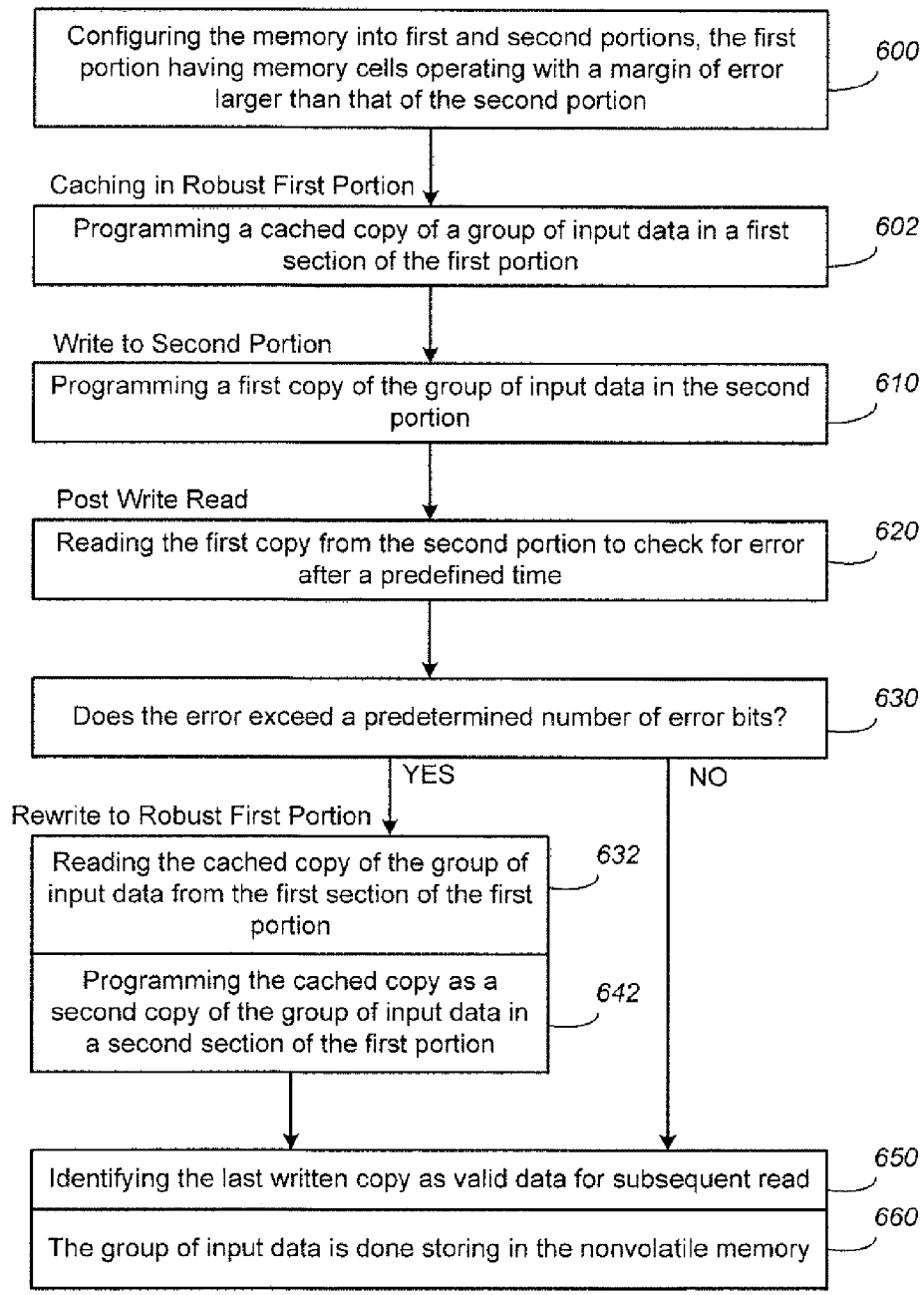
FIG. 17 is a flow diagram illustrating the process of post-write read and adaptive rewrite according to the embodiment described in FIG. 16A to FIG. 16C.

FIG. 17 is a flow diagram illustrating the process of post-write read and adaptive rewrite according to the embodiment described in FIG. 16A to FIG. 16C.

STEP 600: Configuring the memory into first and second portions, the first portion having memory cells operating with a margin of error larger than that of the second portion.

STEP 602: Programming a cached copy of a group of input data in a first section of the first portion.

STEP 610: Programming a first copy of the group of input data in the second portion.

STEP 620: Reading the first copy from the second portion to check for error after a predefined time.

STEP 630: Does the error exceed a predetermined number of error bits? If so, proceed to STEP 632. Otherwise proceed to STEP 650.

STEP 632: Reading the cached copy of the group of input data from the first section of the first portion.

STEP 642: Programming the cached copy as a second copy of the group of input data in a second section of the first portion.

STEP 650: Identifying the last written copy as valid data for subsequent read.

STEP 660: The group of input data is done storing in the nonvolatile memory.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

Enhanced Post-Write-Read Error Management

In another aspect of the invention, an enhanced post-write read error management is implemented. The post-write read is not enabled at the beginning of life of a memory device. The error rate of the memory device at the beginning of life is very low and there is no need to operate the post-write read. This avoids wasting time to do post-write read. As the memory device ages through use, the enhanced post-write read and error management of the invention is enabled at a predetermined age of the device.

In a preferred embodiment, the age of the memory device is determined by a hot count maintained with each erase block of memory cells. The hot count tracks the endurance or the number of times the erase block has been cycled through erase and program operations. Whenever a hot count of an erase block passes a predetermined hot count threshold, the enhanced post-write-read error management will commence and operate until the end of life of the memory device.

Figure 18:
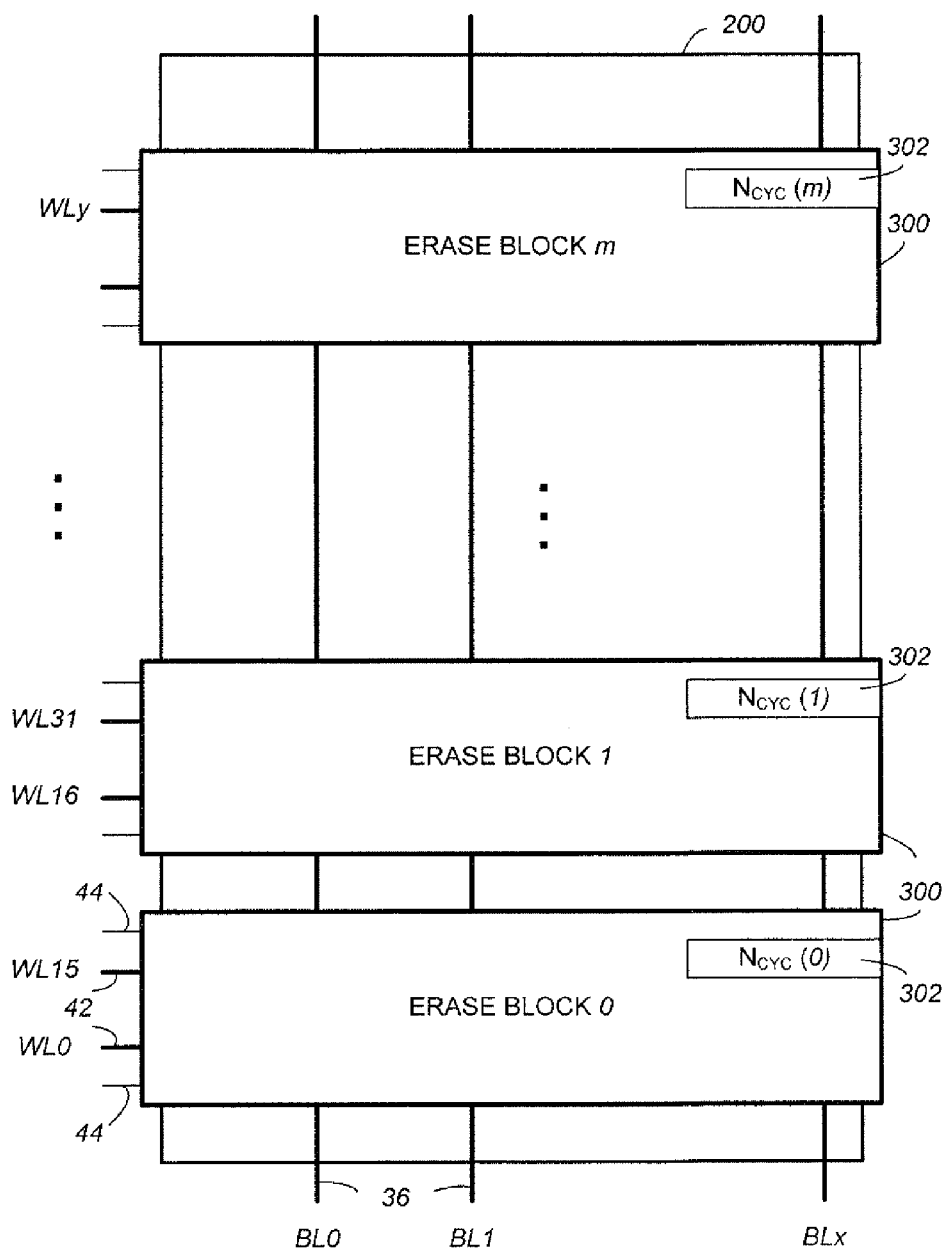
FIG. 18 illustrates a memory organized into erase blocks.

FIG. 18 illustrates a memory organized into erase blocks. As described in connection with FIG. 6 earlier, each erase block is a group of memory cells that are erased together. Also described earlier is when a cell is repeatedly programmed and erased, charges are shuttled in and out of the floating gate 20 (see FIG. 2) by tunneling across a dielectric. Each time some charges may become trapped in the dielectric and will modify the threshold of the cell. The number of program-erase cycles a cell has experienced is measured by a cycle count $N_{CYC}$ (also known as "hot count"). Though repeated cycling, the value of $N_{CYC}$ increases for a given erase block, and the threshold window for the cells in the block narrows progressively. FIG. 18 illustrates a preferred embodiment in which a hot count $N_{CYC}(m)$ 302 is maintained in each erase block (m). Since the programmable unit is a page, the hot count for each block can be store in the system data area of the data page 70' illustrated in FIG. 9. Alternatively, the hot counts may be stored in a master list in the memory. Every time a block is erased, its hot count is incremented by one.

Figure 19:
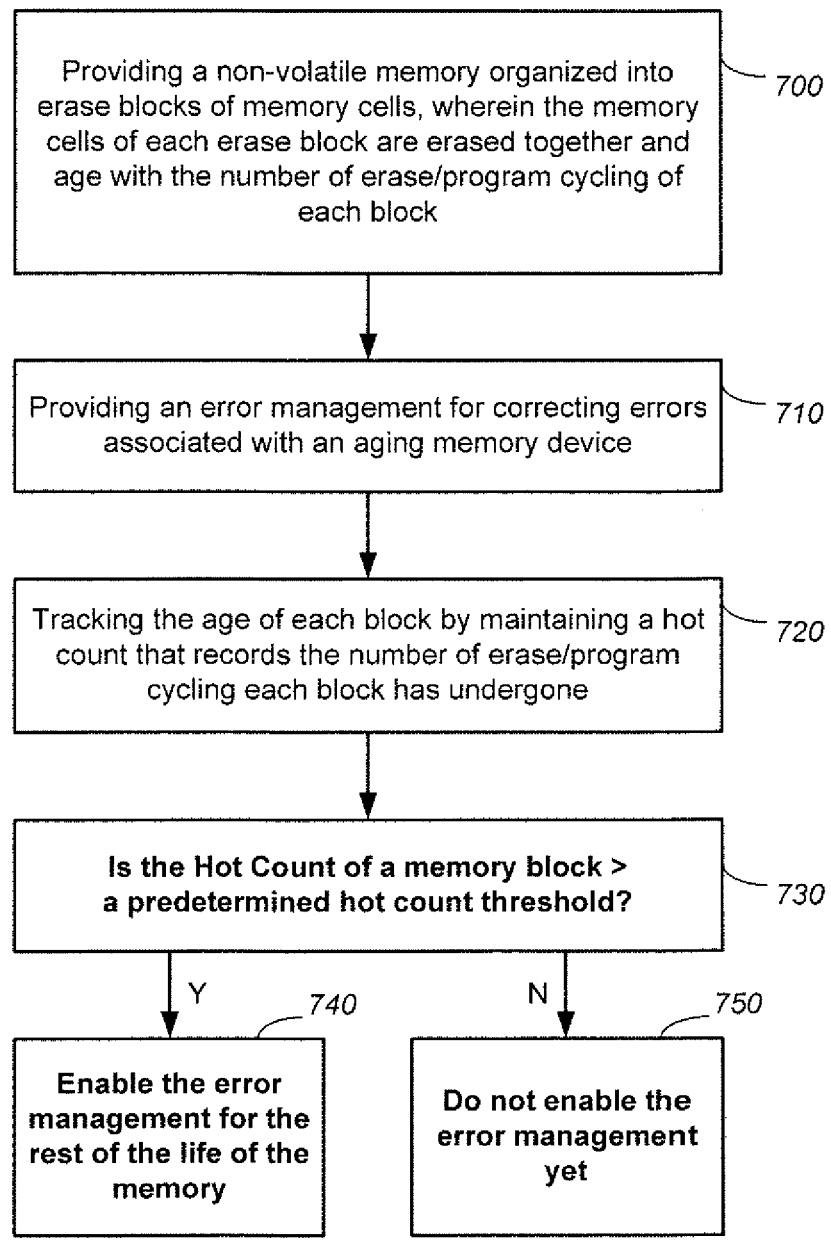
FIG. 19 is a flow diagram illustrating the error management being enabled when the memory device has aged to a predetermined degree as determined by a hot count.

FIG. 19 is a flow diagram illustrating the error management being enabled when the memory device has aged to a predetermined degree as determined by a hot count.

STEP 700: Providing a non-volatile memory organized into erase blocks of memory cells, wherein the memory cells of each erase block are erased together and age with the number of erase/program cycling of each block.

STEP 710: Providing an error management for correcting errors associated with an aging memory device. In the preferred embodiment, the error management is the post-write-read error management described earlier.

STEP 720: Tracking the age of each block by maintaining a hot count that records the number of erase/program cycling each block has undergone.

STEP 730: Is the Hot Count of a memory block>a predetermined hot count threshold? In the preferred embodiment, the predetermined hot count threshold is given by a parameter Hot_count_threshold_EPWR in a file system configuration file stored in the memory (see FIG. 21.) If greater than, go to STEP 740, otherwise go to STEP 750.

STEP 740: Enable the error management for the rest of the life of the memory.

STEP 750: Do not enable the error management yet.

In a preferred embodiment of yet another aspect of the invention, the high density storage portion of the memory (D3) has each memory storing 3 bits of data. The less error-prone, low density storage portion of the memory (D1) has each memory cell storing 1 bit of data. Input data is first staged in D1 and subsequently folded into D3. When the enhanced post-write-read error management is enabled, a current, filled block in D3 is read back; and if the error rate exceeds a predetermined threshold, the current D3 block is rejected and a retry takes place with data being refolded into a new D3 block. The new D3 block is again read back and checked for excessive error rate. If the new D3 block passes, then it has good data and the original data in D1 is made obsolete. If the new D3 block again shows excessive error rate, the new D3 block is again discarded. If the excessive error rate persists after a predetermined number of retries, no further retry is attempted and the D1 to D3 folding operation is abandoned with the original data kept at D1. At this point the memory device is deemed too old for further programming operations and is made read-only to preserve the integrity of the existing data stored in the memory device.

Figure 20A:
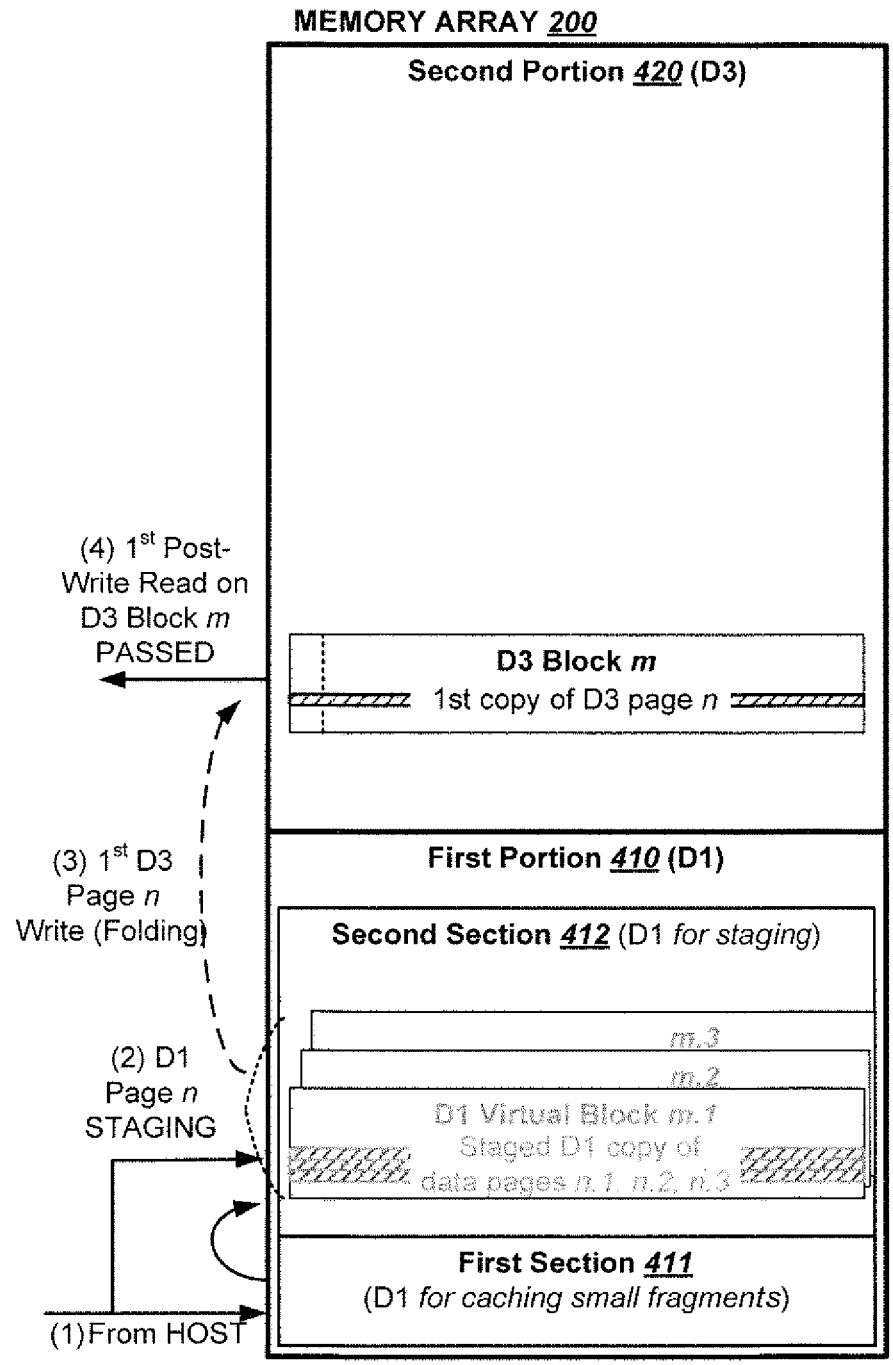
FIG. 20A illustrates a memory array being partitioned into two portions according to a preferred embodiment of the invention.
Figure 20B:
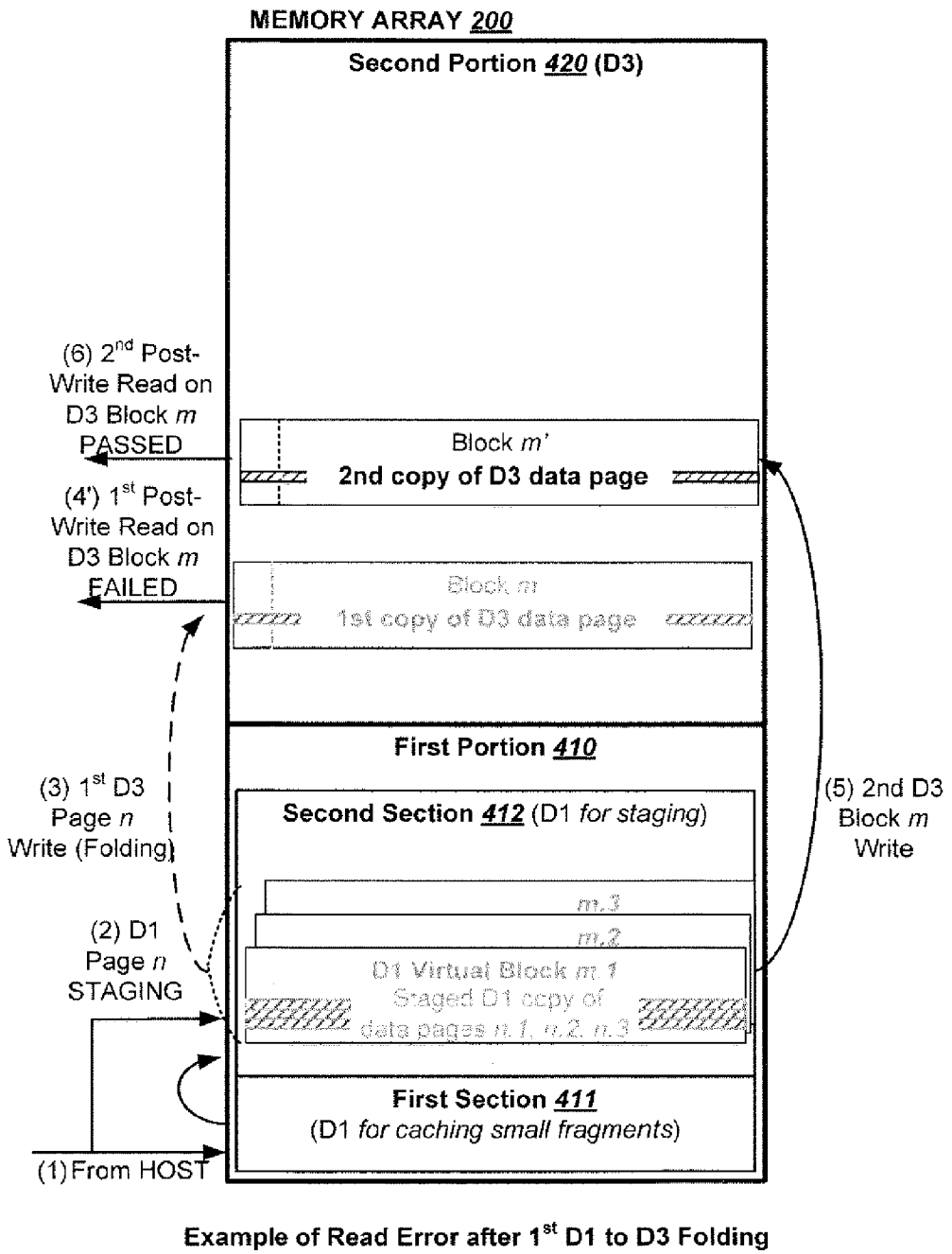
FIG. 20B illustrates another example in which the D3 block of FIG. 20A fails a post-write-read test.
Figure 20C:
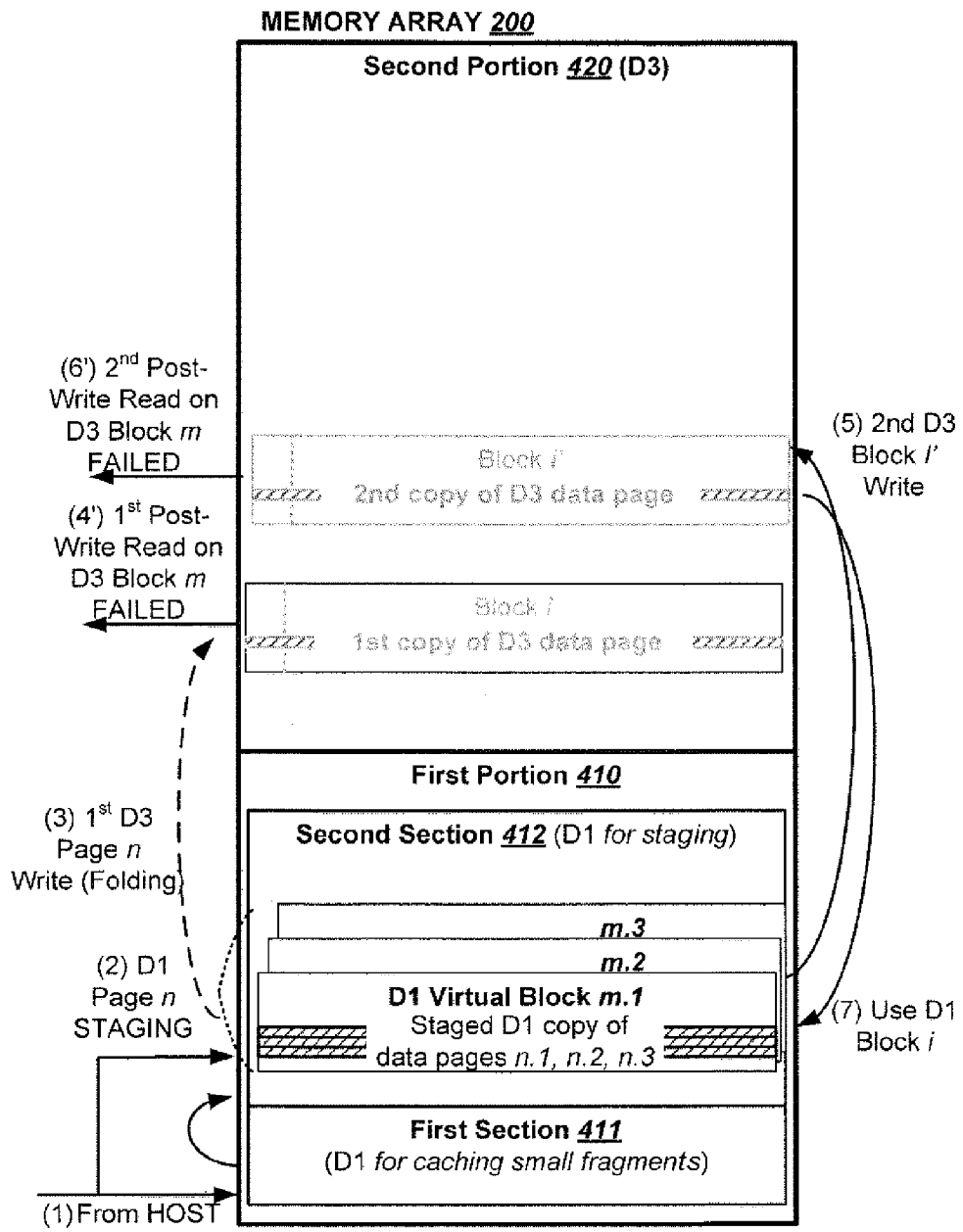
FIG. 20C illustrates another example in which the new D3 block of FIG. 20B fails the post-write read test again.

FIGS. 20A-20C illustrate various examples of implementing the post-write-read error management in a memory configured with D1 and D3 portions. A memory configured with D1 and D3 portion is also disclosed in U.S. application Ser. No. 12/642,584, entitled "MAINTAINING UPDATES OF MULTI-LEVEL NON-VOLATILE MEMORY IN BINARY NON-VOLATILE MEMORY" by Gorobets et al, filed on Dec. 18, 2009; the entire disclosure of which is incorporated herein by reference.

FIG. 20A illustrates a memory array being partitioned into two portions according to a preferred embodiment of the invention. The array of memory cells 200 (see FIG. 1) is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. For example, a memory cell in the first portion is configured to store 1 bit of data as compared to 3 bits of data in the second portion. The first portion storing 1 bit of data per cell will also be referred as D1 and the second portion storing 3 bit of data per cell as D3. In view of the discussion earlier, the first portion will operate with a much wider margin of error compared to that of the second portion. Thus, memory operations in the first portion will have less error than that in the second portion.

In one embodiment, the first portion 410 or D1 is further partitioned into a first section 411 and a second section 412.

In Step (1), during a host write, input data is either first cached in the first section 411 or written directly to the second section 412. If the input data is fragmented, it is first cached in the first section. If the input data is a substantial run of sequential data, it is written page by page directly into the second section 412.

In Step (2), in any case, the input data eventually ends up in the second section 412 where the written pages are staged into virtual D1 blocks, such as blocks m.1, m.2 and m.3. In a scheme where each block contains data from a well-defined group of logical addresses, a virtual block may not correspond to a physical block but still have the group of logical addresses distributed over several physical D1 blocks.

In Step (3), as data is being written page by page into D1, when a triplet of binary pages is in D1, it can be copied to a single 3-bit page in D3 in what is also referred to as folding from D1 to D3.

By implementing the enhanced post-write-read error management ("EPWR"), at some point which the lifetime of the memory the post-write-read error management will commence.

In Step (4), a D3 block m is complete after the entire pages of the virtual D1 blocks m.1, m.2 and m.3 have been folded into it. Thereafter it can be processed by the EPWR where the data in the D3 block is read back and checked for ECC errors. If the number of ECC errors is less than a predetermined threshold as such given by a parameter E_pw_check set in the File system configuration file, then the data in the D3 block is deemed valid. The corresponding D1 pages can then be safely replaced and retired.

FIG. 20B illustrates another example in which the D3 block of FIG. 20A fails a post-write-read test. Step (1) to Step (3) are the same as that of FIG. 20A.

In Step (4'), when the data in the D3 block is read back, the number of ECC error is found to be greater than E_pw_check. This means the data in D3 is marginal at best and cannot be used.

In Step (5), in the event of the existing D3 block failing the post-write-read test, the EPWR prescribes a retry by folding the data into a new D3 block.

In Step (6), the data in the new D3 block is subjected to another post-write-read test. If it passes the test, the data in the new D3 block is deemed valid. The corresponding D1 pages can then be safely replaced and retired.

FIG. 20C illustrates another example in which the new D3 block of FIG. 20B fails the post-write read test again. Step (1) to Step (5) are the same as that of FIG. 20B.

In Step (6'), when the data in the new D3 block is read back, the number of ECC errors is found to be greater than E_pw_check. This means the data in the retried D3 block is still not good and cannot be used.

The EPWR process can prescribe further retry to another D3 block. The number of retries is set by a parameter, EPWR_retries in the file system configuration file. For example, if EPWR_retries is 1, then the process will end after the new block fails the test.

In that event, in Step (7), the new D3 block cannot be used and the file system will direct access to corresponding data that reside in D1 instead.

FIG. 21 is a table illustrating example parameters associated with the enhanced post-write-read error management. The table is preferably maintained in the file system configuration file stored in memory.

E_pw_check—a variable set in File System Configuration File to specify at what # of ECC bits level, a D3 block is consider high risk and restart of D1 to D3 folding to a new D3 block is required.

ECC_threshold_SLC—a variable is needed in File System Configuration File for maintaining SLC threshold to compare against in order to make a decision to continue with EPWR or not.

EPWR_enable_flag—controlled in File System Configuration File. 0=not set (Default); 1=set when EPWR is enabled.

Hot_count_enable_flag—0=not enabled; 1=enabled.

Hot_count_threshold_EPWR—a variable set in File System Configuration File to specify at what hot count level, EPWR is needed. If hot count of all D3 blocks is <hot count threshold, even EPWR enable flag is on, EPWR process is not triggered.

EPWR_verify_page_budget—a variable set in File System Configuration File to specify how many pages can be read during 1 phase of EPWR.

EPWR_retries—a variable in File System Configuration File to limit number of retry attempts.

D3_Block_max_retries—a variable in File System Configuration File to limit the total number of retry attempts on a D3 block over lifetime.

Figure 22A:
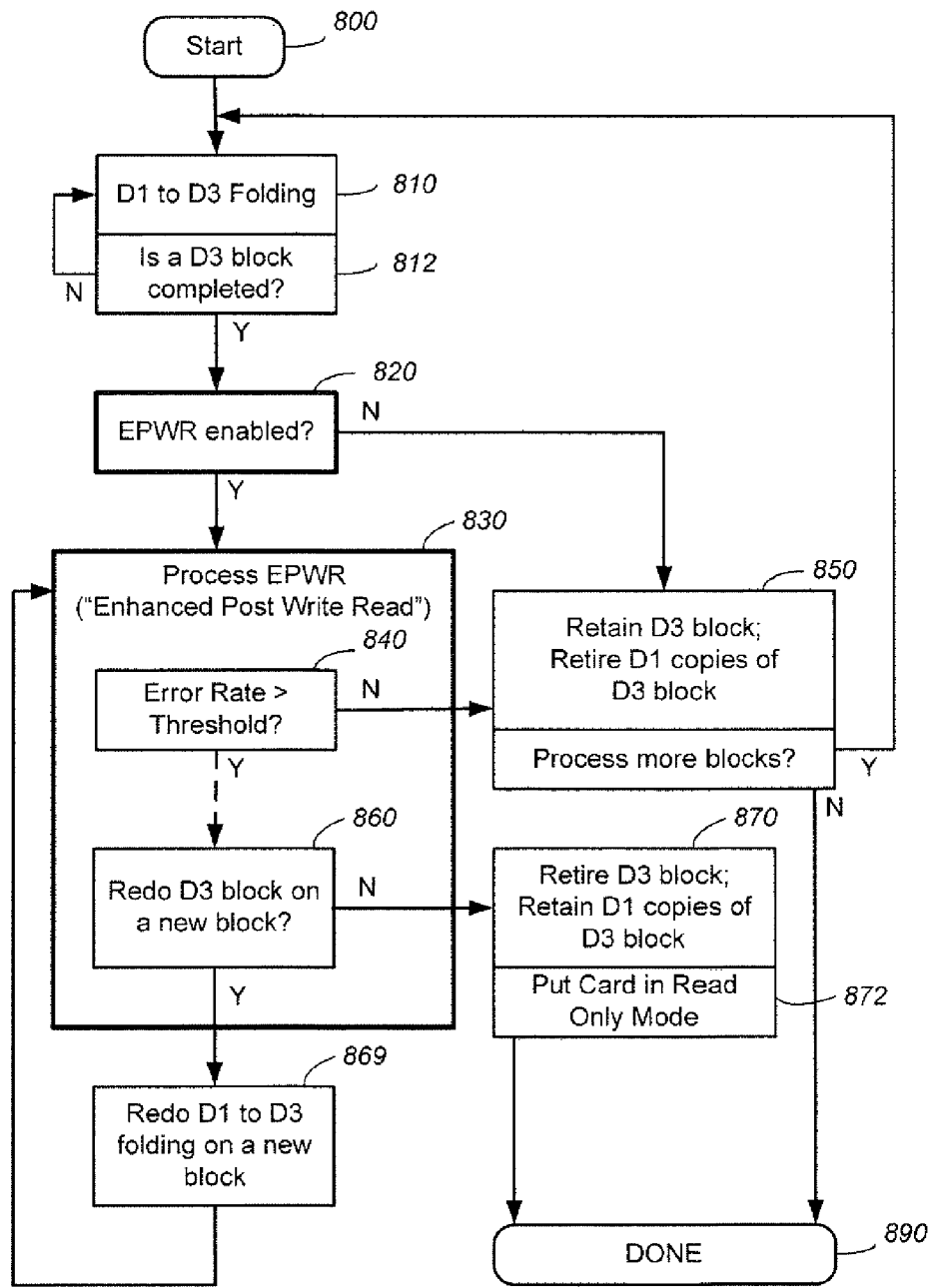
FIG. 22A is a flow diagram illustrating a preferred implementation of the EPWR error management as applied to a memory having D1 to D3 folding.

FIG. 22A is a flow diagram illustrating a preferred implementation of the EPWR error management as applied to a memory having D1 to D3 folding.

STEP 800: Start.

STEP 810: D1 to D3 Folding in which data from three binary data pages of D1 is programmed into one tertiary page of D3 as described in connection with FIG. 20A.

STEP 812: Is a D3 block completely filled? If completely filled, proceed to STEP 820, otherwise return to STEP 810.

STEP 820: Is enhanced post-write-read error management ("EPWR") enabled? More details of a device-age-dependent enablement is given in FIG. 22B. If EPWR is enabled, process EPWR in STEP 830. If not, the integrity of the D3 block written is unknown, but optimistically assumed to be good. Proceed to STEP 850.

STEP 830: Process EPWR. A more detailed implementation of EPWR is given in FIG. 22C.

STEP 840: At a higher level, essentially, the EPWR performs a post-write-read of the D3 block and test of the rate of ECC errors. If the errors does not exceed E_pw_check (see FIG. 21), the D3 block is good. Proceed to STEP 850. Otherwise, the data in the D3 block cannot be used and a retry of folding the D1 data to a new D3 block is considered. Proceed to STEP 860.

STEP 850: The D3 block is deemed good so the original copy of data in D1 can be made obsolete and retired.

STEP 860: Decide whether to retry on a new D3 block based on a number considerations detailed in FIG. 22C. If not permitted to retry, proceed to STEP 870. Otherwise proceed to STEP 862 (shown in FIG. 22C).

STEP 862: The D1 to D3 folding is repeated on a new D3 block. Return to process another block.

STEP 870: The data in the D3 block is deemed bad, so data must be accessed from original copy in D1.

STEP 872: Since this step is reached after a number of unsuccessful retries in attempting to rewrite the D3 block, the memory is deemed near end of it its life. It is put into a read-only state to prevent any data corruption due to programming operations. Proceed to STEP 890.

STEP 890: Done.

Figure 22B:
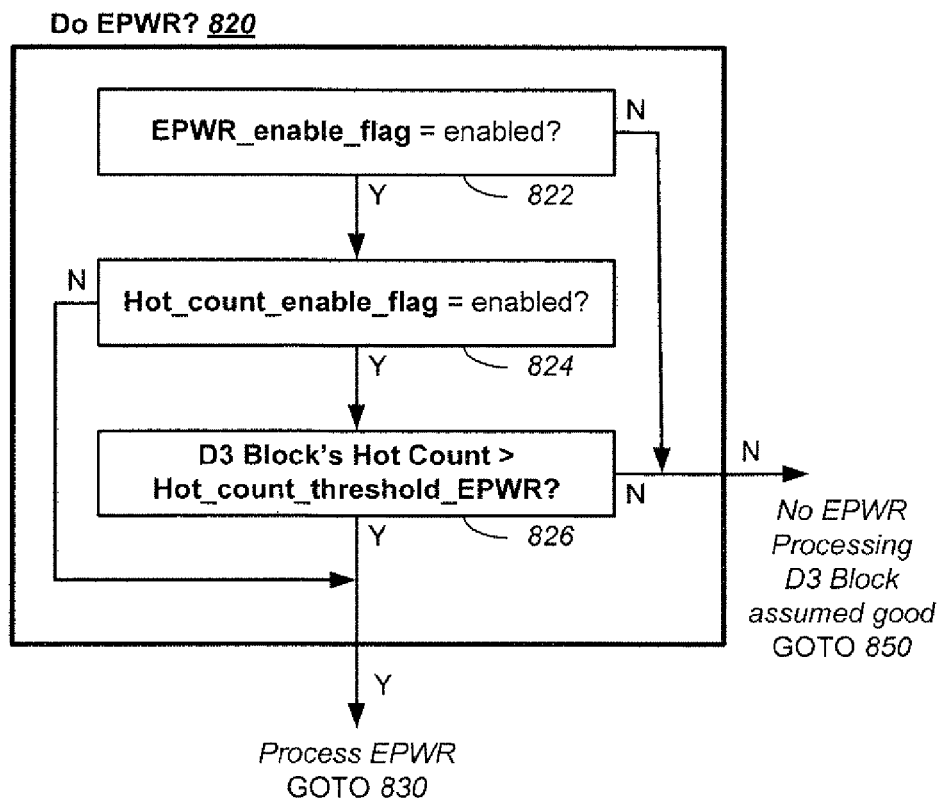
FIG. 22B illustrates in more detail the device-age-dependent enablement feature of the enhanced post-write-read error management.

FIG. 22B illustrates in more detail the device-age-dependent enablement feature of the enhanced post-write-read error management. The STEP 820 in FIG. 22A is shown in FIG. 22B to further include the following:

STEP 822: Check if the EPWR_enable_flag (see FIG. 21) is enabled. If not enabled, EPWR is not been implemented at all. Proceed by default to STEP 850 where the D3 block is deemed good. If enabled, proceed to STEP 824 to control if EPWR should commence after some aging of the memory device.

STEP 824: Check if the Hot_count_enable_flag (see FIG. 21) is enabled. If not enabled, EPWR is implemented from the beginning of life of the memory device. Proceed directly to STEP 830 to process EPWR. If the flag is enabled, proceed to STEP 826 which controls when EPWR should commence.

STEP 826: Check if any one of the D3 blocks has a hot count that exceeds the value in Hot_count-threshold_EPWR. If not exceeded the memory device is still young and not prone to excessive errors, proceed to STEP 850 and EPWR is essentially on hold. If the hot count has exceeded the threshold, the memory device has attained an age when errors becomes significant and will benefit from the EPWR process. Proceed to STEP 830 to process EPWR.

Figure 22C:
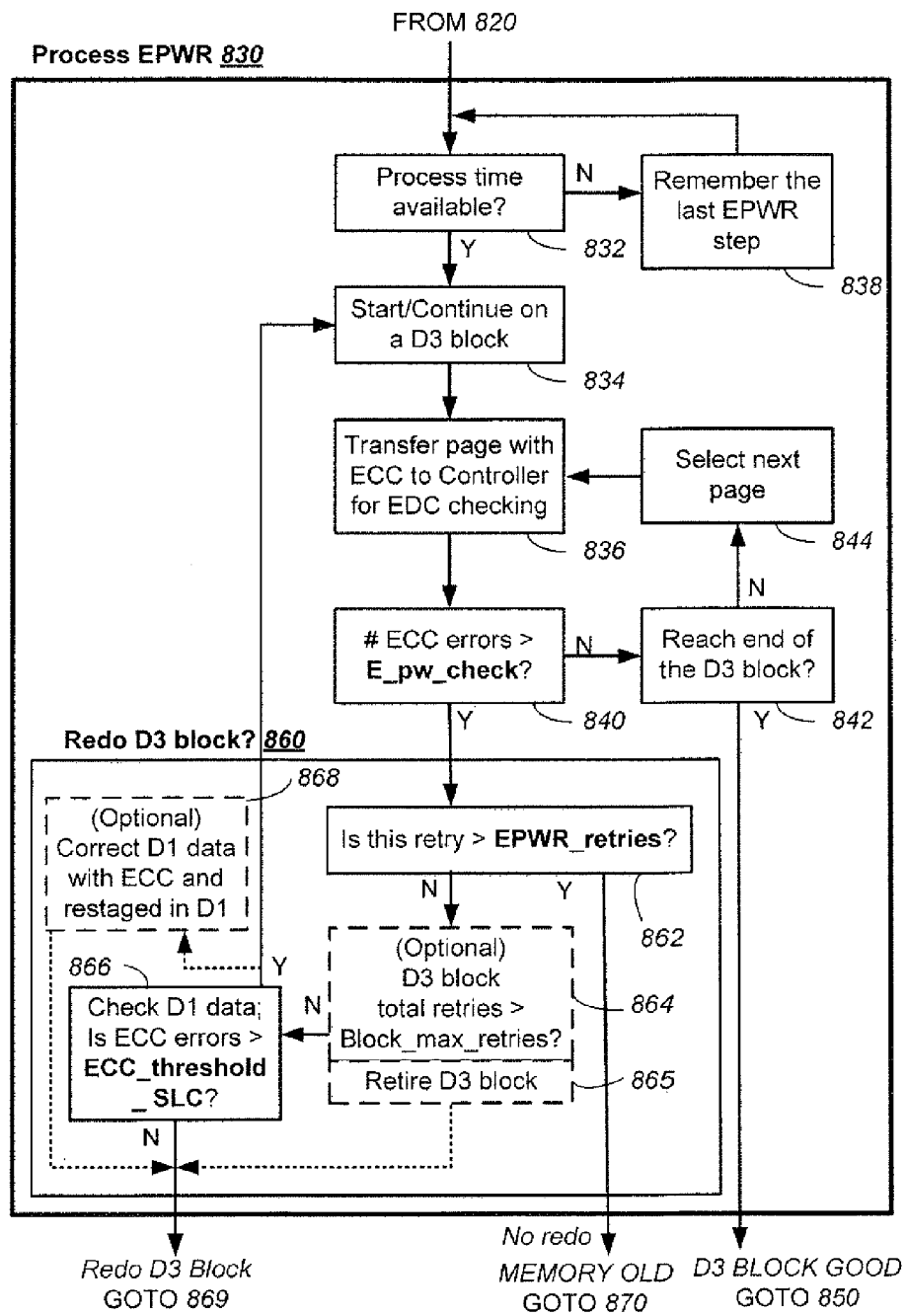
FIG. 22C illustrates in more detail a preferred implementation of the enhanced post-write-read error management.

FIG. 22C illustrates in more detail a preferred implementation of the enhanced post-write-read error management. The STEP 830 in FIG. 22A is shown in FIG. 22C to further include the following:

STEP 832: Check if there is process time available for doing post-write-read of the D3 block and possible retries. The available time is preferably taken from unused time during the execution of a host command in the foreground. If necessary the process can be broken down to smaller chunks so as to better utilize the spare time during each host command. If there is available time to start the process, proceed to STEP 834, otherwise, proceed to STEP 838.

STEP 834: Start the process or if the process has already been started but interrupted in the interim, continue the process.

STEP 836: Read and transfer a page of data from D3 out to the controller for checking EDC (error detection code). Proceed to STEP 838.

STEP 840: The EPWR performs a post-write-read of the D3 block and test of the rate of ECC errors. If the errors does not exceed E_pw_check (see FIG. 21), the page being tested is in D3 is good. Proceed to STEP 842. If a page is tested to be bad, the data in the D3 block cannot be used and a retry of folding the D1 data to a new D3 block is considered. Proceed to STEP 864.

STEP 842: Has all the pages in the D3 block been tested? If not, proceed to STEP 844 to process the next page. If the whole block is tested to be good, proceed to STEP 850.

STEP 844: Select the next page in the D3 block. Return to STEP 836.

STEP 862: Before a retry is attempted, check if the number of retries has already exceeded a set limit, EPWR_retries (see FIG. 21.) If not, a retry is attempted by proceeding to STEP 866. If the number of retries has exceeded the set limit, the memory device is deemed to be at its end of life and control proceeds to STEP 870.

STEP 866: Another consideration before attempting a retry is to check if the excessive errors are intrinsic to the data in D1 and not due to programming errors from D1 to D3. The D1 data is first checked for excessive ECC errors. If the number of error exceeded a predetermined threshold, such as, ECC_threshold_SLC (see FIG. 21), there is no point in a retry. Return to STEP 834 to process another D3 block.

However, if an optional feature as described below is implemented, proceed to an optional STEP 868 instead. On the other hand if the D1 data is good, proceed to attempt retry of another D3 block in STEP 869. In another embodiment, STEP 866 is performed before STEP 862.

FIG. 22C also illustrates optional features as indicated by boxes with broken lines. One option is illustrated by STEPs 864 and 865 to check if a block has been subjected too many retries over its lifetime. If so, the physical integrity of the block may be in question and it is best to retire the block so that it is not used again. When this option is implemented, the flow from a NO in STEP 862 will be routed to STEP 864.

STEP 864: Has the D3 block experience retries more than a threshold as defined by the parameter Block_max-retires (see FIG. 21). If so, proceed to STEP 865 to retire the block, otherwise proceed to STEP 866 for further rewrite decision.

STEP 865: The D3 block has be subjected to too many retries over its lifetime to be deemed robust. It is retired and taken out of circulation. Control then proceed directly to STEP 869 to rewrite the D3 block.

The other option is that in the event the D1 data is not very good, it is first corrected by ECC and restaged in D1 before being folded to D1 When this option is implemented, the flow from a YES in STEP 866 will be routed to STEP 868 instead of STEP 834.

STEP 868: The problematic D1 data is corrected by ECC and restaged in D1. Proceed to STEP 869.

Accelerated Post-Write Read

Previous sections have described the techniques of actually reading the data back after they have been written (also referred to as "programmed"). This technique is called "PWR" (Post Write Read). According to one aspect of the invention described earlier, the PWR technique is enhanced and is referred to as "EPWR" (Enhanced Post Write Read). In this case, the PWR operation is only turned on when needed. For example, PWR is initiated only after the memory begins to develop more errors through use. This will alleviate some of the overheads associate with PWR.

According to another aspect of the invention, instead of post-write reading every memory cells to check what have been written, which could consume a lot of time and system resources, the post-write read is only performed on a small sample of memory cells representing a population of memory cells with a similar error rate. When the post-write read of the sample yields an error rate within a predetermined value, the population is assumed to pass the check. Otherwise, the data previously written on the population of cells are deemed to have too much error and are either rewritten again to a different location in the same area or to another area of the memory with intrinsic lower error rate.

As explained earlier, post-write read checking is different from the usual program verify that is part of programming operation. In programming a cell, it is subjected to pulse by pulse programming voltages. In between each pulse the cell's programmed threshold is compared to a reference read threshold. Once the cell's threshold is detected to be programmed passed the reference read threshold, the cell is locked out from further programming by a program inhibiting voltage applied to its bit line. Thus, program-verify only guarantee if the cell has been programmed pass a reference threshold but gives no indication of any over programming that may have occurred. A read operation for MLC memory actually checks if the programmed threshold is between a pair of reference thresholds.

In MLC memory each cell stores more than one bit of data. For example in D2 memory, each cell stores two bits of data. The threshold window supported by the cells is partitioned by a reference threshold into two halves. When the programmed threshold of a cell lies in a first half, it has one bit value, e.g., '1' and when in a second half, it has the other bit value, e.g., '0'. Similarly, in D3 memory, each cell stores three bits of data and in D4 memory, each cell stores four bits of data. In general, for a Dm memory, each cell stores m bits and the threshold window is partitioned into $2^m$ voltage bands by $2^m-1$ reference thresholds. A coding scheme is used to assign each of the voltage bands with an m-bit code word.

Exemplary Preferred "LM" Coding for a 2-Bit or 4-State Memory

Figure 23:
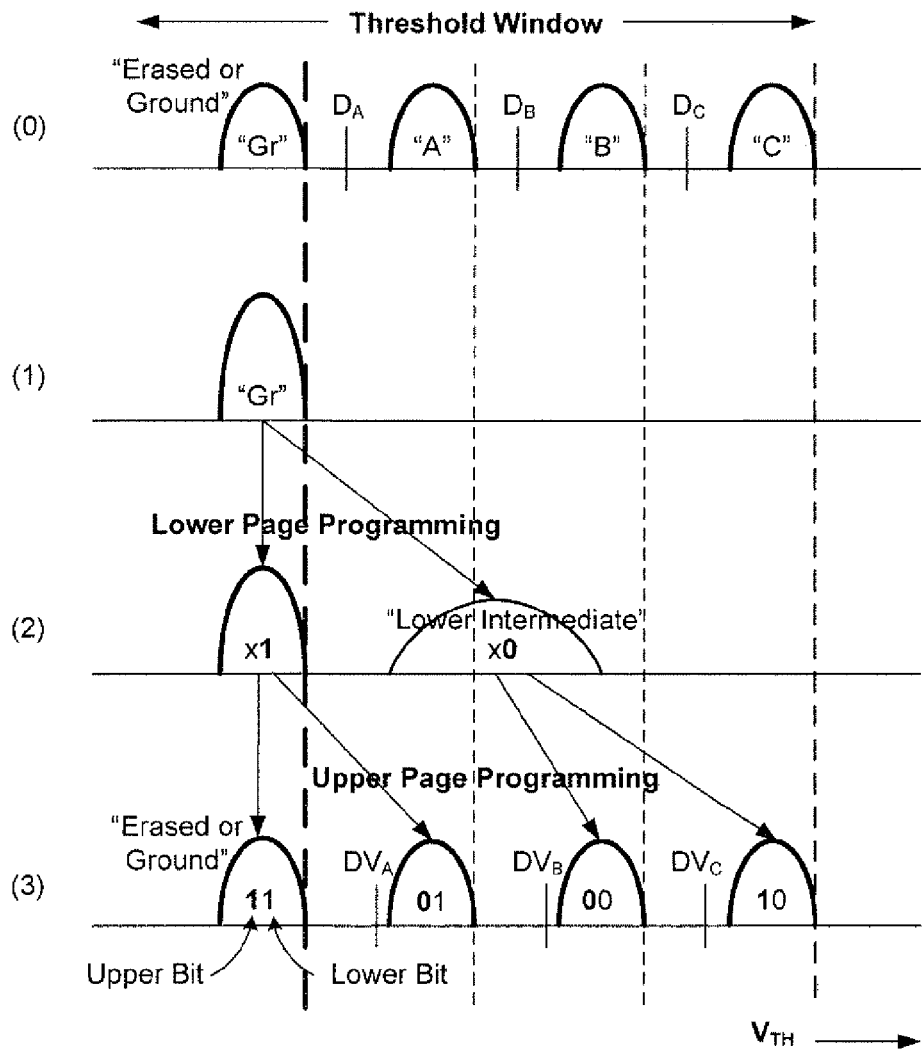
FIGS. 23(0)-23(3) illustrate a logical page by page programming of a 4-state memory encoded with a preferred 2-bit logical code ("LM" code).

FIGS. 23(0)-23(3) illustrate a logical page by page programming of a 4-state memory encoded with a preferred 2-bit logical code ("LM" code). The 2 code bits from each memory cell of a page form two logical pages with each page formed from one code bits contributed from every memory cells of the page. Programming can be performed logical-page by logical page with the lower page followed by the upper page. This code provides fault-tolerance and alleviates the BL-BL floating-gate coupling (Yupin) Effect.

FIG. 23(0) illustrates the threshold voltage distributions of a 4-state memory array. The possible threshold voltages of each memory cell span a threshold window which is partitioned into four regions to demarcate four possible memory states, "Gr", "A", "B" and "C". "Gr" is a ground state, which is an erased state within a tightened distribution and "A", "B" and "C" are three progressively programmed states. During read, the four states are demarcated by three demarcation reference thresholds, $D_A$, $D_B$ and $D_C$.

FIG. 23(3) illustrates a preferred, 2-bit LM coding to represent the four possible memory states. Each of the memory states (viz., "Gr", "A", "B" and "C") is represented by a pair of "upper, lower" code bits, namely "11", "01", "00" and "10" respectively. The LM coding differs from the conventional Gray code in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges. As will be seen in FIGS. 23(2) and 23(3), each programming operation results in moderate change of the charges in the charge storage unit as evident from the moderate change in the threshold voltages $V_T$.

The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

FIGS. 23(1) and 23(2) illustrate the lower page programming using the 2-bit LM code. The fault-tolerant LM code is designed to avoid any subsequent upper page programming to transit through any intermediate states. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a well-defined range of threshold values. The "lower intermediate" states may have a broad distribution of threshold voltages that straddle between memory states "A" and "B". During programming, the "lower intermediate" state is verified relative to a coarse demarcation such as $D_A$.

FIGS. 23(2) and 23(3) illustrate the upper page programming using the 2-bit LM code. The upper page programming is performed on the basis of the first round, lower page programming. A given upper bit can represent different memory states depending on the value of the lower bit. In the second round of programming, if a cell is to have the upper bit as "1" while the lower bit is at "1", i.e. (1,1), there is no programming for that cell and it remains in "Gr". If the upper bit is "0" while the lower bit is at "1", i.e., (0,1), the cell is programmed from the "Gr" state to the "A" state. During programming to "A", the verifying is relative to the demarcation $DV_A$. On the other hand, if the cell is to have the upper bit as "0" while the lower bit is at "0", i.e., (0,0), the cell is programmed from the "lower intermediate" state to "B". The program verifying is relative to a demarcation $DV_B$. Similarly, if the cell is to have the upper bit as "1" while the lower page is at "0", i.e., (1,0), the cell will be programmed from the "lower intermediate"

state to "C". The program verifying is relative to a demarcation $DV_C$. Since the upper page programming only involves programming to the next adjacent memory state from either the "Gr" state or the "lower intermediate" state, no large amount of charges is altered from one round to another. Also, the lower page programming from "Gr" to a rough "lower intermediate" state is designed to save time.

Figure 24A:
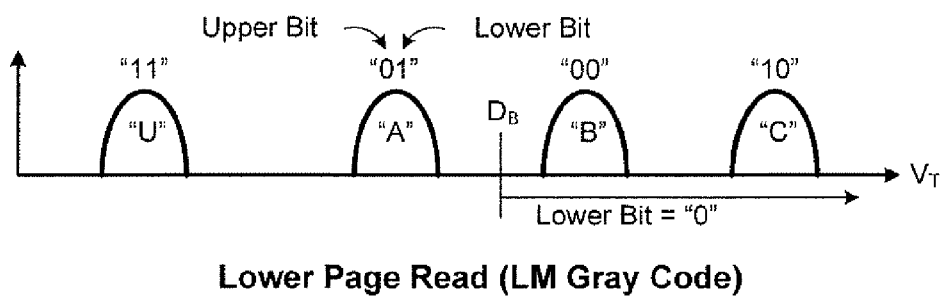
FIG. 24A illustrates the read operation that is required to discern the lower bit of the 4-state memory encoded with the 2-bit LM code.

FIG. 24A illustrates the read operation that is required to discern the lower bit of the 4-state memory encoded with the 2-bit LM code. The decoding will depend on whether the upper page has been programmed or not. If the upper page has been programmed, reading the lower page will require one read pass of readB relative to the demarcation threshold voltage $D_B$. On the other hand, if the upper page has not yet been programmed, the lower page would be programmed to the "intermediate" state (see FIG. 23(2)), and readB would cause error. Rather, reading the lower page will require one read pass of readA relative to the demarcation threshold voltage $D_A$. In order to distinguish the two cases, a flag ("LM" flag) is written in the upper page (usually in an overhead or system area) when the upper page is being programmed. During a read, it will first assume that the upper page has been programmed and therefore a readB operation will be performed. If the LM flag is read, then the assumption is correct and the read operation is done. On the other hand, if the first read did not yield a flag, it will indicate that the upper page has not been programmed and therefore the lower page would have to be read by a readA operation.

Figure 24B:
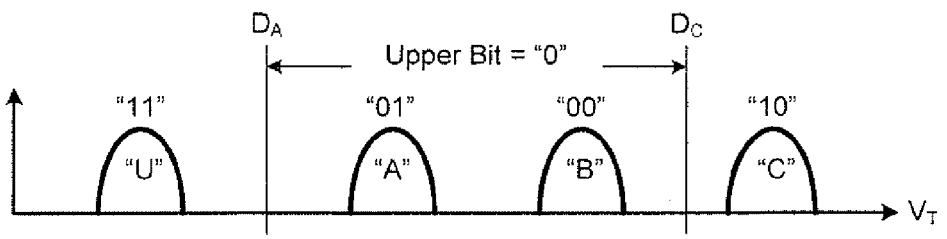
FIG. 24B illustrates the read operation that is required to discern the upper bit of the 4-state memory encoded with the 2-bit LM code.

FIG. 24B illustrates the read operation that is required to discern the upper bit of the 4-state memory encoded with the 2-bit LM code. As is clear from the figure, the upper page read will require a 2-pass read of readA and readC, respectively relative to the demarcation threshold voltages $D_A$ and $D_C$. Similarly, the decoding of upper page can also be confused by the "intermediate" state if the upper page is not yet programmed. Once again the LM flag will indicate whether the upper page has been programmed or not. If the upper page is not programmed, the read data will be reset to "1" indicating the upper page data is not programmed.

If the read is to scan through all sequence of the demarcated states as in a "full-sequence" read or "all-bit" read, the read is performed relative to the memory states "Gr", "A", "B" and "C" demarcated respectively by reference threshold voltages $D_A$, $D_B$ and $D_C$. As all possible states are differentiated by the full-sequence read, there is no need to check for any LM flag. In this mode of read, all bits are determined together.

Exemplary Preferred "LM" Coding for a 3-Bit or 8-State Memory

The example for the 2-bit LM code can be similarly extended to 3-bit or high number of bits.

Figure 25:
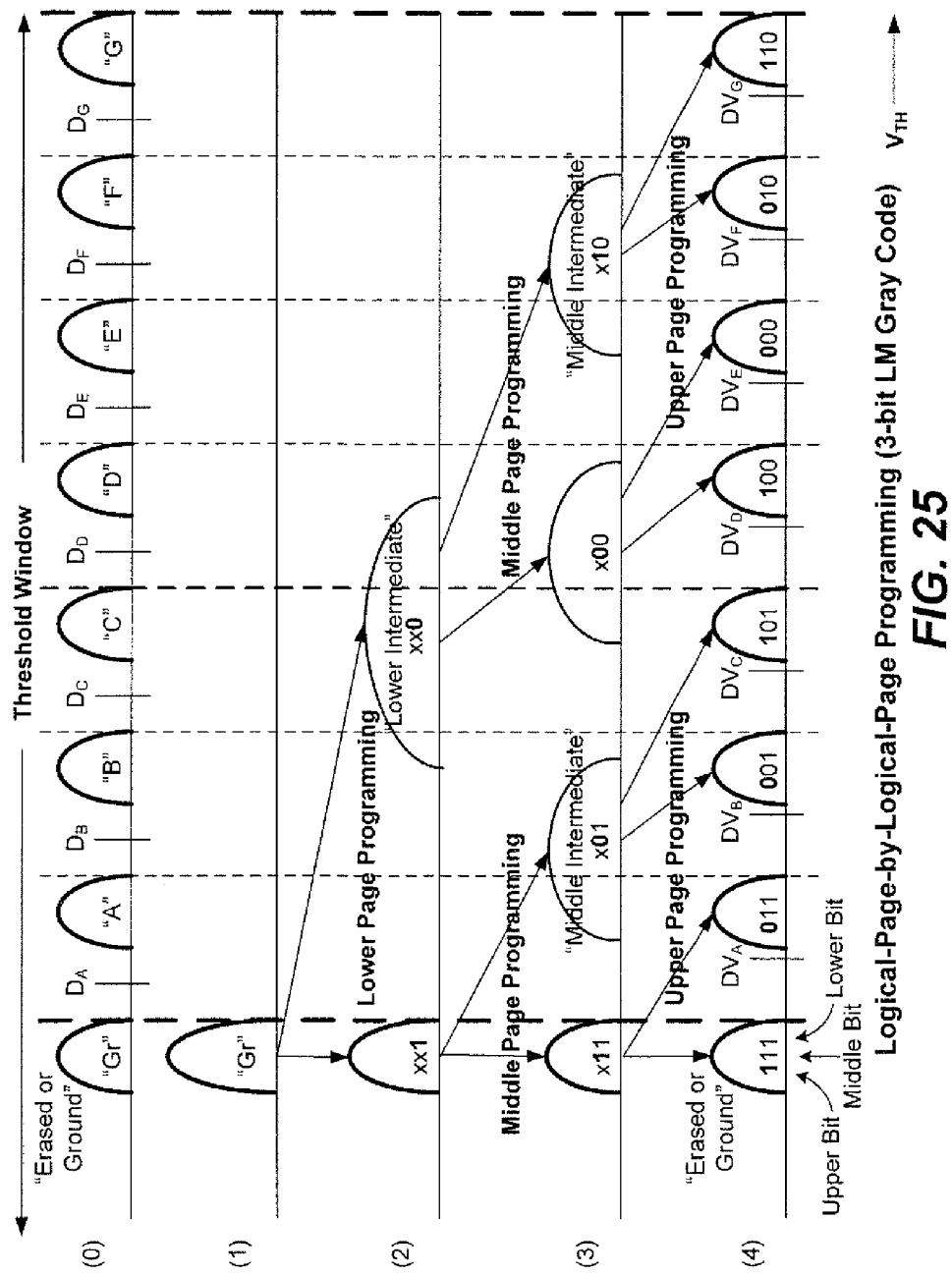
FIGS. 25(0)-25(4) illustrate the programming of an 8-state memory encoded with a preferred 3-bit logical code ("LM" code).

FIGS. 25(0)-25(4) illustrate the programming of an 8-state memory encoded with a preferred 3-bit logical code ("LM" code). The 3 bits from each memory cell of a page forms three logical pages and programming can be performed logical-page by logical page. This code is similar to the 2-bit LM coding described earlier and is an extension into 3 bits to encode eight possible memory states. FIG. 25(0) illustrates the threshold voltage distributions of an 8-state memory array. The possible threshold voltages of each memory cell spans a threshold window which is partitioned into eight regions to demarcate eight possible memory states, "Gr", "A", "B", "C", "D", "E", "F" and "G". "Gr" is a ground state, which is an erased state within a tightened distribution and "A"-"G" are seven progressively programmed states. During read, the eight states are demarcated by seven demarcation reference thresholds, $D_A$-$D_G$.

FIG. 25(4) illustrates a preferred, 3-bit LM coding to represent the eight possible memory states. Each of the eight memory states is represented by a triplet of "upper, middle, lower" bits, namely "111", "011", "001", "101", "100", "000", "010" and "110" respectively. As will be seen in FIGS. 25(1) and 25(4), each programming operation results in moderate change in the charges in the charge storage unit as evident from the moderate change in the threshold voltages $V_T$.

The coding is designed such that the 3 code bits, "lower", "middle" and "upper" bits, may be programmed and read separately. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a narrow range of threshold values. The "lower intermediate" states may have a broad distribution of threshold voltages that straddling between memory states "B" and "D". During programming, the "lower intermediate" state can be verified relative to a coarse demarcation reference threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

In general a page of memory cells is being programmed in parallel, with each memory cell having 3 bits. Thus, the page of memory cells may be regarded as having 3 logical data pages with each logical data page contributed from one code bit of every cells of the page. Thus, a "lower bit" page is formed from the lower bit of every memory cells of the page, a "middle bit" page is formed from the middle bit of every cell and an "upper bit" page is formed from the upper bit of every cell of the page.

FIGS. 25(1) and 25(2) illustrate the lower page programming using the 3-bit LM code. The fault-tolerant LM code is designed to avoid any subsequent higher page programming to transit through any intermediate states. Thus, the first round, lower page programming has a cell remain in the "erased" or "Gr" state if the lower bit is "1", i.e. (x,x,1) or programmed to a "lower intermediate" state if the lower bit is "0", i.e., (x,x,0). Basically, the "Gr" or "ground" state is the "erased" state with a tightened distribution by having the deeply erased states programmed to within a well-defined range of threshold values. The "lower intermediate" states may have a broad distribution of threshold voltages that straddling between memory states "B" and "D". During programming, the "lower intermediate" state is verified relative to a demarcation such as $D_B$.

FIGS. 25(2) and 25(3) illustrate the middle page programming using the 3-bit LM code. The middle page programming is performed on the basis of the first round, lower page programming. A given middle bit can represent different memory states depending on the lower bit. In the second round of programming, if a cell is to have the middle bit as "1" while the lower bit is at "1", i.e. (x,1,1), there is no programming for that cell and it remains in "Gr". If the middle bit is "0" while the lower bit is at "1", i.e., (x,0,1), the cell is programmed from the "Gr" state to a first "middle intermediate" state straddling between "A" and "B". During programming to the first "middle intermediate" state, the verifying is relative to the demarcation $DV_A$. On the other hand, if the cell is to have the middle bit as "0" while the lower bit is at "0", i.e., (x,0,0), the cell is programmed from the "lower intermediate" state to a second middle intermediate" state straddling between "C" and "D". The program verifying is relative to a demarcation $DV_C$. Similarly, if the cell is to have the middle bit as "1" while the lower page is at "0", i.e., (x,1,0), the cell will be programmed from the "lower intermediate" state to a third "middle intermediate" state straddling between "E" and "F". The program verifying is relative to a demarcation $DV_E$.

FIGS. 25(3) and 25(4) illustrate the upper page programming using the 3-bit LM code. The upper page programming is performed on the basis of the first and second rounds, namely the lower and middle page programming. A given upper bit can represent different memory states depending on the lower and middle bits. In the third round of programming, if a cell is to have the upper bit as "1" while the lower and middle bits are at "1", i.e. (1,1,1), there is no programming for that cell and it remains in "Gr". On the other hand, if the upper bit is "0" while the lower and middle bits are at "1", i.e. (0,1,1), the cell is programmed from the "Gr" state to the "A" state. During programming to "A", the verifying is relative to the demarcation $DV_A$.

Similarly, if the cell is to have the upper bit as "0" while the lower bit and middle bits are at "0" and "1" respectively, i.e. (0,0,1), the cell is programmed from the first "middle intermediate" state to "B". The program verifying is relative to a demarcation $DV_B$. If the cell is to have the upper bit as "1" while the lower bit and middle bits are at "0" and "1" respectively, i.e. (1,0,1), the cell is programmed from the first "middle intermediate" state to "C". The program verifying is relative to a demarcation $DV_C$.

Similarly, if the cell is to have the upper bit as "1" while the lower bit and middle bits are at "0" and "0" respectively, i.e. (1,0,0), the cell is programmed from the second "middle intermediate" state to "D". The program verifying is relative to a demarcation $DV_D$. If the cell is to have the upper bit as "0" while the lower bit and middle bits are at "0" and "0" respectively, i.e. (0,0,0), the cell is programmed from the second "middle intermediate" state to "E". The program verifying is relative to a demarcation $DV_C$.

Similarly, if the cell is to have the upper bit as "0" while the lower bit and middle bits are at "1" and "0" respectively, i.e. (0,1,0), the cell is programmed from the third "middle intermediate" state to "F". The program verifying is relative to a demarcation $DV_F$. If the cell is to have the upper bit as "1" while the lower bit and middle bits are at "0" and "0" respectively, i.e. (1,1,0), the cell is programmed from the third "middle intermediate" state to "G". The program verifying is relative to a demarcation $DV_G$.

Since the upper page programming only involves programming to the next adjacent memory state from either the "Gr" state or one of the "middle intermediate" states, no large amount of charges is altered from one round to another. This helps to alleviates BL-BL Yupin effect.

Thus, it will be seen that a Dm (m=1, 2, 3, ... ) memory can be programmed a bit at a time and also read a bit at a time. When a group of memory cells on a word line WLn are programmed or read in parallel, there will be m data pages associated with the group, with each data page corresponding to one bit from each cells of the group. In a progressive reading mode, the sensing is relative to a subset of the reference thresholds and at each sensing only one of the m data pages are read from WLn and transferred out to the controller. In a full sequence reading mode, the sensing is relative to all the reference thresholds and all m data pages are read from WLn before being transferred out page by page.

For example, in the case of a memory with the NAND architecture shown in FIG. 4, each NAND string has a daisy chain of n memory cell. In one embodiment, a row of such NAND chains forms an erase block 300 shown in FIG. 6. In FIG. 4, a page of memory cells, such as page 70 on WL3, is operated on in parallel.

FIG. 9 shows a data page 70' being one of the m data pages for an m-bit memory on word line WLn. As described earlier, in another preferred embodiment, when with higher and higher device integration, there are larger than optimal number of memory cells in a page sharing an ECC field, the page 70 is partitioned into smaller units, consisting of "ECC pages".

Figure 26A:
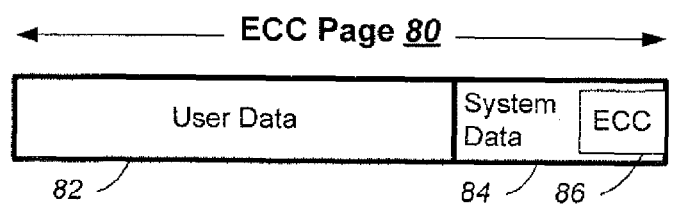
FIG. 26A illustrates schematically an ECC page containing an ECC field similar to that shown in FIG. 9.

FIG. 26A illustrates schematically an ECC page containing an ECC field similar to that shown in FIG. 9. The ECC page 80 comprises a user portion 82 and a system portion 84. The user portion 82 is for storage of user data. The system portion 84 is generally used by the memory system for storage of system data. Included in the system data is an ECC. The ECC is computed for the ECC page. Typically, the ECC is computed by the ECC processor 62 in the controller 102 (see FIG. 1.) The difference between FIG. 26A and FIG. 9 is that instead of the ECC page 80 of occupying the entire data page 70', it is one of several constituting the data page.

Figure 26B:
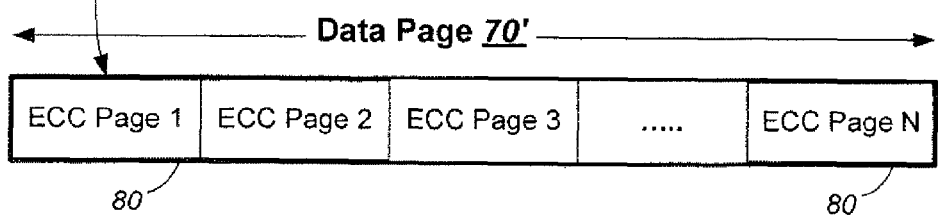
FIG. 26B illustrates a plurality of ECC pages constituting a data page.

FIG. 26B illustrates a plurality of ECC pages constituting a data page. A data page such as the data page 70' shown in FIG. 4 is the set of data constituted from a logical bit from each cell of a page of cells on a WL. In general there are N EEC pages making up a data page. For example, N=4, where there are 4 EEC pages 80 making up one data page 70'.

As data is received from a host, an ECC page of data is staged in the controller 102 and its ECC 86 is computed by the ECC processor 62 (see FIG. 1). A number of ECC pages 80 incorporating their own ECC is then staged and written to the memory array 200 as a data page 70'. Typically, when the data page 70' is read, the data page is latched in the data latches 430 and shifted out of the I/O circuits 440 to the controller 102. At the controller 102, each ECC pages of the data page's has its ECC 86 compared to a second version of the ECC computed on the read data. The ECC typically includes an error detection code ("EDC") for rapid detection of any error in the data page. If the EDC indicates the existence of any error in the read data page, the ECC is invoked to correct erroneous bits in the read data page. The ECC is designed to correct up to a predetermined maximum number of errors. In practice, at any given time in the life of a memory, the ECC may have budget to correct a predetermined number of errors less than the predetermined maximum.

For a 2-bit memory, each cell stores 2 bits of data and there will be 2 data pages associated with each WL in the example in FIG. 4. If each data page has 4 ECC pages, then there will be a total of 8 ECC pages programmed into a WL and to be read out for PWR checking.

Similarly for a 3-bit memory, each cell stores 3 bits of data and there will be 3 data pages associated with each WL in the example in FIG. 4. If each data page has 4 ECC pages, then there will be a total of 12 ECC pages programmed into a WL and to be read out for PWR (post-write read) checking.

Thus, it will be seen for a 3-bit memory that performing a PWR check after writing every WL can involve sensing the 12 ECC pages and then shipping out to the controller for ECC checking. If the ECC decoder finds any one of the 12 ECC pages has exceeded a predetermined error budget, the write to that WL is deemed unacceptable and is retried at a different WL. For example, the write is rewritten to another WL in the same block or in a portion of memory, such as with one-bit cells, having a higher tolerance for errors.

In the 3-bit memory example, there are 3 data page to be sensed. As seen from the description in connection with FIG. 25, this will incur 3 read cycles, one for each data page. Each read cycle will be sensing relative to one or more reference thresholds and therefore reading the WL will take time. Furthermore, each data page has 4 ECC pages and a total of 12 ECC pages will need to be serially transferred out to the controller. The transfer operations will also take time, if not more time than the sensing operations.

PWR Checking on a Sample Instead of the Whole Population

In a general embodiment of the invention, the post-write read (PWR) checking on what has been written is accelerated by checking only a subset of what has been written. The post-write read checking is performed on only a sample of what was written.

Figure 27:
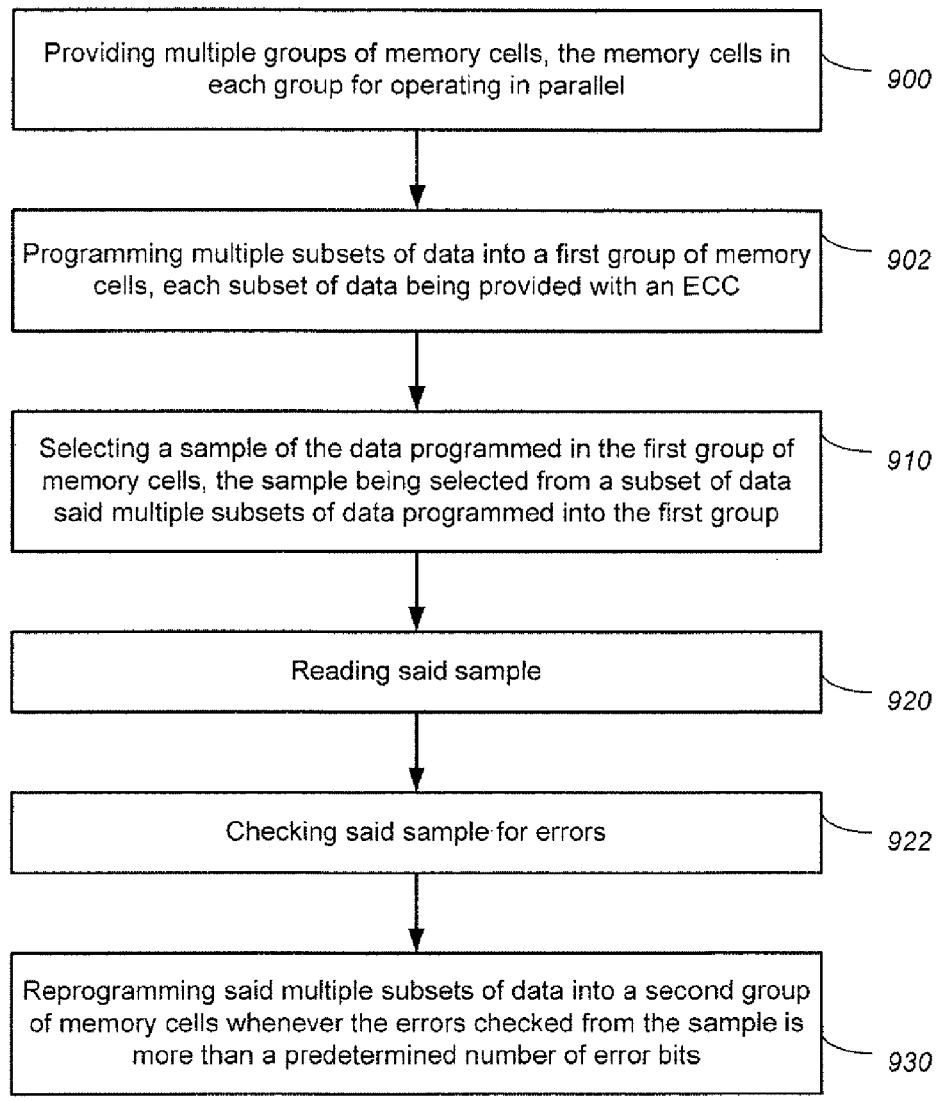
FIG. 27 is a flow chart illustrating the general embodiment of accelerated PWR.

FIG. 27 is a flow chart illustrating the general embodiment of accelerated PWR.

STEP 900: Providing multiple groups of memory cells, the memory cells in each group for operating in parallel.

STEP 902: Programming multiple subsets of data into a first group of memory cells, each subset of data being provided with an ECC.

STEP 910: Selecting a sample of the data programmed in the first group of memory cells, the sample being selected from a subset of data said multiple subsets of data programmed into the first group.

STEP 920: Reading said sample.

STEP 922: Checking said sample for errors.

STEP 930: Reprogramming said multiple subsets of data into a second group of memory cells whenever the errors checked from the sample is more than a predetermined number of error bits.

In one embodiment, the sample to be check is a subset of all the ECC pages written to a group of cell on a word line. In particular, the subset is one among all the ECC pages that is estimated to have a highest error rate.

Figures 28, 29:
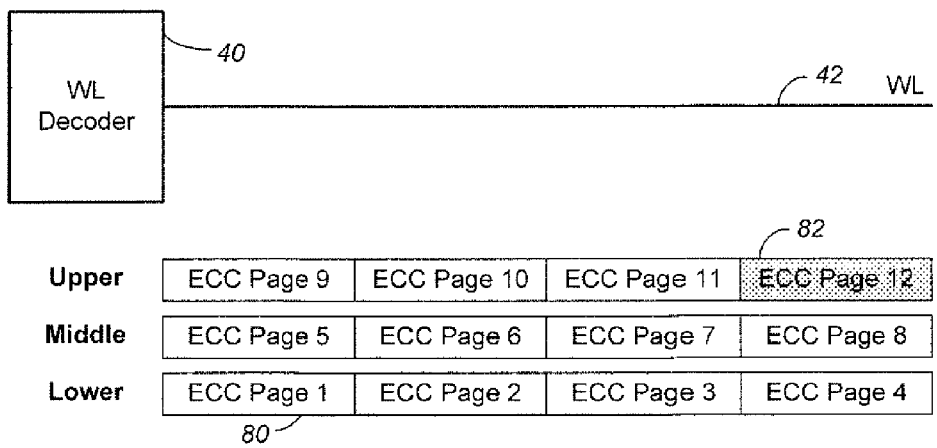
FIG. 28 is a flow chart illustrating a preferred embodiment of accelerated PWR illustrated in FIG. 27.
FIG. 29 illustrates a sample selected for post-write read after a group of 3-bit memory cells on a word line has been written.

FIG. 28 is a flow chart illustrating a preferred embodiment of accelerated PWR illustrated in FIG. 27. The process is similar to that of FIG. 27, except STEP 910 is replaced by STEP 910'.

STEP 910': Selecting a sample of the data programmed in the first group of memory cells, the sample being selected from a subset of data said multiple subsets of data programmed into the first group and the sample is a subset of data estimated to have a highest error rate among said multiple subsets of data programmed into the first group.

FIG. 29 illustrates a sample selected for post-write read after a group of 3-bit memory cells on a word line has been written. In the 3-bit memory, there will be 3 data pages, namely, lower, middle and upper pages, written to a word line WL 42. Depending on the designed placement of the reference thresholds that demarcate the various voltage bands in the threshold window of the memory, one of the data pages may have a slightly higher error rate than the other. For example, if the upper data page has an estimated highest data rate among the three data pages, it will be selected. If all the ECC pages in the selected data page are estimated to have the same error rate, then it suffices to select an ECC page with a location that is the first to be shifted out to the controller. Also, the choice of coding scheme can also have a bearing on the error rate. For example, a grey code offers a minimum bit error when the programmed threshold is shifted. Depending on the choice of coding, the various data pages being stored in the same group of memory cells can have similar or different error rates.

In practice, the error on a word line could be due to a physical defect like a crack resulting in an open circuit or one with an unusually high resistance. If the defect occurs between the cell in question and the WL decoder, the check will show an error. If the defect occurs on the other side of the cell away from the WL decoder, then, the check may not show an error. Thus, among all the ECC pages along the WL 42, the sample ECC page 82 at the end of the WL furthest from the WL decoder 40 is likely to be impacted by the defect irrespective of the defect location on the WL.

Thus, in a preferred embodiment where there are multiple data pages written to a word line (WL), a sample used for checking the data written to the WL is first selected from a data page with highest estimated error rate. Furthermore, if there are multiple ECC pages in the selected data page, the ECC page located furthest away from a word line decoder is selected for the sample.

In another embodiment, the sample to be check is a subset of all the ECC pages written to a group of cells in a block. The block has all cells in it erasable together. In particular, the subset is one among all the ECC pages that is estimated to have a highest error rate.

For example, in the NAND memory shown in FIG. 4, an erase block is constituted from a row of NAND chains. Each NAND chain is 16 memory cells daisy-chained by their sources and drains, terminating on one end in a source terminal and the other end in a drain terminal. It is well-known that the cells in closest to the source terminal and the drain terminal are more error prone. Thus, for such a block, the word lines WL1 or WL16 should be selected. In this case, preferably, the sample is the ECC page at the end of WL1 furthest from the word line decoder.

In yet another embodiment, where a block of memory cell having a set of word lines is erasable as a erase unit, and there is a requirement that data written to each word line of the set must check out, or else the entire block is rewritten, the WL of the set estimated to have the highest error rate is preferentially checked first. In this way, any error that may occur will be detected early and the rewriting of the block can begin without delay.

Thus, for the NAND memory shown in FIG. 4, the word lines WL1 and WL16 should be selected first for checking.

Although an example is given for a memory being partitioned into a first portion having memory cells each storing 1-bit data and a second portion having memory cells each storing 3-bit data, the invention is not limited by the example.

EPWR with Simultaneous Multi-Page Verification

As discussed above, the memory system can use the Enhanced Post Write Read (EPWR) process in order to ensure user data integrity and to increase memory reliability in the presence of unscreenable memory failures, such as broken word-lines, control gate short circuits, word-line to word-line shorts, and so on. In general terms, EPWR is accomplished by reading each block and verifying that it is stored reliably prior to erasing the source of the copy. In the exemplary embodiments, this would be to verify a multi-state write before erasing a source copy from binary memory. As such EPWR methods require a lot of time and, hence, may degrade the programming throughput significantly, especially in a multi-die product, where a single controller is involved in performing EPWR for multiple dies becomes a bottleneck. This section presents techniques where multi-pages are simultaneously verified for faster methods of performing EPWR.

Reconsidering the problem further for a basic post write read implementation, using a 3-bit per cell MLC (or D3) embodiment for a concrete example, the controller reads an entire D3 block after its programming, transferring all of the pages to the controller and decoding them. This incurs a very high programming throughput penalty. For example, assume a 70 MB/sec ECC engine, the EPWR time for a 4 MB block may take ~60 ms per block for a single die (assuming ECC is the bottleneck). As the number of dies increases, the penalty correspondingly becomes larger, as all the data originating from the multiple blocks of the multiple dies needs to be transferred to a single controller and be decoded by a single ECC engine. Hence for 4 dies, the EPWR process may take ~240 ms, which will degrade the programming throughput significantly. This sort of very long EPWR operation after each block programming operation may significantly slow down the overall programming throughput (e.g. ~25% degradation in a 4 die configuration, assuming raw programming throughput of 6 MB/see).

The previous sections have presented various methods for a faster EPWR. This section considers a simultaneous verification of multiple pages in a block, where the controller evaluates a combined function of the multiple pages, instead of evaluating each page separately. Such a combined verification of multiple pages based on the read data can significantly reduce the controller involvement, lowering the required bus and ECC bandwidth for EPWR and hence allow efficient EPWR when the number of dies is large. Before considering this particular aspect further, several complementary approaches for fast EPWR are discussed, as these will be combined in some embodiments.

One way to speed up the EPWR process is to reduce the amount of data that is read and evaluated to the minimal, or least a lesser, amount that is required for identifying the unscreenable problems, such as broken word lines, control gate short circuits, word line to word line shorts, and so on. (More information on broken or leaky word lines is given in the following U.S. patent applications: U.S. Ser. No. 12/833, 167 filed on Jul. 9, 2010; Ser. No. 12/833,146 filed on Jul. 9, 2010; Ser. No. 13/016,732 filed on Jan. 28, 2011; and Ser. No. 13/101,765 filed on May 5, 2011.)

Figure 30:
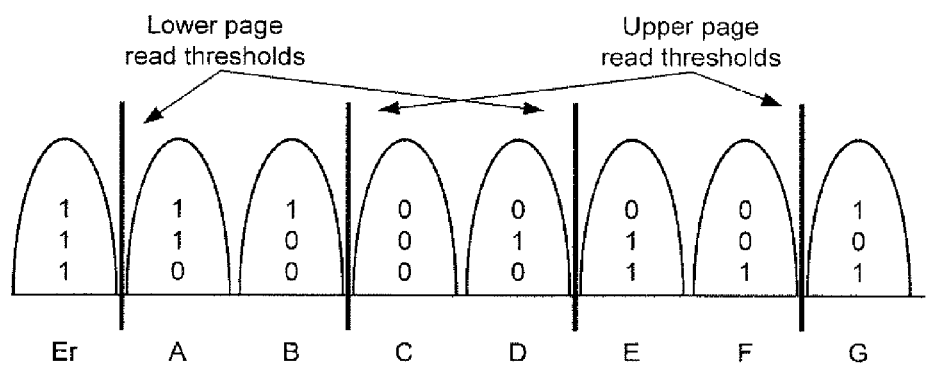
FIG. 30 illustrates an assignment of data states to a 3-bit memory.

The amount of data read and transferred can be reduced by reading only certain pages. For example, in a 3-bit per cell D3 NAND embodiment, with a mapping as illustrated in FIG. 30 it may be sufficient to read only Lower and Upper pages in each word line, or only the Middle page of the word lines. The reason is that the sort of unscreenable NAND issues mentioned above can be identified by observing one or two pages, so that there is no need to read all 3 pages of the word line. For example, reading the Lower and Upper pages is sufficient for identifying program disturb issues (due to reading between the erased state and lowest non-erased state), Source Induced Leakage Voltage issues (or SILC, which results in a lower tail from the highest states) or any other colossal NAND problem that would disturb the cell voltage distributions. This can be illustrated by referring to FIG. 30, which shows the state distributions with the upper, middle and lower page values shown in the distributions and the Erase (Er), A, . . . , G state labeling across the bottom. As there is a lower page read threshold between the Er and A states, this can be used to check for program disturb issues that would show up in this read; and as there is an upper page read threshold between the F and G states, this read could pick up the lower tail from the G state indicating the SILC related error. As will be discussed below, an exemplary embodiment of this section will use only the uppermost and lowermost pages on a word line where performing a multi-page verification.

The amount of data read and transferred can also be reduced by checking the validity of only part of the page. Examples of this are memories where bit lines are split into even and odd sets or where the columns can otherwise be split into groups across the array, so that a read of only a portion of the bit lines can give a good picture of the word line as a whole. Another example, which will be used in some embodiments below, is the reading of an ECC block (or "Eblock"), which is the unit of data that is encoded with ECC. Such an Eblock is often only a portion of a page; however it may be sufficient in order to identify a problem in any part of the word line.

Several methods may be used for identifying a problem in a block (or word line) based on the read data. One way is just to decode the data and count the number of errors, an approach that takes a relatively long time, has a relatively high power consumption and can also take a variable amount of time to complete (especially when using an ECC system using iterative decoding, but also in a BCH system).

Another approach is to estimate the Bit Error Rate (BER) based on the syndrome weight (i.e. based on the number of unsatisfied parity checks). This option is applicable for an ECC having a low-density parity-check matrix. The BER of an ECC block (Eblock) can be estimated as:

$$BER = \frac{1 - (1 - 2 \cdot W/M)^{1/d}}{2},$$

where W is the number of unsatisfied parity-checks, M is the total number of parity-checks and d is the number of bits involved in each parity-check (assuming it is fixed). In practice, such computations can be done offline and a Look-Up-Table (LUT) is used for translating the number of unsatisfied parity-checks W to the estimated BER. The advantage of this over a full decoding is that it is fast and completes in a deterministic time. It also has small power consumption.

A further approach is to measure statistics of the read data and compare it to an expected value; for example, by counting the number of cells in each state (or in selected states) and comparing it to the expected value. Assuming the system uses data scrambling, ⅛ of the cells in a 3-bit per cell embodiment are expected to be programmed to each state. Although this approach may be less robust than the two methods just discussed (which measure/estimate BER), assuming the same amount of data, can still allow capturing colossal memory problems which will significantly affect the Cell Voltage Distribution (CVD).

In an approach developed in the next section, BER is measured by comparing the source SLC page and the destination MLC page. This may be done internally in the Flash.

These various approaches, as well as the others mentioned in the preceding sections, can variously be combined with the sort of simultaneous verification of multiple pages in a block that is the primary focus of this section. The combined verification of multiple pages based on the read data can significantly reduce the controller involvement (i.e. the required bus and ECC bandwidth for EPWR) and hence allow efficient EPWR when the number of dies is large.

The memory system evaluates a combined function of multiple pages in order to identify a problem in one or more of the pages. The motivation for this is that a much smaller amount of data needs to be examined and this may significantly reduce the bandwidth requirement from the controller bus and the ECC engine involved in such evaluation. This in turn allows for efficient operation on a large number of dies.

One approach is to use the sum modulo 2 (i.e. XOR) of multiple read Eblocks. For linear ECC (as is the case for LDPC, BCH and most ECC methods used in practice), then the XOR of Eblocks is also a valid Eblock. Hence, if the system XORs n read Eblocks then the result is also an Eblock with a BER that is given by:

$$BER_\oplus = \frac{1 - \prod_{i=1}^{n}(1 - 2 \cdot BER_i)}{2} \cong \sum_{i=1}^{n} BER_i,$$

where $BER_\oplus$ is the BER of the XOR Eblock and $BER_i$ is the BER of the i-th Eblock. Thus, if the system evaluates the BER of the XOR Eblock (such as by the ways described above), then the system evaluates the sum of BERs on its constituent Eblocks. From this, the system can identify a problem in one of the Eblocks. For example, consider XOR-ing n=16 Eblocks, one Eblock from each page. (A page may have one or multiple Eblocks.) Further assume that the expected BER after programming is 0.1% with standard deviation σ=0.01%. Then, the expected value of $BER_\oplus$ is n·0.1%=1.6% with standard deviation $\sigma_\oplus = \sqrt{n \cdot \sigma^2} = 0.04\%$; and hence if $BER_\oplus$ is higher than 1.6%+3·$\sigma_\oplus$=1.72%, this would serve as an indication that there may be a problem in one of the pages (3·$\sigma_\oplus$ margin is taken in order to ensure that in normal behavior the probability to cross the threshold is ~1/1000). In this case, further actions can be taken, such as specific evaluation of each of the pages or re-programming of the block. After scrutiny, it may be decided to mark the block as bad or some of the other actions described in preceding sections.

In case the BER statistics are not known after programming (i.e. expected BER and its variance), then a possible concern when using the $BER_\oplus$ estimation is that there will be a single problematic page, while other pages would have very low BER, such that the $BER_\oplus$ threshold set for indicating a problem will not be crossed and we will not "catch" the problem. E.g. for an estimated $BER_\oplus$=1.6%, it would not be known if there were n=16 pages, each with BER of 0.1%; or that we have 15 pages with BER of 0.01% and one page with BER of 1.45% (in both cases sum of BERs is 1.6%). In order to overcome this problem, the system should make sure that the variance between the pages is small. This can be done by tracking the $BER_\oplus$ parameters of several groups. For example, if the $BER_\oplus$ parameter of the current group is 15·0.01%+1.45%=1.6%, but the $BER_\oplus$ parameter of the previous group was 16·0.01%=0.16%, this would indicate that the current group has a problematic page.

Concerning the number of Eblocks (n) that the system XORs together for the composite function $BER_\oplus$, several factors enter in. One limitation is that as n becomes larger, the "averaging" effect over the BERs of the n Eblocks becomes more significant and it increases the probability to miss capturing a problematic Eblock, although the solution described in the previous paragraph can be used to significantly reduce this risk. Another limitation depends on the method that is used for evaluating $BER_\oplus$. If the system is estimating $BER_\oplus$ using decoding, then it needs to limit $BER_\oplus$ based on the error correction capability of the ECC; e.g. if the system uses BCH ECC that can correct 60 bits and if the maximal number of expected bit errors after programming is 10 bits, then the system should limit n to 6. If the system uses BER estimation based on syndrome weight, then this estimation is effective up to a certain error rate; for example, a certain LDPC code may provide good BER estimation up to a BER of ~3% and above this error rate, the estimation error may become too large. In this case if the maximal BER expected after programming is 0.3%, then the maximal number of pages n that may be verified together should be limited to 10.

Finally, if the system uses a comparison between the XOR of SLC pages and the XOR of D3 pages in order to evaluate $BER_\oplus$, then on the one hand it is not limited by a maximal $BER_\oplus$ that can be evaluated. (This approach is discussed in the next section.) On the other hand, the system accumulates errors of both the SLC and MLC pages, increasing the risk of miss-capturing a problematic page. Moreover, this method requires reading both the 3 source SLC blocks and the destination D3 block, which be a disadvantage in reading time and hence in overall EPWR time.

In the approach of this section, the controller involvement can be significantly reduced, since the XOR-ing of Eblocks is performed internally in the memory latches and hence a much smaller amount of data is sent to the controller and evaluated by the ECC core. This means that EPWR time for a single die or two dies or four dies or more is basically the same, as the reading part of the EPWR is done simultaneously in all dies and is basically dictated by the time it takes to read a block. For example, assume that we would like to perform EPWR by reading the lower and upper pages in each word line and by XOR-ing n=16 pages and then sending the first Eblock in the XOR-ed page to the controller BER estimation (based on syndrome weight, for example). Then, the EPWR process will be done as follows, where ADL is a (binary) latch to which the data is initially read from a word line WLi and XDL is a transfer data latch from which data is transferred off of the memory WL, and NXOR is shorthand for NOT XOR:

Read lower page of WL0 into ADL (ADL = Lower0)

Read upper page of WL0 and NXOR it with ADL (ADL = ADL NXOR Upper0)

Read lower page of WL1 and NXOR it with ADL (ADL = ADL NXOR Lower1)

Read upper page of WL1 and NXOR it with ADL (ADL = ADL NXOR Upper1)

...

Read lower page of WL7 and NXOR it with ADL (ADL = ADL NXOR Lower7)

Read upper page of WL7 and NXOR it with ADL (ADL = ADL NXOR Upper7)

Transfer ADL to XDL (XDL = ADL)

Perform BER estimation of the transferred EBlock

Read lower page of WL8 into ADL (ADL = Lower8)

(may be parallelized with two previous stages)

Read upper page of WL8 and NXOR it with ADL (ADL = ADL NXOR Upper0)

Read lower page of WL9 and NXOR it with ADL (ADL = ADL NXOR Lower1)

Read upper page of WL9 and NXOR it with ADL (ADL = ADL NXOR Upper1)

...

Read lower page of WL15 and NXOR it with ADL (ADL = ADL NXOR Lower7)

Read upper page of WL15 and NXOR it with ADL (ADL = ADL NXOR Upper7)

Transfer ADL to XDL (XDL = ADL)

Transfer first Eblock of XDL to the controller

More detail on an exemplary embodiment for a latch structure (including ADL, XDL) that can suitably applied here can be found in U.S. Pat. Nos. 7,158,421 and 7,206,230, for example.

The EPWR process described above is significantly faster than the methods in the prior art. Assuming a pipelined operation, where the transfer to the controller and BER estimation operation (which are done only once every n page read operations), are done in parallel to reading of the next page group, then the overall EPWR time for a block is equal to the read time, which is in the order of a few milliseconds. Moreover, the EPWR time will remain the same for one die, two dies and four dies, as the reading and XOR-ing of the upper and lowers pages can be done in parallel in all dies and the transfer and BER estimation operations (done once every n page reads) require low bandwidth from the controller and the bus.

In some cases there may be way to further accelerate the process. The embodiment just discussed uses the XOR of the lower and upper pages. Referring to FIG. 30, the assignment of states for the 3-bits of data to the 8 distributions corresponds to a particular Grey mapping (a "2-3-2" mapping). Using this mapping and performing a page by page read, the lower page may be read by performing a first sensing between states Er and A, and then performing a second sensing between states D and E. The upper page may be read by performing a first sensing between states B and C, and then performing a second sensing between states F and G. It is common in flash memory systems that a plurality of sensing operations begins with an initial sense between 2 states and continues with a sequence of sensing at increasing voltages. In such a setting the initial sense operation takes more time than each of the following sense operations. This means that reading the lower and upper pages according to the mapping shown in FIG. 30, will require overall 4 sense operations, out of which 2 sense operations (the first sense in each page) will be longer. However, since the EPWR process uses only the XOR of the 2 pages it is possible to reduce the reading time of the 2 pages. This may be done by performing the following sequence of sense operations: between Er and A, followed by a sense between B and C, followed by a sense between D and E, followed by a sense between F and G. These 4 sense operations may be done faster than reading the two pages separately by applying a read of the upper page according to an alternate "1-2-4" Grey mappings, where an upper page of a 1-2-4 Grey mapping is exactly the XOR of the lower and upper pages of the 2-3-2 Grey mapping. Consequently, a read command for the upper page in a 1-2-4 Grey mapping can be used to produce the desired XOR of the lower and upper pages of the 2-3-2 Grey mapping with which the data was written in a single command. If this is possible, the read time per word line and the overall EPWR read time would be reduced. Further, if it is sufficient to read only the (or, more generally, a) middle page in each word line then the EPWR time will be reduced further (by ~33%).

Figure 31:
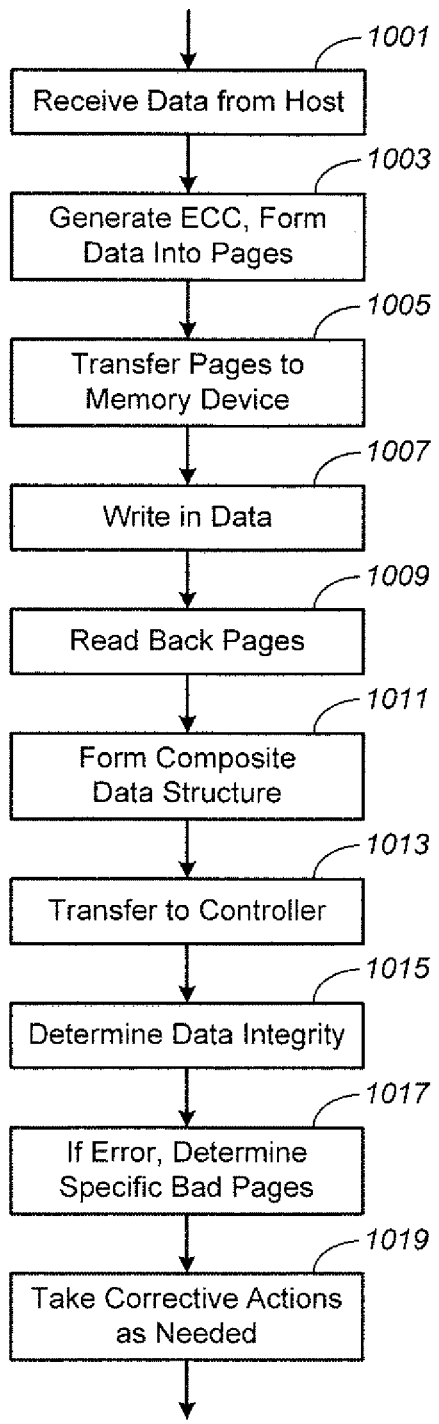
FIG. 31 is an exemplary flow illustrating aspects of the enhanced post write read using a combined verification of multiple pages.

FIG. 31 is a flowchart illustrating aspects of the process as these can be integrated into a programming process. At 1001, the memory system's controller receives data from the host. The controller uses its ECC engine to generate the corresponding ECC for each Eblock of data and forms these in pages at 1003, which are then transferred across the bus structure to the memory device at 1005. Although shown as a set of distinct processes that would be followed by a particular set of data, but in an actually device the steps will typically be going on in parallel, as noted in the earlier section or as described further in U.S. provisional patent application No. 61/495,053, filed Jun. 9, 2011. Once the data is latched on the memory, it is written into the array at 1007. In the exemplary write process, data is first written into a binary cache, after which it is folded into multistate memory. The following parts of the flow are described as occurring after this folding process, but in other cases they could be executed on the data in the binary memory, on data written directly into a multistate format, or on binary memory.

The EPWR portion starts at 1009 by reading back pages, or portions of pages (e.g., an Eblock) as stored on the memory and forming the composite data structure 1011. Although shown as two sequentially operations here, as discussed above, in the exemplary embodiment this actually is performed in a loop as the selected pages are sequentially read and XORed in the latches on the memory device. In the exemplary embodiment, the composite data structure is then transferred to the controller at 1013, where it is evaluated at 1015 for the integrity of the data from which the composite data structure was formed. In other embodiments, the determination could also be performed on the memory device itself.

The determination of 1015 can be done according to any of the various embodiments described here, whether by determining the amount of error or estimating the amount of error, using the ECC or without ECC based on statistics for the data. If the data is degraded, the system can then determine the specific bad pages at 1017, if desired, and also take any of the sort of correction actions described above.

This process will now be considered further in the context of a particular embodiment. This embodiment has a number of features, including: reading only the lowermost and uppermost pages on each word line; examine only the first Eblock per page; use BER estimation feature for evaluating the accumulated BER of n Eblocks, originating from n pages; form groups of pages into a composite spread the block to account for variation in the error rate; and selection of an appropriate criterion. It will be understood that these features would differ in different embodiments, such as using different pages, Eblocks, groups, criteria and so on.

Figure 32:
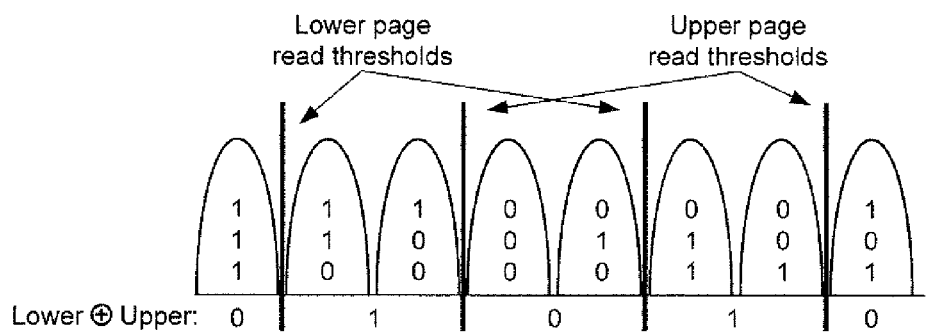
FIG. 32 shows the result of XOR-ing the top and bottom pages of the data states shown in FIG. 30.

With respect to the first of these features, the system reads only the upper and lower page in each word line. (The embodiment here again stores 3-bits per cell, but more generally, as in a 4-bit arrangement, the uppermost and lowermost can be used.) As discussed above, the lower and upper pages are sufficient for identifying many of the issues (program disturb, SILC, and so on) that would mess up the cell voltage distributions. This is illustrated in FIG. 32, that is largely the same as FIG. 30, but now with top and bottom pages' XORed value now across the bottom.

In an exemplary system, separate reading of lower and upper pages of the WL may be performed. Alternatively, as the system only actually needs the XOR of the lower and upper pages (and not each page separately), in a variation the read time can be reduces further by using a sequential type of read, with 4 sense operations (Er&A, B&C, D&E, F&G), to produce the Lower⊕Upper page using a single read command and in shorter time. Such a read can be done using a page by page read of the upper page in a 1-2-4 Grey mapping, as referred to above.

As also discussed above, if there is good interleaving between the memory latches and the array, using only one Eblock (here the first) per page is used as the cell of the Eblock originate from cells that are spread over the entire word line. In an exemplary embodiment for the memory device, the latch structure (the ADL and XDL latches above) is arranged so that an Eblock is stored in a continuous segment of the latch structure.

This particular embodiment uses a bit error rate (BER) estimation (e.g. based on syndrome weight or based on decoding) for evaluating the accumulated BER of n Eblocks, originating from n pages, the first Eblock in each of the pages. All the read pages can be XORed internally in the memory circuit, with the first Eblock in the XORed page transferred to the controller and the ECC engine is used to estimate its BER.

Due to possible variation in the error rate of word lines along the block, in order to have error rate uniformity among the different page groups, then it is preferable that each group will be composed of n pages that are equally spread along the block. This improves the detection of a problematic group, if such a group exists, as the problematic group would have significantly different accumulated BER compared to all other groups that are expected to have roughly the same accumulated BER due to the spreading.

Consider for example a block comprising 256 logical pages, in an X3 flash memory system where each cell stores 3 bits. In this case the first lower page will be page 0 and the first upper page will be page 2, both pages stored in the same word line (say WL0). The second lower page will be page 3 and the second upper page will be page 5 both stored in WL1, etc. In order to generate page groups which are spread along all the word lines, the plurality of lower and upper pages may be interleaved into the page groups. For example if each page group will comprise of 9 logical pages, 19 groups will be required and the interleaving may be chosen as follows:

| Page group 0:  | 0  | 29 | 57 | 86  | 114 | 143 | 171 | 200 | 228 |
| Page group 1:  | 2  | 30 | 59 | 87  | 116 | 144 | 173 | 201 | 230 |
| Page group 2:  | 3  | 32 | 60 | 89  | 117 | 146 | 174 | 203 | 231 |
| Page group 3:  | 5  | 33 | 62 | 90  | 119 | 147 | 176 | 204 | 233 |
| Page group 4:  | 6  | 35 | 63 | 92  | 120 | 149 | 177 | 206 | 234 |
| Page group 5:  | 8  | 36 | 65 | 93  | 122 | 150 | 179 | 207 | 236 |
| Page group 6:  | 9  | 38 | 66 | 95  | 123 | 152 | 180 | 209 | 237 |
| Page group 7:  | 11 | 39 | 68 | 96  | 125 | 153 | 182 | 210 | 239 |
| Page group 8:  | 12 | 41 | 69 | 98  | 126 | 155 | 183 | 212 | 240 |
| Page group 9:  | 14 | 42 | 71 | 99  | 128 | 156 | 185 | 213 | 242 |
| Page group 10: | 15 | 44 | 72 | 101 | 129 | 158 | 186 | 215 | 243 |
| Page group 11: | 17 | 45 | 74 | 102 | 131 | 159 | 188 | 216 | 245 |
| Page group 12: | 18 | 47 | 75 | 104 | 132 | 161 | 189 | 218 | 246 |
| Page group 13: | 20 | 48 | 77 | 105 | 134 | 162 | 191 | 219 | 248 |
| Page group 14: | 21 | 50 | 78 | 107 | 135 | 164 | 192 | 221 | 249 |
| Page group 15: | 23 | 51 | 80 | 108 | 137 | 165 | 194 | 222 | 251 |
| Page group 16: | 24 | 53 | 81 | 110 | 138 | 167 | 195 | 224 | 252 |
| Page group 17: | 26 | 54 | 83 | 111 | 140 | 168 | 197 | 225 | 254 |
| Page group 18: | 27 | 56 | 84 | 113 | 141 | 170 | 198 | 227 | 255 |

A systematic way to generate the page groups is provided in the EPWR procedure "pseudo code" of Table 1.

As a criterion for a suspicious block, one example is to consider a block having one or more pages with BER>0.2% immediately after programming. Hence, the BER threshold per page can be defined as $BER_{TH}=0.2\%$. The EPWR procedure of a block will generate 19 BER estimates: $w_0, w_1, \ldots, w_{18}$ (one syndrome weight number for each page group). Let $$BER_{max} = \max_{i \in \{0,1,\ldots,18\}} \{w_i\} \text{ and } BER_{min} = \min_{i \in \{0,1,\ldots,18\}} \{w_i\}.$$

A suspicious block will be detected based on $BER_{max}$, $BER_{min}$ if:

$$BER_{max} - \frac{n-1}{n} BER_{min} > BER_{TH} \Rightarrow$$

$$BER_{max} + 8 \cdot (BER_{max} - BER_{min}) > 9 \cdot BER_{TH}$$

In case the above condition is met, then close examination of the page group corresponding to $w_{max}$ is done by reading the first Eblock in each of the 9 pages of the group and performing BER estimation on it to produce an estimate w. If $w > BER_{TH}$ for one or more of the pages in the group then the block is marked as suspicious. Such examination of the worst group would take less than 10% of the EPWR time for the block. Hence, the penalty of a "false alarm" is relatively small.

When a suspicious block is detected, various of the operations similar to those discussed in the preceding sections. For example, the block's data can be re-programmed into a different block (as the data is at risk). Additionally, if the block was previously marked as suspicious (i.e. this is the second time a problem is detected in the block), then the block may be marked as bad.

In this example, the condition for a suspicious block was chosen to be conservative in order to avoid miss-detections, at the expense of higher number of false alarms, that will be screened by close examination of the worst page group (corresponding to $BER_{max}$). Note that the penalty for a false alarm is relatively small—in case of a false alarm, the 9 pages in the worst group need to be read and have their BER estimated based on their first Eblock. This takes less than 10% of the EPWR time for the block.

The reasoning behind the suspicious block condition is as follows: the most risky case for miss-detection is that the worst group includes one "bad" page, while all the other n−1 pages are very good. In order to capture this, it is assumed that the very good pages in this worst group have BER which is equal to the average BER of the best group—

$$\text{i.e. } BER \text{ of a good page} = \frac{BER_{min}}{n}.$$

Then the BER of the "bad" page in the worst group is given by:

$$BER_{max} - (n-1) \cdot BER(\text{good page}) = BER_{max} - (n-1) \cdot \frac{BER_{min}}{n}.$$

In case the false alarm rate is high, then the above condition may be slightly altered. An alternative condition, which is slightly less conservative, may be:

$$BER_{max} - \frac{n-1}{n} BER_{avg} > BER_{TH},$$

where $BER_{avg}$ is the average of the BER estimates of the best k groups, where k may be optimized. This way, the representative BER of the good page is determined as the average BER of groups that are expected to have only good pages. Due to the spreading of the adjacent pages among different page groups, it is expected that there are at most 4 page groups with a bad page. A broken word line will contribute 2 bad pages (lower and upper) that will be in two different page groups. A word line to word line short may contribute 4 bad pages (two lower and two upper pages from adjacent word lines), which will be in 4 different page groups. Hence, if $BER_{avg}$ is computed as the average BER of the best k groups, where k is smaller than 16, then it should be the average over groups that do not include a bad page. Choosing k=10, for example, would mean averaging over the better half of the block.

The various aspect of this section are further discussed in U.S. patent application Ser. No. 13/193,083.

TABLE 1

Pseudo code for EPWR procedure:

```
m = 0;
for i = 0 to 18
    % EPWR for group i:
    k = m;
    Read page # k into ADL (ADL = page #k);
    k = k + 29 − 0.5*mod(k,3) ;
    for j = 1:8
Read page # k and NXOR it with ADL (ADL =ADL NXOR page #k);
        k = k + 29 − 0.5*mod(k,3);
    end
    Transfer NOT ADL into XDL (XDL = NOT ADL);
    Transfer first Eblock of XDL to the controller.
    Perform BER estimation of the transferred Eblock using ECC decoder
to generate a BER estimate $w_i$;
    Update $w_{max}$ and $w_{min}$ ;
    m = m + 2 − mod(i,2);
end
If $BER_{max} + 8 \cdot (BER_{max} - BER_{mjn}) > 9 \cdot BER_{TH}$ then block is
suspicious and close examination of the page group corresponding to
$BER_{max}$ is required.
```

EPWR Comparing Source SLC Page and Destination MLC Page

In this section, the bit error rate is measured by comparing the source SLC page and the destination MLC page. This may be done internally in the memory circuit, allowing the entire EPWR processing to be done within the flash die, which is especially suitable for the case in which a single controller is serving large number of flash dies. The arrangement of having both SLC and MLC non-volatile memory sections in which this technique can be used is in a binary cache arrangement, where the data is initially written into the non-volatile memory portion, then folded into the multi-state portion. More detail on binary cache structures is developed in the following U.S. patent application or provisional application Ser. Nos. 12/348,819; 12/348,825; 12/348,891; 12/348,895; 12/348,899; and 61/142,620, all filed on Jan. 5, 2009. More detail on folding operations can be found in U.S. patent application Ser. No. 12/478,997, filed on Jun. 5, 2009, and Ser. No. 12/635,449, filed on Dec. 10, 2009.

Relative to the techniques of the previous section, there are circumstance where the techniques of this section can be more effective. A first is when a decoder is used which does not have BER estimation capabilities, and also when the number of bits allowed being erroneous is large compared with the correction capability of the decoder. Another is when the number of dies is large and all the data of the page needs to be transferred to the controller and BER estimation time increases, in which case there is an advantage to maintain all processing in the flash die.

Returning to the techniques of the present section, the BER is suggested by comparing the source SLC page and the destination MLC (D3 in this example) page. An exemplary embodiment does this by XOR-ing the corresponding pair of SLC and MLC pages and counting the number of "1"s in the XORed page, as these represent the mis-matches between the page as written in SLC and MLC. This approach is beneficial when flash management firmware uses binary cash (BC) when data is stored in D3: for example, all user data is first placed in the BC (SLC partition) and then copied in either back ground or semi-background folding operation (postponing ready to host after programming to SLC is done).

Figure 33:
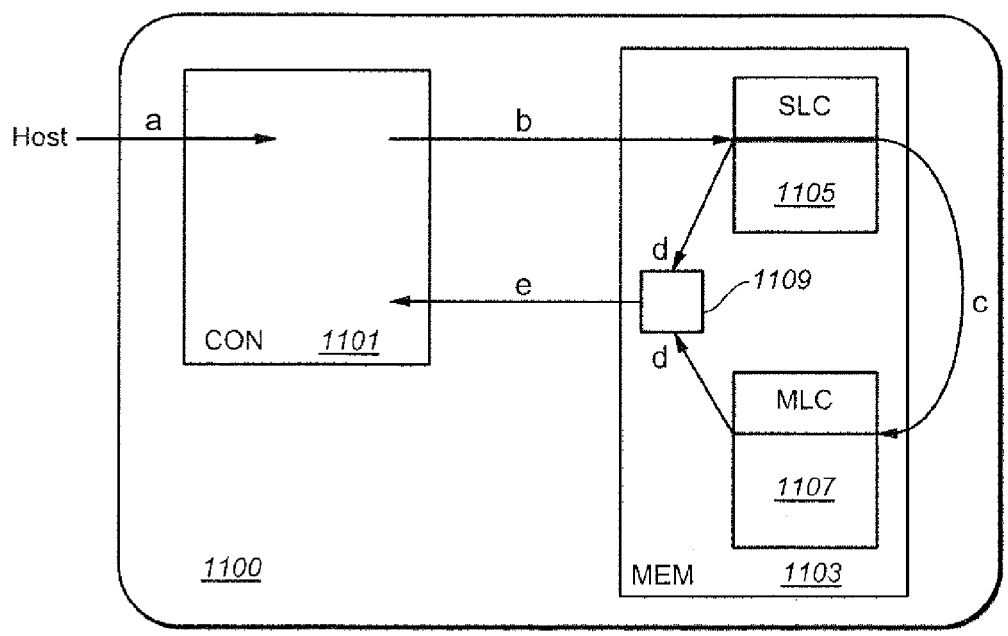
FIG. 33 is a schematic illustration of a post-write verify process where the data as written in a binary format is compared with the same data as written in a multi-state format.

The general idea is schematically illustrated in FIG. 33. When data for programming is received at the memory system 1100, it is first received at the controller circuit 1101, as shown at "a". The data is then transferred to one of the memory chips 1103, where it is initially written into the SLC portion 1105 of the binary cache, as shown at "b". The data is then written from the SLC section 1105 into the MLC section 1107, as shown at "c". One or more pages (a block's worth, for example) are then read from the MLC section ("d") 1107 are then compared to the same pages as read from the SLC section 1105 (also "d"), where the circuit for the comparison is represented by the block 1109. A number of variations are possible for the order in which these pages are read and compared, as discussed below. Based on the comparison, the result can be reported out to the controller and appropriate corrective action taken as needed, as shown at "e".

Assuming data written into an SLC page is relatively reliable, with estimated BER of, say, ~1E-5 on fresh data ("just programmed"), while the D3 reliability threshold for determining the block is bad is, for example, in the order of ~1E-3, then comparing the SLC to D3 page by checking the number of '1' provides an accurate estimate on the reliability of the X3 page. For example assuming an X3 page should provide BER no higher than ~0.1%, then on 1 KB (+parity) of data the number of expected erroneous bits should not exceed ~9 bit.

Counting the number of '1's for a 1 KB tier within the flash die using bit scan for up to as small number of bits (e.g. 16 bits) would take less time compared to the time required for transferring the data to the controller and performing the counting in the controller. Hence, although the number of "1"s can be counted on either on the controller or on the memory device, it is preferable to count internally in the flash (and hence avoid controller involvement) since, unlike the method of the last section, the count can be done concurrently in all flash dies as no data needs to be transferred to the controller. In the case (likely rare) that the counter is saturated, then the system can transfer to the controller for counting larger numbers (where an internal bit scan operation within the Flash die would be slower than transferring and counting in the controller).

Relative to the method of the preceding section, this method has a relative disadvantage in that that it requires reading the 3 SLC source blocks (for the D3 example) in addition reading of the target MLC block (which roughly doubles the reading time). On the other hand, this method may be done without controller involvement, if counting is done internally in the memory section. This can be particularly advantageous when the number of dies is large and the controller becomes a bottleneck, as will enable parallelizing the EPWR operation of the dies. Another possible disadvantage of the proposed method is that it would not detect problems that occurred in the SLC block as the errors would be copied into the MLC block and then cancelled out when performing the XOR between the SLC and MLC pages. However, as the probability of NAND failures to occur in the SLC block is much smaller than the probability of NAND failures in the MLC block, then this issue is not a concern.

In order to further reduce the time to do the '1' count several SLC and MLC pages can be XOR-ed together before compare is done. If the number of bit errors is small enough, then after XOR-ing 10 pages of MLC and 10 pages of SLC into a single latch the total number of errors would be still sufficiently small for the count to be done quickly inside the flash and then scanning for errors in the flash may be preferable. However if the number of bits would be large, it is possible to extract the result to the controller, in which the count may be done during the transfer itself. This would result with a similar transfer time from flash to controller as in previous section; however, this would save on the BER estimation time on one hand but will add SLC sensing time on the other hand. In cases where the data is arranged in such a way that the MLC data is in one plane and the corresponding SLC data is on another plane, then some embodiments can allow the sensing of the SLC and MLC page concurrently. (This means that system should support an SLC sense and an MLC page by page sense in the flash die.)

Comparing with the method of this section with that of the preceding section and looking at an estimate of the relative times involved, the overall EPWR process described in the last section would require the time it takes to read N SLC block plus the time to read an MLC block plus the time of XOR-ing all the pages. This EPWR time will remain basically the same for one die, two dies and four dies, as it can be done in parallel in all dies due to the low bandwidth required from the controller.

Figure 34:
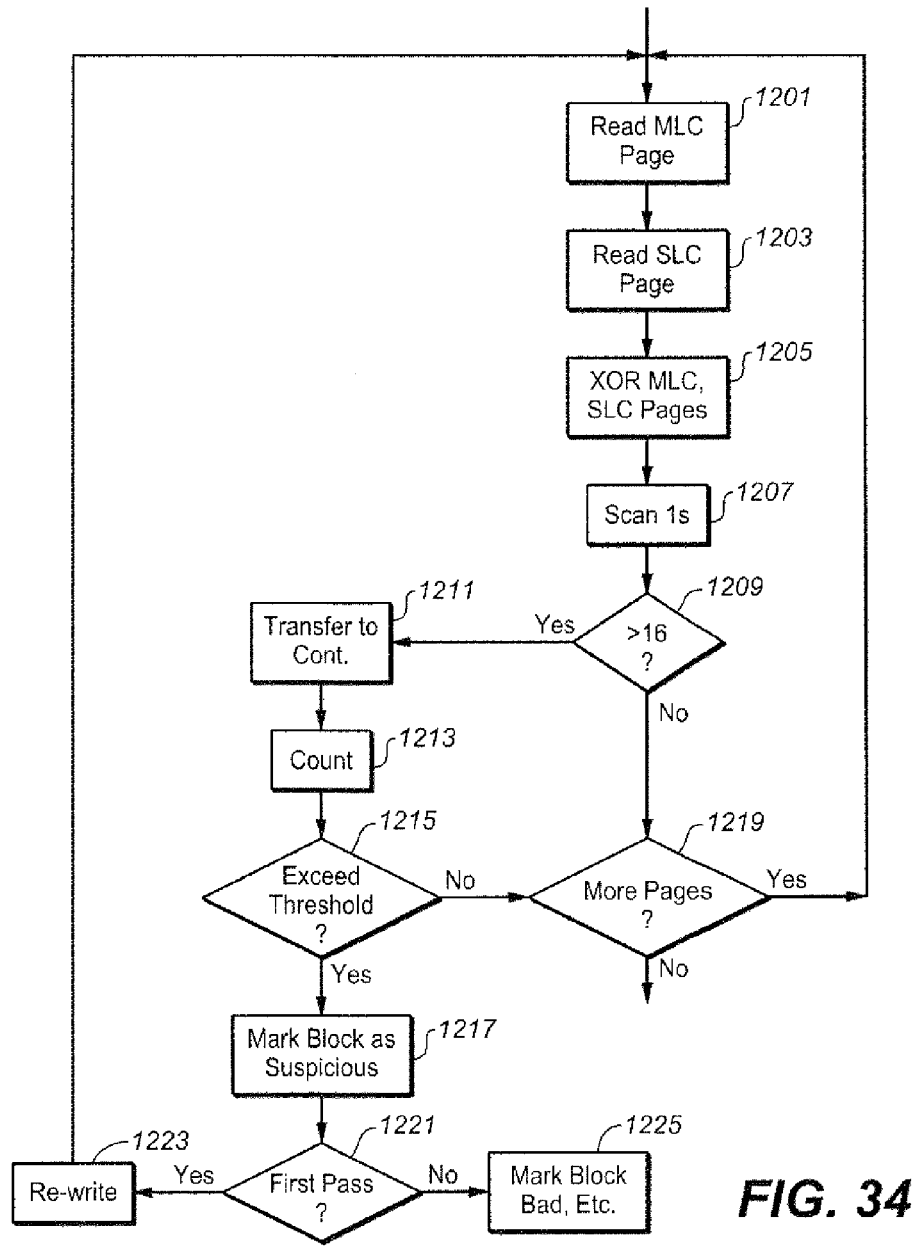
FIGS. 34-36 are flows for some exemplary embodiments of an EPWR where an MLC page or pages are compared to corresponding SLC pages.
Figure 35:
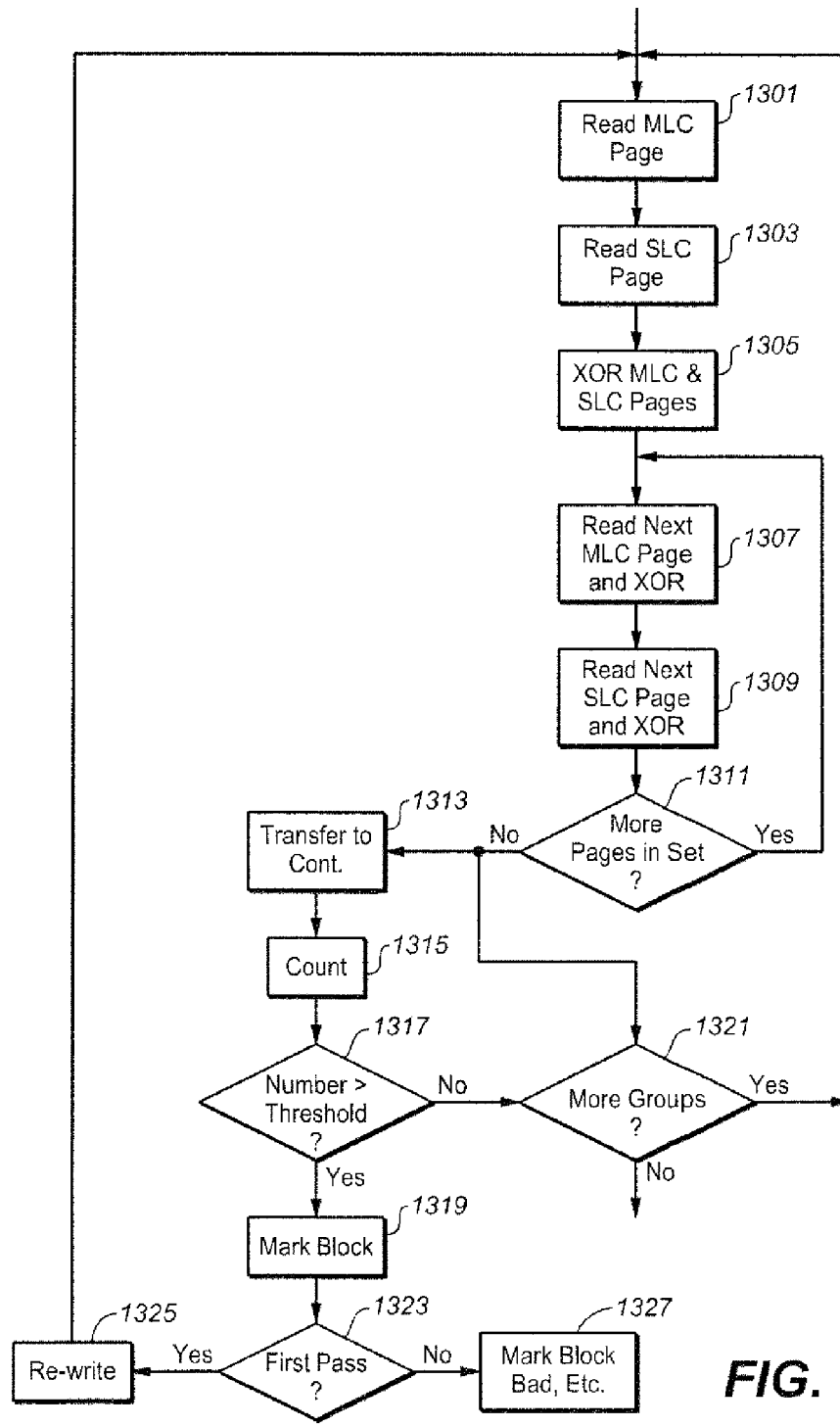
Figure 36:
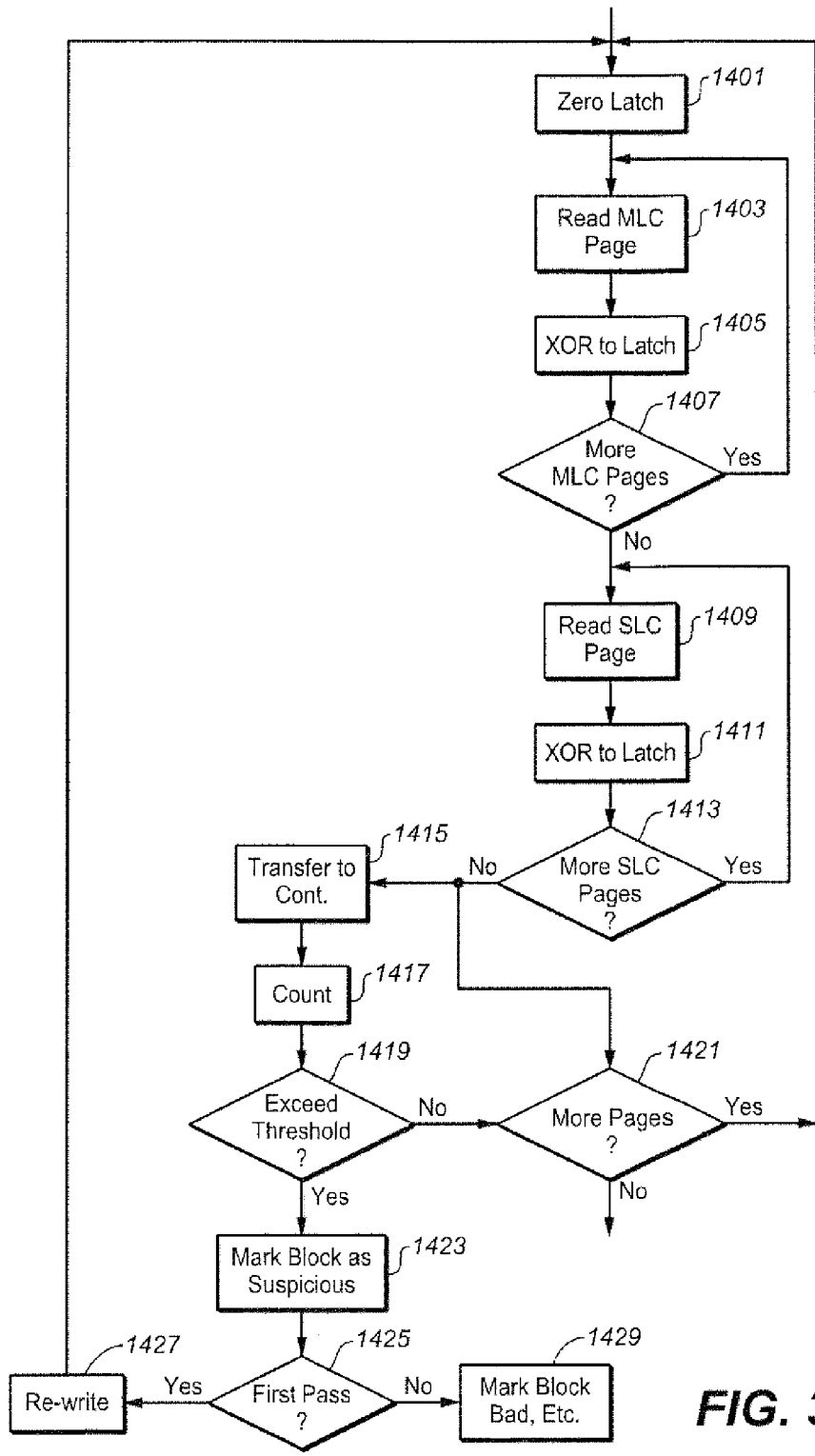

FIGS. 34-36 are flows for some exemplary embodiments of an EPWR. Each of these flow pick up the write process at the EPWR stage, after the pages have been written into the SLC memory section and the MLC memory section (that is, after "c" in FIG. 33). Typically, the process is done after a complete MLC block has been written so that the cumulative effects of all the written word lines upon one another can be taken into account; however, more generally it may be done after any number of MLC pages have been written. For example, in the first variation, illustrated by FIG. 34, starts by an individual comparison (here an XOR operation) of an MLC page with the same page from binary.

Turning now to FIG. 34, this process can be performed on every die concurrently and, in the exemplary embodiment, done after every MLC (here D3) block has been programmed. The figure looks at the flow on a single die or plane and the selected MLC block has been programmed. At 1201, the page is sensed from the MLC portion of the memory and at 1203 it is sensed from the original binary page. The order of these two step could of course be reversed or even performed simultaneously, if the memory device supports this. At 1205, the two versions are compared by, for example, XOR-ing them. Although this comparison could be done on the controller, much of the advantage of this embodiment is obtained when this is executed on the flash device itself. As any discrepancy between the two versions of the page will show as a "1" when XORed, a bit scan of the result for "1" is performed on every tier (e.g. a 1 KB unit here) up to a given threshold (e.g. 16 here) at 1207. If at 1209 this count exceeds, in this example, 16 (rate case), the page is transferred out to the controller at 1211 and the number of "1"s can then counted in the flash interface module of the controller, for example, at 1213. If the number of '1' (errors) exceed a threshold ("Yes" at 1215), the controller marks the block as suspicious in its data management structure at 1217. The threshold at 1215, and also at 1209, can be based on a settable firmware parameter, for instance. If the number of "1"s is within bounds ("No" at 1209 or 1215), at 1219 the flow loops back to 1201 for the next page if there are more pages to check, or continues on to the next process (which could be EPWR for the next block or other operation) if not.

With respect to relation of decision 1215 relative to the loop back from 1219, different variations can be used. In one case the process of 1219 can be done in parallel as far as the relation of decision 1215 relative to the loop back from 1219, different variations can be used. In one case the process of 1219 can be done in parallel with 1211, 1213, 1215; alternately, the system can do 1211, 1213, 1215 and wait for the answer of 1215 to be NO before going on to 1219. (Similar remarks apply to the paths 1317 to 1321 in FIGS. 35 and 1419 to 1421 FIG. 36.) The first of these allows the system to continue without waiting for an answer, maintaining an efficient pipelined operation. The second (waiting for the answer at 1215) will often be a simpler implementation in the firmware, but usually is less efficient in terms of a pipelined operation of reads and transfers.

Going back to 1217, here, if the page exceeds the threshold at 1215, the block is marked as suspicious at 1217 and the remaining pages of block (or other group of pages being checked) are not checked. In other cases, however, the rest of the may be checked to provide a better picture of the amount of error in the block. In this case, the flow would go from 1217 to 1219 and the flow following 1217 would instead follow after all the pages are done. In any case, in the exemplary embodiment, if the block is found suspicious and it is the first time through for the check (determined at 1221), the data is rewritten at 1223 and then checked again, as shown by the loop back. If the number of '1' (errors) exceed the threshold the second time through and any of the E-block's number of '1' (errors) exceeds the threshold, the controller can mark the block in the corresponding die as bad and never use it again, as well as taken the various corrective actions discussed in previous sections (1225). In this embodiment, the actions of 1225 follow only on the second time through, but in other cases, they could be done on the first time around instead just marking as suspicious at 1217; alternate, one or more additional rewrites could be tried first.

FIG. 35 illustrates another variation that uses a combined comparison for several pages at time. More specifically, it forms combined comparisons for groups of pages and performs a single check for the group as a whole, where a block will typically be broken up into a number of such groups. (This is similar to what is done for the composites of the last section.) As with FIG. 34 above (and FIG. 36 below), this flow picks up the EPWR process within the larger programming operation within which it is incorporated, and can be done concurrently in each of the dies and after each MLC block is programmed.

Starting at 1301, the MLC page of a first group of pages is read, with the corresponding original binary page read at 1303. There are then XORed, again preferably on the memory chip itself, at 1305. At 1307, the next MLC page sensed and XORed with the latch holding the result of 1305. The memory then senses at 1309 the binary original page corresponding to the page of 1307 and XORs it with the latch holding the result of 1305. This is repeated (the loop from 1311) for all the pages of the group, after which the data can be sent to the controller (1313), during which the system can count the number of "1"s in the stream (1315). If the number of "1"s (errors) exceed a threshold mark (checked at 1317), the block as suspicious 1319. If there are more pages to check (1321), the process is completed for these. In this example, there is a shown "NO" path out of the comparison 1317 that comes back above 1321, but the loop out of 1321 could also commence prior to this decision and continue in parallel. And as with FIG. 34, once the block is marked as suspicious, the process can immediately go to 1323, or the rest of the block can be checked first. As also with FIG. 34, once a block is marked as suspicious, it can be reprogrammed, checked again, and treated accordingly if any of the E-block's number of "1"s (errors) exceeds the threshold (1323, 1325, 1327). In the flow of FIG. 35, note that the order of 1301 and 1303 is interchangeable. Also the order of steps 1305 and 1307 is interchangeable. Also, the order of XOR-ing any SLC and MLC within the same set is interchangeable: for example, the system can XOR all SLC pages and then XOR all MLC pages to the same latch in any order. Alternatively, the system can zero the latch and then proceed with XOR operations, each of which are to the same latch. This approach is expressed in the variation of FIG. 36.

FIG. 36 begins with zeroing the latch used for the subsequent XOR operations, which, although implicit before, is here included at 1401. At 1403 the MLC page is sensed and XORed to the latch at 1405, a process repeated for the loop out of 1407 for all the MLC pages of the group. The SLC pages are then read (1409) and XORed into the latch (1411) for all of the corresponding page of the group in the loop out of 1413. In the flow, the order in which the MLC pages and corresponding binary pages are read and XORed is interchangeable. The remainder of FIG. 36 then follows as with the corresponding elements of FIG. 35.

For any of these variations, an embodiment can be used where the decision of whether a block is bad is made according to some statistical behavior. For example, the pages of a block can be divided up into groups. For each group, the initial parts of the flow prior to marking the block as suspicious are executed for each group. The system can then compute an average number of "1"s per group as the sum of all "1"s on all groups divided by number of groups. The system can then check if the number of "1"s on the worst group (with maximal number of "1"s) exceeds some threshold which is a function of the average, and base its decision on this measure.

The techniques of this section are further developed in U.S. patent application Ser. No. 13/280,217 filed Oct. 24, 2011.

Combined Sensing of Multiple Word Lines

As discussed above, certain memory device failures such as broken word lines, control gate short circuits, and word line to word line shorts, among others, are not readily screened out during production. In order to ensure user data integrity and to increase memory reliability in the presence of such unscreenable memory device failures, it is required to detect these failures after programming of a memory block. These types of failures are discussed further in U.S. patent application Ser. Nos. 12/833,167; 12/833,146; 13/016,732; 13/101,765; and 13/193,148. Such failures can be detected using the Enhanced Post Write Read (EPWR) procedure described above. In this section a faster failure detection method is presented, based on combined multi-word line sensing. This allows the block detection to be faster than the conventional block reading time. Moreover, this method may allow detection of failures in progress, at their initial stages, before the page bit error rate (BER) is affected.

In order to speed up the block failure detection time, this section describes performing a combined simultaneous sensing of multiple word lines in order to identify a problem in one or more of these word lines. That is, sensing voltages are concurrently applied to the control gates of more than one memory cell whose resultant conductance is measured on the same bit line. For example, in a NAND type of architecture, this would be multiple cells in the same NAND string or in a NOR type architecture memory cells in the same column. In should be noted that these sensing voltages are those that are used to distinguish between different levels of programming, as opposed to the sort of higher pass voltage applied to non-selected memory cells in a NAND string basically remove these unselected cells from the read operation. The combined sensing result will be used for measuring certain statistics of the cell voltage distribution (CVD) of multiple word lines and comparing it to the expected value. In case the measured statistics are different than expected, this may indicate that one or more of the sensed word lines may exhibit a failure and more thorough examination of the group of word lines can be performed. This technique can be incorporated into the post write read process similarly to those described in the preceding sections, being used as check after a write process and with appropriate steps taken if a suspicious word line is detected.

Figure 37:
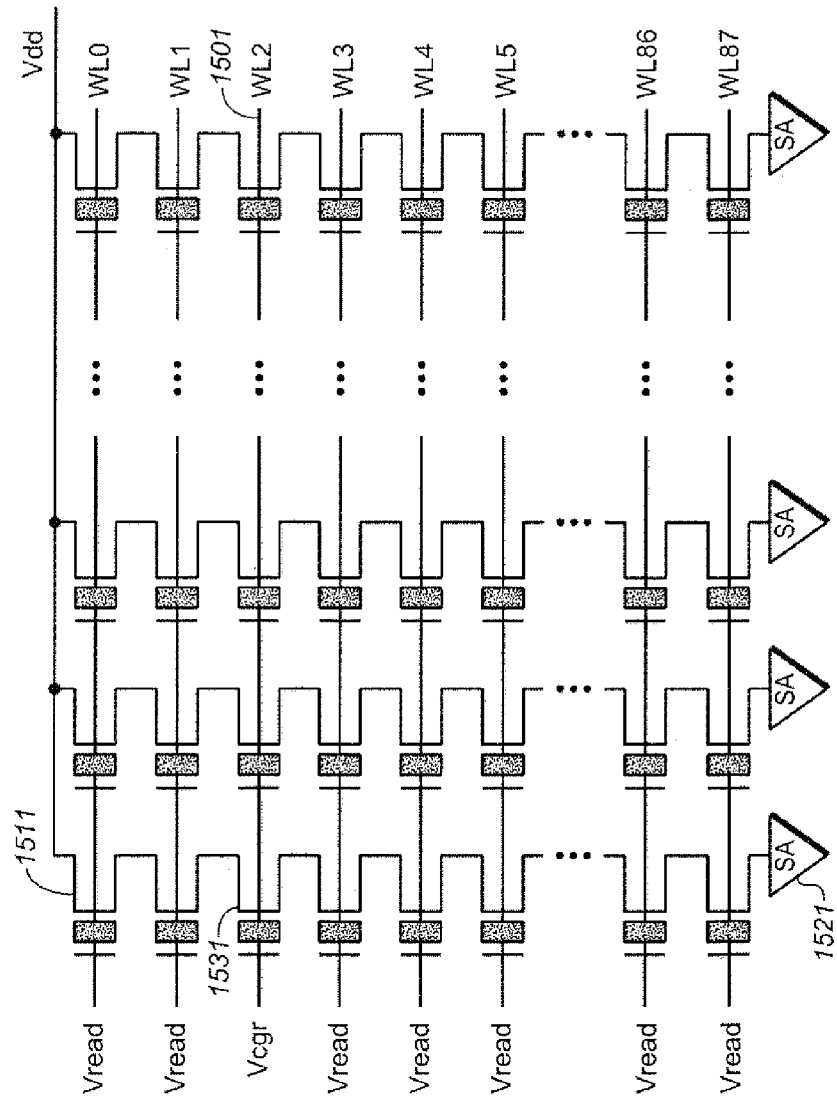
FIG. 37 is a schematic illustration of a standard sensing operation in a NAND type array.

Before describing the combined multiple word line sense process further, a conventional sensing process for a NAND type memory is considered briefly. FIG. 37 illustrates a conventional sensing of a word line WL-2 1501, the memory applies the sensing threshold voltage (Vcgr) to the gate of WL-n, while applying a pass voltage (Vread) to all other word lines (i.e. the memory "opens" all the cells in other word lines). The result of this sensing operation is a binary vector having 1's in the locations of cells in WL2 which satisfies Vth≤Vcgr, where Vth is the threshold voltage of the cell. For example, the result determined by the sense amp SA 1521 along the NAND string 1511 is determined by the state of the cell 1531, the other cells along 1511 being removed from contributing by applying the level Vread so that they are fully turned on.

Figure 38:
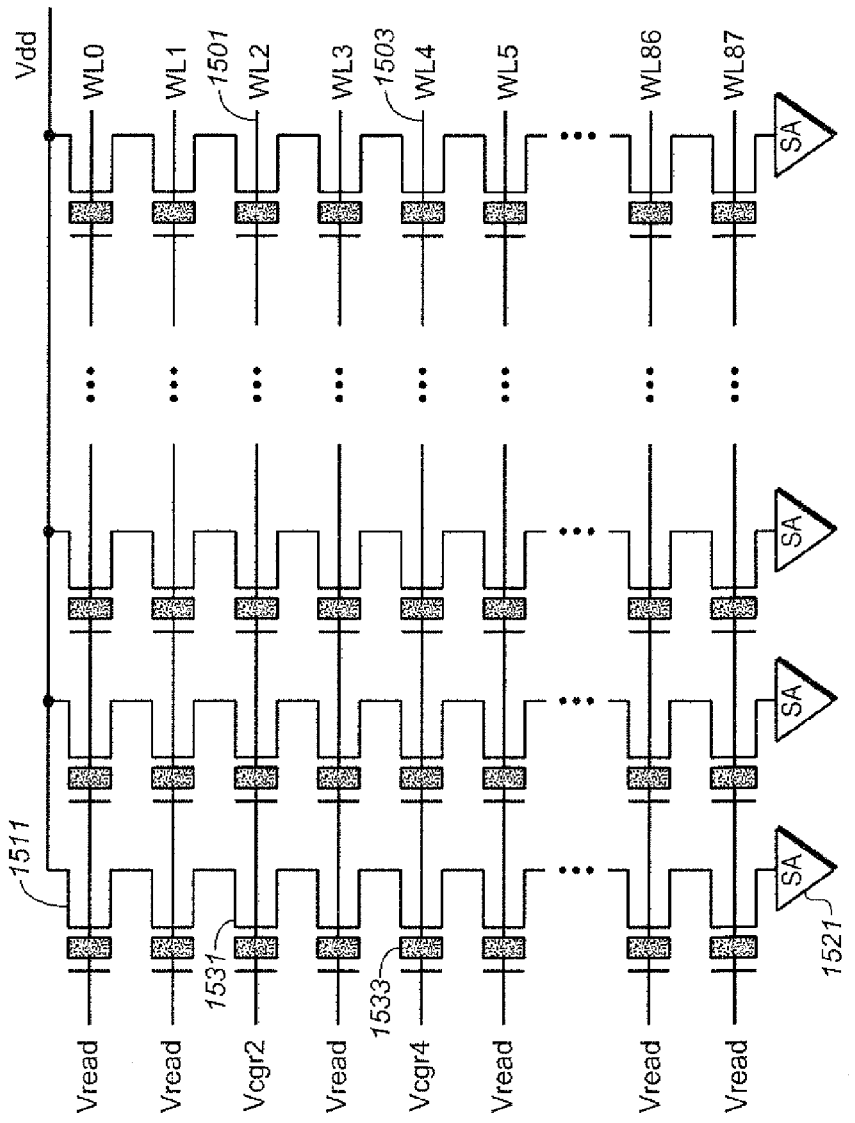
FIG. 38 is a schematic illustration of an example of a concurrent multiple word line sensing operation.

To evaluate combined statistics of multiple pages, the system may use a combined sensing of memory pages. For example, consider the setting of voltages as shown in FIG. 38 during sensing. Now the word line WL4 1503 as well as WL2 1501 are selected for a combined sensing operation, having the sensing voltages Vcgr4 and Vcgr2 being respectively applied. Consequently, for NAND string 1511 what is determined by the sense amp 1521 will be a combination of the state of both cells 1531 and 1533. The result of this sensing operation is a binary vector having 1's in the locations corresponding to bit lines that satisfy the following condition: (WL2 cell satisfies Vth≤Vcgr2) AND (WL4 cell satisfies Vth≤Vcgr4). Thus, the memory can detect a joint AND condition of multiple word lines using a single sensing operation. This can be used for fast EPWR by concurrently evaluating multiple word lines and comparing the result to an expected value; for example, if data scrambling is used, joint statistics of the combined sensing can be used.

In addition to the EPWR application discussed here, such a combined sensing of different pages on different word lines may be applied more generally for other purposes. For example, multi-WL sensing could be used to track optimal read thresholds to use for reading of a word line that belongs to the set of word lines, in a "cell voltage distribution (CVD) tracking" operation. The optimal read thresholds are a function of the CVD (basically the optimal thresholds for reading are roughly the thresholds where the CVD has minima points. i.e. in between the state distributions), and the system can learn about the CVD of the multiple WLs using the multi-WL sensing. Another application where the simultaneous sensing of multiple word lines could be used is for the estimation of the bit error rate (BER) of the multiple word lines. The BER is correlated with the CVD (e.g. the wider the CVD lobes, the larger the CVD overlaps, the higher the BER). Consequently, the system can use multi word line sensing in order to estimate any CVD related parameters of the sensed word lines.

Figure 39:
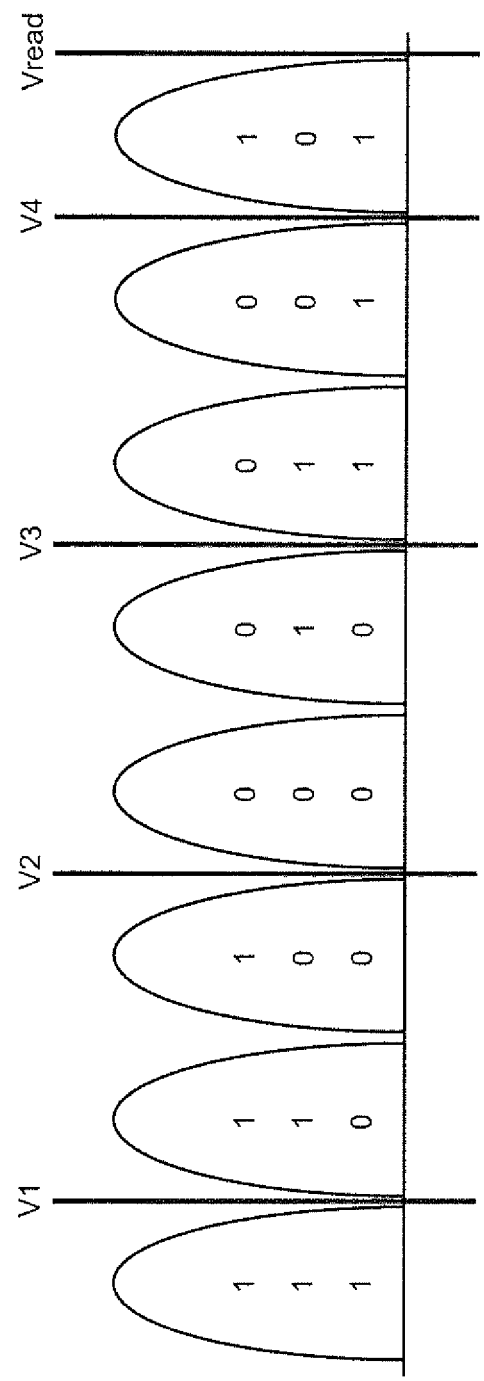
FIG. 39 shows the voltage levels used in embodiments illustrated in FIGS. 40 and 41.
Figure 40:
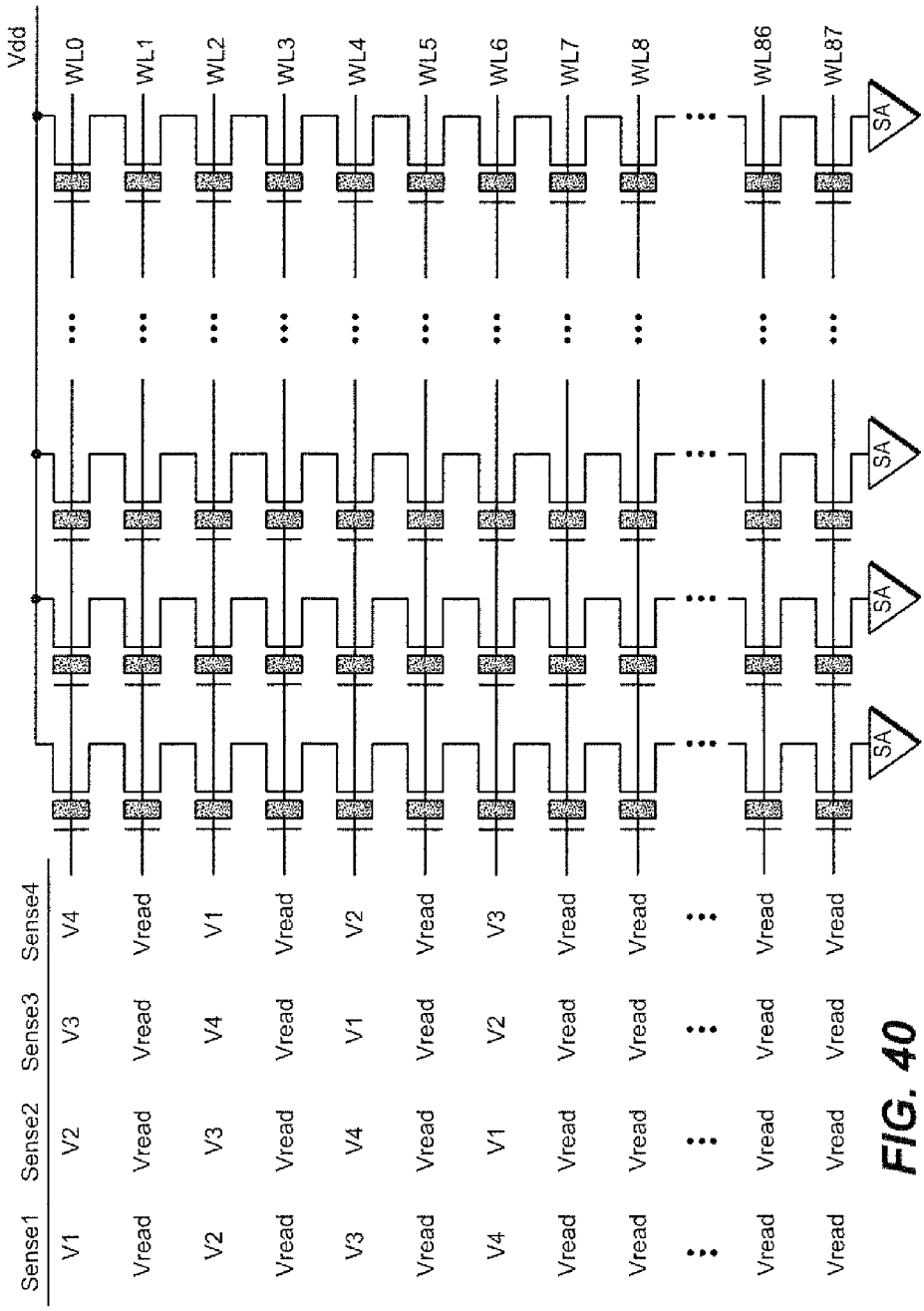
FIG. 40 illustrates one embodiment of a concurrent multiple word line sensing operation.

FIG. 39 again considers the states of FIGS. 30 and 32, but with the four voltages shown labeled V1, V2, V3 and V4 for the present discussion. Further, consider these four voltages applied in the set of four sensing operations illustrated in FIG. 40. Here, a first sensing operation respectively applies the voltages V1, V2, V3 and V4 to the word lines WL0, WL2, WL4 and WL6. The result of the first sensing operation is '1' in those bit lines that satisfy:

$$(Vth0 \leq V1) \text{ AND} (Vth2 \leq V2) \text{ AND} (Vth4 \leq V3) \text{ AND}$$
$$(Vth6 \leq V4) \quad \text{(Condition 1)}$$

Where Vth0, Vth2, Vth4 and Vth6 are the threshold voltages of the cells in WLs 0, 2, 4 and 6, respectively. The four sensing voltages are then cycled as shown for the second, third and fourth sensing operations, where similar conditions apply to the second, third and fourth sensing operations.

As to what is the expected result, in terms of the number of 1's in the binary page generated by each sensing operation, this can be answered assuming that the data is scrambled. In scrambled data, it is expected that ⅛ of the cells are programmed to each programming level when a 3-bit per cell form is used (i.e., for n states per cell, 1/n of the cells will be in each state when scrambling is used). Hence, $Pr(Vth0 \leq V1)=⅛$, $Pr(Vth2 \leq V2)=⅜$, $Pr(Vth4 \leq V3)=⅝$ and $Pr(Vth6 \leq V4)=⅞$. Thus, $Pr((Vth0 \leq V1)$ AND $(Vth2 \leq V2)$ AND $(Vth4 \leq V3)$ AND $(Vth6 \leq V4))=⅛·⅜·⅝·⅞=105/4096=2.56\%$.

As the sort of combined sensing operation just described places an unusual combination of bias levels on the array relative to the normal sensing operation used to extract the data content of a page of data, the combined multi page sensing may cause the sensing result to be different than predicted by Condition 1 above (i.e. alter the conditions for an "open" bit line as defined by condition). One concern is that coupling from neighbor word lines may affect the sensing accuracy and shift the sensed Vth. (This coupling effect is the same effect that is utilized for performing what is known as "look ahead" type of read process, where the effect of the state of a neighboring word is factored into the read.) However, this effect may be mitigated by performing the combined sensing on non-adjacent word lines (preferably, separated by more than one unselected word line).

Another concern is that when the Vth of a cell is close to the Vcgrv applied to its control gate, then the cell is just barely turned on. This means that in order for the bit line to be conducting, other cells along the NAND chain should be over driven; that is, the voltage applied to their control gate should be significantly larger than their Vth (e.g. by 1.5V, which is used as an exemplary value in this discussion). In conventional sensing on a NAND string, Vread typically over-drives unselected cells in the highest programmed state by ~1.5V and source side conditions are consistent between verify and read. In the combined multi page sensing described here, this will not be the case. To be more specific, consider the example in FIG. 40. This issue means that the condition for a bit line to be "on" (and read as '1') is not Condition 1 mentioned above, but rather a more involved condition, that is closer to the following condition:

$$((Vth0 \leq V1) \text{AND} (Vth2 \leq V2-1.5) \text{AND} (Vth4 \leq V3-1.5) \text{AND} (Vth6 \leq V4-1.5))$$

OR $$((Vth0 \leq V1-1.5) \text{AND} (Vth2 \leq V2) \text{AND} (Vth4 \leq V3-1.5) \text{AND} (Vth6 \leq V4-1.5))$$

OR $$((Vth0 \leq V1-1.5) \text{AND} (Vth2 \leq V2-1.5) \text{AND} (Vth4 \leq V3) \text{AND} (Vth6 \leq V4-1.5))$$

OR $$((Vth0 \leq V1-1.5) \text{AND} (Vth2 \leq V2-1.5) \text{AND} (Vth4 \leq V3-1.5) \text{AND} (Vth6 \leq V4))$$

Even this condition, which will be referred to as Condition 2, may be over simplified, but can be used to illustrate the issue.

These issues can be problematic, particularly if the goal is to actually read the data, as they result in unpredictable Vth shifts. However, the primary purpose of the combined multi page sensing being considered in this section is different in that it is being used as part of EPWR for checking if the cell voltage distribution (CVD) of one of the word lines is disturbed. Hence, regardless of the condition of a bit line to be "on" (whether it is Condition 1, Condition 2 or other), if the combined multi page sensing results in a different "signature"_for a set of good word lines (having a normal CVD) and a set of word lines that contains one or more disturbed word lines (having abnormal CVD), then it is sufficient for the purpose of EPWR. Such a combined multi page sensing can be used for purposes of a fast EPWR process by evaluating multiple word lines simultaneously. For example, it can evaluate every 4 word lines in only 4 sensing operations, and verifying based on the 1's counter correspond to the number of 1's in the binary page generated by each sensing operation is as expected.

In one exemplary embodiment, the "signature" of a group of word lines that is sensed together, that is used to detect a problem in the group, can be based on a set of counters that each indicates the number of '1's in the binary page that is the result of each sensing operation. These counts can be compared to their expected value assuming a normal CVD, such that a large difference from the expected value indicates that the group of WLs is suspicious and may contain a problematic word line. Another option is to compare the binary page obtained from each sensing operation to the expected page (instead of just counting 1's in the page and comparing it to the expected fraction of 1's). This alternate option may be more robust in terms of the ability to detect a problem in one of the pages; however, it is often less preferable as it requires knowing the expected page, which may problematic, although in one set of embodiments the expected page may be computed by, say, some hardware engine in the controller or by some logic in the memory device. The remainder of this section will focus on using the 1's count as a "signature".

Various options can be used to define the "signature" based on the counts, such that it will provide a good criterion for a suspicious WL group. It would be preferable to use a conservative criterion for determining that a group of word lines is suspicious, such that the probability of miss detection is reduced at the expense of false alarms. The penalty for false alarm is typically relatively small, as in this case it is only required to check the WLs in the suspicious group more carefully (i.e. reading 4 WLs in the example above). One option is to always check the WL group which shows the largest deviation from the statistics of all the WL groups. In this case the multi WL sensing serves as a method for fast initial screening that allows to quickly identify the most different group of WLs relatively to other WL groups. This WL group is then checked more thoroughly in a conventional way. This would be much faster than checking all the WLs in the block in a conventional way. For example, consider a 3-bit per cell MLC block, where a block of 88 word lines is divided into 22 groups of 4 WLs. In this case there are 22 WL groups, where for each group the system generates 4 counts (CNT1, CNT2, CNT3 and CNT4) using 4 sense operations. These 22*4=88 counts generated by traversing the entire block may be used for computing the expected value of each count as:

$\mu_1$=average of the 21 CNT1 numbers
$\mu_2$=average of the 21 CNT2 numbers
$\mu_3$=average of the 21 CNT3 numbers
$\mu_4$=average of the 21 CNT4 numbers Then, for each of the 22 groups we compute a "signature" defined as:

$$\text{Signature}=(CNT1-\mu_1)^2+(CNT2-\mu_2)^2+(CNT3-\mu_3)^2+(CNT4-\mu_4)^2.$$

Other embodiments can use other metrics for the signature.

Subsequently, the group with the largest signature (as it has the largest deviation from the block statistics) can be examined more closely, by reading its 4 word lines and checking them (e.g. via bit error rate estimation that can be done using ECC decoding or any other method). Overall, this "EPWR"

process takes: 22*4 sense operations for the groups, +4*4 sense operations for the WL group with the largest signature, for a total of 104 sense operations. This is ~30% of the number of sense operations required by a conventional reading of the block (which is 88*4=352 sense operations). Additionally, less data is transferred into the controller.

In order to speed up the EPWR even further, the combined multi page sensing can be performed on a large number of word lines. However, as the combined sensing is formed of more word lines, the fraction of '1's in the resulting binary page (i.e. the fraction of BLs that will be "open") will reduce. Consequently, there is a limitation on the number of WLs that can be sensed together since, at some point, a negligible number of bit lines (or even no bit lines at all) will conduct, providing insufficient statistics. The maximal number of word lines can be determined as the maximal number for which there is still sufficient statistics—i.e. the 1's counts will not be too low. In practice, it may be desired to set the number of word lines per group such that the expected value of the counters (assuming normal CVD) will be ~50. This should be sufficiently stable statistically;

It is preferred that the counting will be done internally in the memory chip (as opposed to the controller), such that multi-die operation will be more efficient, with only a small amount of data being transferred to the controller (e.g. 4 counts per 4 WLs) and the controller is not a bottleneck. Some memory devices can perform such counting operations of the number of 1's (or 0's) in the binary page, internally.

Figure 41:
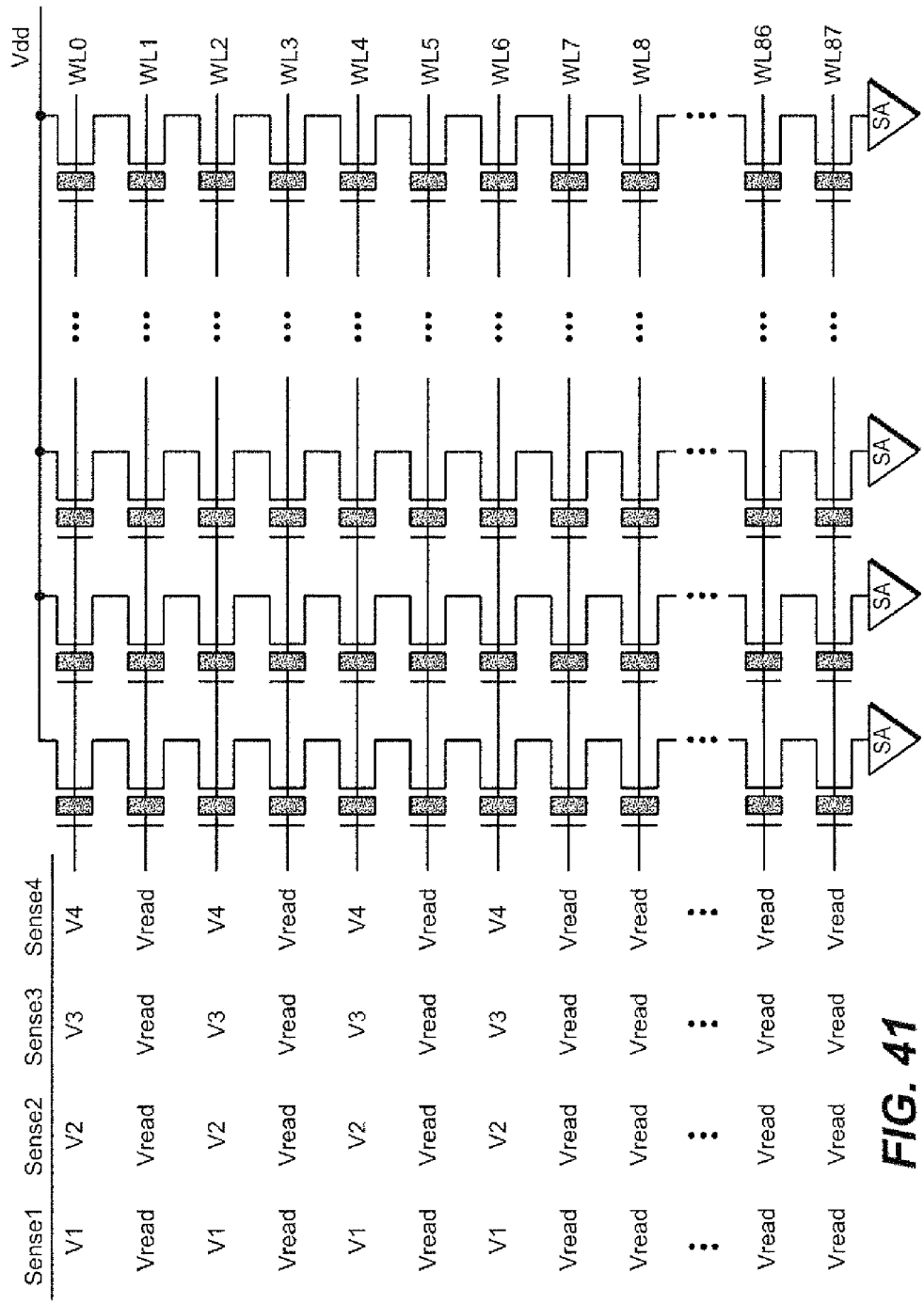
FIG. 41 illustrates another embodiment of a concurrent multiple word line sensing operation.

Another issue that needs to be considered is the determination of the Vcgrv voltages applied to selected word lines (V1, V2, V3, V4). Different voltage combinations can provide different "signature" quality; that is, they can provide a more informative result that would allow easier detection of a suspicious group. In relation to the applied sequence of Vcgrv voltages, it may be easier from design perspective to implement the same bias voltage on selected word lines during the combined multi page sensing, compared to different bias voltages. Thus, it may be easier to implement the scheme shown in FIG. 41 than the scheme shown in FIG. 40. The scheme of FIG. 41 should have a similar ability to detect a suspicious WL group. A possible drawback of the scheme of FIG. 41 is that it provides different expected counts (CNT1, CNT2, CNT3, CNT4) as opposed to the scheme of FIG. 40, in which all 4 counts have the same expected value. The high dynamic range of the counts may be a disadvantage. For example, in some cases, the ability to count internally in the memory may be limited to a certain maximal count. This may mean that the counting may need to be implemented in the controller, as at least for the highest counter value (obtained by sense #4 shown in FIG. 41 where we apply the highest level of V4 to all 4 selected WLs), the amount of bits to count will often be too high to be done internally in a typical memory chip. Counting in the controller is less preferable in a multi-die configuration, as the controller may become a bottleneck.

In any of these cases, once a suspicious group of word lines is found, the individual word lines of the group can be checked more thoroughly. If the word line is then found to be defective, the various sorts of corrective actions described in the preceding sections can then be employed.

The approach of this section is developed further in US patent publication number 2013-0028021.

Application to Erratic Program Detection

As discussed above and in the Background, major word line gross failures (such as word line to word line shorts, control gate to substrate shorts, broken word lines, and so on) have been a major factor in data error rates as memory technology scales down. Identifying these failures is important for delivering low error rate memory. With controllers capable of replacing bad data due to this class of failure, detections is the only requirement for reducing or even eliminating the effects of such failures. Detection of such failures can be done after each programming and more frequently at other times, but a high frequency of detection can degrade system performance. This section considers a detection scheme that can help to reduce this detection time.

In addition to techniques described in the earlier section, various methods for dealing with defective word lines are described in the following US patent publication and application numbers: US-2012-0008405-A1; US-2012-0008384-A1; US-2012-0008410-A1; US-2012-0281.479; 2013-0028021; and Ser. No. 13/411,115. Another approach, developed further in U.S. Pat. No. 7,616,499, is a scheme that performs two reads on a single word line with a small difference of word line read voltages, performs bit-wise operation (XOR) to calculate bits with a threshold voltage Vt that falls into the gap between the read levels, and then compares the total number of such bits against a criterion. If it exceeds the criteria, the word line may have gross failures such as a word line to word line short, a control gate to substrate short, a broken word line or other problem. For example, at the end of each programming, such a process can be performed on the word line just programmed.

The preceding section described the use of a combined multi-word line sensing process. For example, a block can be divided into groups of four word lines, where all the word lines in each group are sensed at the same time, where several different levels can be used. The data can then be read out to the controller, which then can count the number of 1s or 0s. The count for each level forms a vector for the group, where vectors for each group in the block are compared and outlier groups can be identified as having potential defective word line issues.

Figure 42:
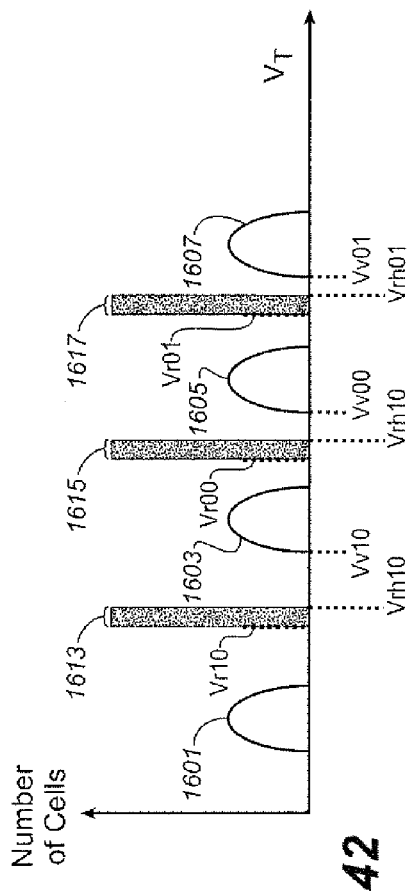
FIG. 42 depicts memory cell threshold distributions in a multi-state memory cell and retention margins between cell distributions.

Erratic programming detection, or EPD, is a scheme that performs two read on a single word line with a small difference of word line read voltages, performs bit-wise operation (XOR) to calculate bits with Vt that falls into the gap, and then compare the total number of such bits against a criterion. The gap is illustrated in FIG. 42, that is adapted from, and discussed further in, U.S. Pat. No. 7,616,499. FIG. 42 shows an example distribution of memory cell thresholds (Vt) for a system storing 2 bits per cell, where the distributions for the "11", "10", "00" and "01" states respectively shown at 1601, 1603, 1605 and 1607. For the states above "11", the cells are written to the state based upon a verify level Vv for each state. For reading each of the states above "11", a corresponding level Vr is used to differentiate between the states. Each of these Vr levels can be margined upward to a high read level Vrh, with the gaps between the two read levels for each of these states above the ground state "11" indicated at 1613, 1615, and 1617.

If the number of cells that fall in the gap is over the limit, this may well be due a gross word line failure. The approach of this section is to read the bits from two or more word lines concurrently, count in-gap bits and compare this to a criterion: if any of the word line has gross failure, the in-gap bit count would be much higher and can be detected. This allows for possible gross failure on multiple word lines to be detected all at once. If there are N word lines in each such EPD test group, then the operation takes 1/N the amount of time that a single word line EPD process would take. This allows higher system performance and more EPD detection be performed, whether during system operation or during test.

Figure 43:
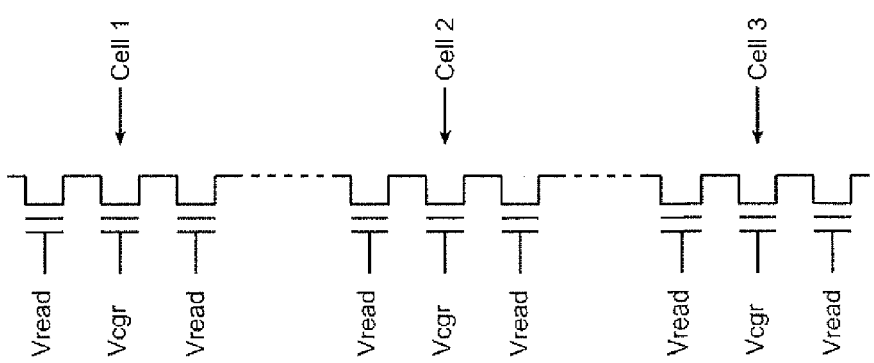
FIG. 43 is a representation of simultaneously biasing multiple word line of a NAND string with a data dependent control gate voltage.

FIG. 43 revisits the simultaneous multiple word line process in the EPD context. In this example, 3 cells (cell 1, 2, 3) along the same word line are detected. Each of the cells being detected has a read voltage Vcgr applied to its control gate, where in this example all of the selected cells receive the same voltage. The non-selected cells along the NAND string each get a data independent pass voltage, Vread. The NAND chain conducts when all of the selected cells have a Vt less than Vcgr.

Figure 44:
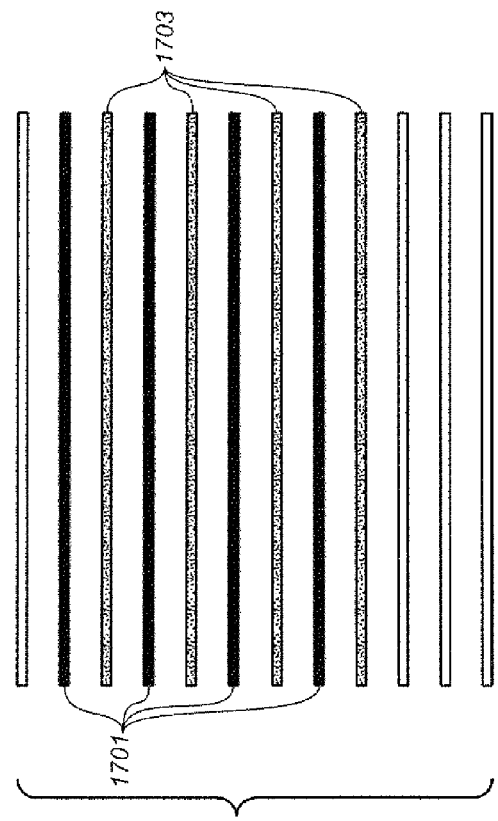
FIG. 44 a schematic illustration of simultaneously selecting multiple word lines of a block.

FIG. 44 schematically illustrates a set of word-lines for a memory array. In this example a set of four even word lines (1701) can be grouped together to perform a combined read and detection, speeding up the process by a factor of four. The memory can them read and detect a group of four odd word lines (1703) interlaced with the first set of even word lines (1701). This process can them move through an entire block in this way. More generally, other grouping, numbers of word lines per group, or both can be done. It is usually preferable, however, for the word lines of each group to not include adjacent word lines, as non-standard read conditions on a neighboring word line (a data dependent Vcgr, rather than Vread) may affect the result, a process that is described further in U.S. patent application Ser. No. 13/957,198. (U.S. patent application Ser. No. 13/957,198 also provides more detail on sensing operations where multiple word lines are given data dependent values, the drivers involved, and the use of registers associated with the bit lines.) Increasing the number of word lines concurrently sensed can help to accelerate the process, but is more complex and memory arrays are often structured with needed driver structures. In any variation, if there is a word line defect such as a word line to word line short or control gate-substrate short circuit, this process can be used to detect this. Typically, this detection process can be performed on a whole block after the block has been programmed, but, more generally, can be done once a sufficient number of programmed word lines are available to form a group. The programming can be part of an actually data write or be done with random data as part of a test.

The result of the detection value can then be compared against a reference value. This limit can be a predetermined value, such as one based on device characterizations. Alternately, the limit can be varied with device operation, where, for example, a default value can be stored in the non-volatile memory on the system, but which can be overwritten during run time. Also, as discussed in US patent publication number US-2012-0008384-A1, the effects of defective word lines are often location dependent, frequently being more apparent in threshold voltage shifts nearer to the ends of word lines. Consequently, in some embodiments the locations of the cells that fall into the gaps can be considered.

For any of these embodiments, the results of the comparison can be used to determine whether any of the sensed group of word lines has a defect. The comparisons can be done for the whole of a block or stopped once a set of word lines is found to be defective. In generally most efficient to map out the whole block when a defect is found. Alternately, if desired, the individual word lines within a set can be checked to determine those that are defective and individually map these out. In an exemplary NAND embodiment, the mapping out of entire block is generally preferred, although for other topologies, such as NOR memory, it may be preferable to consider the individual word lines.

The multiple word line EPD techniques can be applied to both binary and multi-state memories. In the binary case, there is only one gap to check; however, multi-state operation provides multiple gaps, such as the three gaps in two-bit per cell example illustrated in FIG. 42 or the seven such gaps that a 3-bit per cell memory would have. To improve performance, it is usually sufficient to check only some, or even just one, of these inter-state gaps. Different failure modes often exhibit themselves more clearly between certain pairs of states and it is often sufficient to just check these. For example, it may be sufficient to just check between the two highest, or the two lowest, or a combination of both of these. In the multi-state case, the most straight forward implementation is for all of the word lines of a set to use the same Vcgr level for a given multi-word lines sense operation. More generally, however, with proper driver arrangements different gaps can be checked for different word lines; and, if multiple checks are done for the same set, these Vcgr values could then be shuffled around for the different sets of sense operations. Additionally, as the most likely failure mechanisms may change as the device ages, which gap or gaps are check can be varied based upon, for example, the number of program-erase cycles or ECC results, being varied at the array level or with a finer granularity (e.g., the block level).

Figure 45:
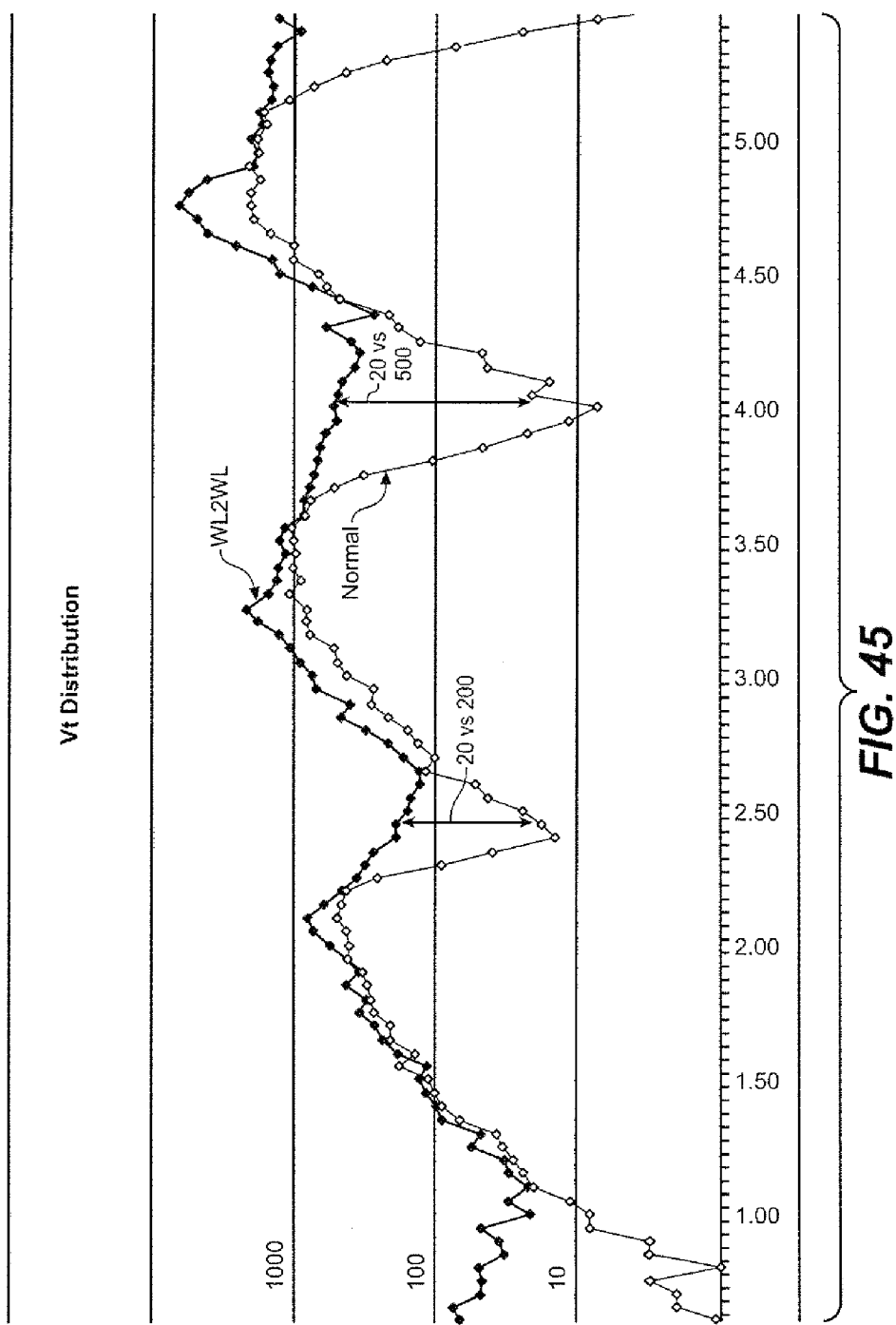
FIG. 45 is a comparison of the distribution threshold voltages between normal word lines and word lines with word line to word line shorts.

To illustrate the process, FIG. 45 shows a comparison between the distribution of threshold voltages for a normal device and the distribution for a device with word line to word line leakage (WL2WL). This figures shows detail for distributions of the 3 top state of an actual device operated with 2-bits per cell and programmed with random data. As illustrated, the between bit counts in threshold gaps is differs by two orders of magnitude or more and would be readily detectable with the techniques of this section.

As discussed in preceding sections, and developed in more detail in, for example, US patent publication number 2009-0296488-A1 or patent application Ser. No. 13/744,219, the sensing circuitry may be structured to sense the associated with the memory array in "tiers". Under this sort of arrangement, the bit lines may be organized into sets, each set sharing sense circuitry and a tier corresponding to the bit lines (such as one from each set) that are processed together when sensing a page of data. This sort of tier structure can be used to optimize performance for multi-word line EPD.

As the total failed bit count for could be quite high in the event of one or more defective word lines, when multi-word line EPD is enabled, the system can do a partial scan. As data from each tier spans the whole array, the memory circuit can check and count failed bit in just some of the tiers, rather than entire pages; for example, it could count only a single tier. In this process, it may be preferable to adjust bit line voltages for higher sensitivity.

Figure 46:
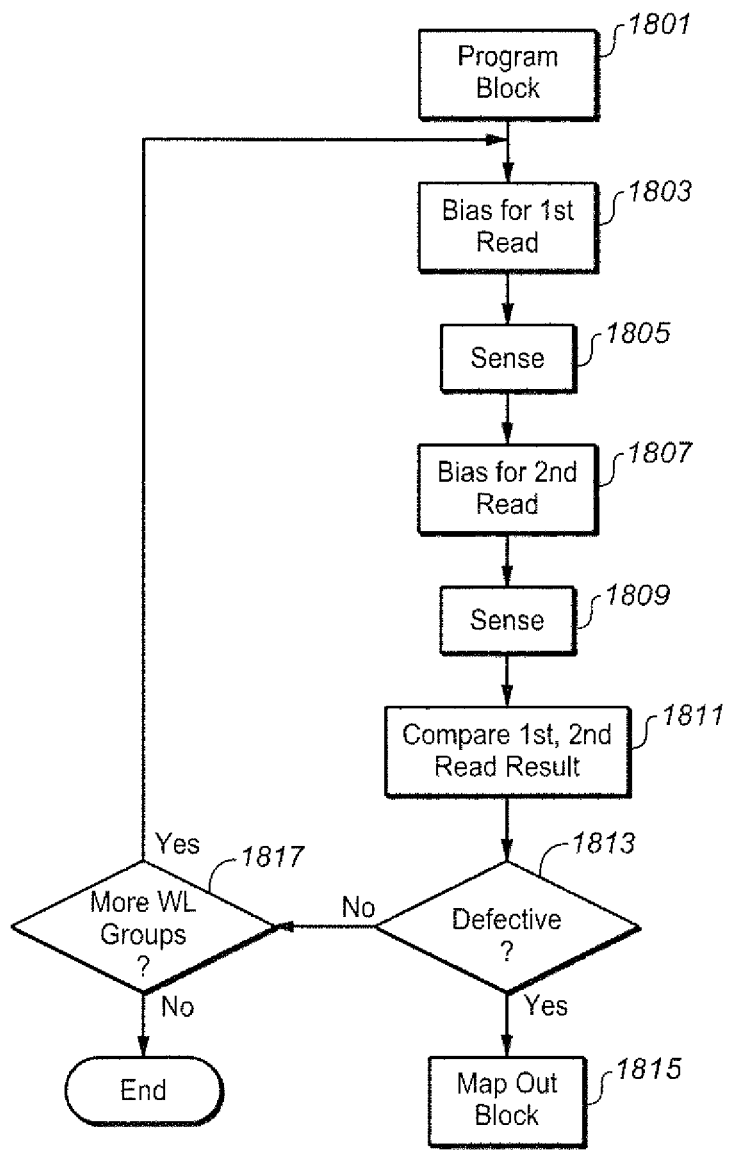
FIG. 46 is a flow for an exemplary embodiment.

FIG. 46 is a flow to generally represent some details of the process. The process begins at 1801 after a block of data has been programmed, where this can either be actual data or random data used for test purposed. When the multi-word line EPD is enabled, the flow then moves on to start this process at 1803. In this exemplary flow, the whole of a single block is programmed before the multi-word line EPD procedure is invoked, but, as described above, the reads can be interleaved with the programming as sufficient numbers of word lines finish writing. Alternately, such as in a test process, multiple blocks may be written before the testing begins.

In multi-word line EPD, a selected set of word lines is then biased (1803) and sensed (1805) at the first read level. As discussed above, this may be done for the whole of the word line or just a portion of the bit lines, such as one tier. The results of this first multi-word line sense can then be stored in a first register associated with each of these bit lines. The process is then repeated at 1807 and 1809 for the shifted sensing levels, where the results can then be stored in a second register associated with each of the bit lines. In FIG. 42 the read levels shown are a standard read level and a level margined high relative to the standard level, but other variations can be used. For example, the standard level and a level margined low could be used; or both levels can be off-set from the standard read, such as one margined high and one margined low. For any of these variations, the order in which the two sensing are done (that is, which is the first sensing and which is the second) is interchangeable.

At 1811 the results of the two sensings are compared. In the exemplary embodiment, the values from the first and second sensings for each bit line are XOR-ed together. The result can then be stored in a third register or by overwriting one of the first or second registers. Based this comparison, a determination is then made at 1813 as to whether the group of word lines has any defects. As discussed above, this can be done by just seeing whether the total number of "1"s exceeds a limit (either fixed or dynamic), although the location of the "1" values can also be considered in some embodiments. If the set of word lines is found defective ("Yes" out of 1813) after any of the comparisons, the block is then mapped out in the exemplary embodiment. Alternately, other defect management procedures can be used, such as mapping out just the defective set of word lines or determining which individual word lines of the set may be defective.

If the set of word lines is not found defective ("No" out of 1813) and there are more sets to check, or, when more than one gaps is being checked for a group in the multi-state case, the process loops back and continues at 1803 with the new group, new gap, or both. More generally, when and how, or even if, the process loops back can vary based on the implementation. For instance, all of the comparisons may be done before any mapping or detection is performed. Also, the comparisons for several groups, or multiple gaps for the same group, of word lines can be done and accumulated prior to any determination. Similarly, if the process is performed as the block is being programmed, the programming at 1801 can also be included in the loop.

For any of the embodiments, the process can be used to detect word line failures (word line to word line shorts, control data-substrate shorts, and so on) with an improved efficiency relative to single word line processes. As the various steps involved, including the comparison (such as by XOR-ing registers) and counting can be done on the memory chip itself, without data transfers and fairly minimal command or status updates to the controller. Consequently, the process leaves the memory-controller bus largely open and the controller free for other operations.

Conclusion

The techniques of the preceding sections can provide a number of advantages, including significantly faster EPWR operation. They can also require less bandwidth of the bus between the controller and the memory. They can further require less bandwidth from the controller hardware. The various embodiments allow for efficient multi-die EPWR operation in the memory system. Further, the techniques presented in the preceding section can in some cases allow detecting NAND failures in progress at their initial stages, before they affect the bit error rate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of determining whether a memory circuit, including an array of a plurality of memory cells formed along word lines and bit lines, has defective word lines, the method comprising:
    performing a program operation to write to one of two or more data states to each of a plurality of memory cells formed along a first plurality of selected word lines and a first set of one or more selected bits lines;
    subsequently performing first and second composite sensing operations, each including:
        concurrently applying to each of the first plurality of selected word lines a corresponding sensing voltage to distinguish between a first pair of the data states, wherein the values of the sensing voltages for the second composite sensing operation are shifted by a margin voltage relative to the corresponding sensing voltages for the first composite sensing operation; and
        concurrently performing, for each of the one or more selected bit lines, a first combined sensing operation of the corresponding plurality of memory cells along the plurality of selected word lines while said sensing voltages are applied thereto, where the result of the first combined sensing operation for each of the selected bit lines is dependent upon the state of the plurality of memory cells therealong on the first plurality of selected word lines;
    performing a comparison of the results of the first composite sensing operation to the result of the second composite sensing operation on a bit line by bit line basis for each of the first set of selected bit lines; and
    based upon the comparison, determining whether the first plurality of bit lines includes any defective word lines.

2. The method of claim 1, wherein the comparison includes performing for each of the first set of selected bit lines an exclusive OR (XOR) operation of the result of the first composite sensing operation with the second composite sensing operation.

3. The method of claim 2, wherein the determining includes determining the number of "1" values resulting from the XOR operation.

4. The method of claim 3, wherein the determining includes determining whether the number of "1" values resulting from the XOR operation exceeds a predetermined limit.

5. The method of claim 2, wherein the determining depends upon the location of "1" values resulting from the XOR operation.

6. The method of claim 1, wherein the first and second composite sensing operations further comprise:
    for each of the first set of selected bit lines storing the result of the first and second composite sensing operations in a respective first and second data latch associated with each of the selected bit lines.

7. The method of claim 6, wherein the comparison includes, for each of the first set of selected bit lines XOR-ing the contents of the first and second associated data latches and storing the result in a third data latch associated with the corresponding selected bit line.

8. The method of claim 7, wherein determining whether the first plurality of bit lines includes any defective word lines includes counting the number of "1" values the in the third associated data latches.

9. The method of claim 1, wherein for both the first and second composite sensing operations the same sensing voltage is applied to each of the first plurality of selected word lines.

10. The method of claim 9, wherein the memory cells are operated as binary memory cells and the sensing voltages applied in the first and second composite sensing operations distinguish between the two data states of the binary memory cells.

11. The method of claim 9, wherein the memory cells are operated as multi-state memory cells and the sensing voltages of the first and second composite sensing operations distinguish between a first and a second of the multi-states.

12. The method of claim 11, wherein the first and second of the multi-states correspond to the two most highly programmed of the multi-states.

13. The method of claim 11, wherein the first and second of the multi-states correspond to the erased state and the multi-state adjacent to the erased state.

14. The method of claim 11, further comprising:
subsequent to performing the first and second composite sensing operations, performing third and fourth composite sensing operations, each including:
concurrently applying to each of the first plurality of selected word lines a corresponding sensing voltage to distinguish between a second pair of the data states, wherein the values of the sensing voltages for the fourth composite sensing operation are shifted by a margin voltage relative to the corresponding sensing voltages for the third composite sensing operation, and wherein at least one of the second pair of the data states is not one of the first pair of data states; and
concurrently performing, for each of the one or more selected bit lines, a combined sensing operation of the corresponding plurality of memory cells along the plurality of selected word lines while said sensing voltages are applied thereto, where the result of the combined sensing operation for each of the selected bit lines is dependent upon the state of the plurality of memory cells therealong on the first plurality of selected word lines; and
performing a comparison of the results of the third composite sensing operation to the result of the fourth composite sensing operation on a bit line by bit line basis for each of the first set of selected bit lines, wherein the determining whether the first plurality of bit lines includes any defective word lines is further based upon the comparison of the results of the third composite sensing operation to the result of the fourth composite sensing operation.

15. The method of claim 1, wherein the comparison is performed on the memory circuit.

16. The method of claim 1, wherein the first plurality of word lines are non-adjacent.

17. The method of claim 1, wherein the array is formed according to a NAND-type architecture and the sensed memory cells along each of the selected bit lines are from a common NAND string, and wherein the composite sensing operation further includes applying a voltage to the non-selected word-lines of the common NAND strings whereby the memory cells there along do not contribute to the result of the combined sensing operation.

18. The method of claim 1, wherein the memory array is a flash memory array formed of a plurality of erase blocks and the first plurality of selected word lines belong to a first of the erase blocks, the method further comprising:
in response to determining that the first plurality of word lines includes a defective word line, mapping out the first erase block as defective.

19. The method of claim 1, further comprising:
in response to determining that the first plurality of bit lines includes a defective word line, determines those of the first plurality of word lines that are defective.

* * * * *